(12) United States Patent
Yamazaki et al.

(10) Patent No.: US 8,227,863 B2
(45) Date of Patent: Jul. 24, 2012

(54) NONVOLATILE SEMICONDUCTOR MEMORY DEVICE

(75) Inventors: Shunpei Yamazaki, Setagaya (JP); Yoshinobu Asami, Atsugi (JP); Tamae Takano, Atsugi (JP); Makoto Furuno, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 252 days.

(21) Appl. No.: 11/723,481

(22) Filed: Mar. 20, 2007

(65) Prior Publication Data

US 2007/0221971 A1    Sep. 27, 2007

(30) Foreign Application Priority Data

Mar. 21, 2006  (JP) ................... 2006-077893

(51) Int. Cl.
*H01L 29/76* (2006.01)
(52) U.S. Cl. ............. 257/347; 257/314; 257/315
(58) Field of Classification Search ............ 257/347, 257/314, 315
See application file for complete search history.

(56) References Cited

U.S. PATENT DOCUMENTS

| | | | |
|---|---|---|---|
| 3,878,549 A | 4/1975 | Yamazaki et al. | |
| 4,809,056 A * | 2/1989 | Shirato et al. | 257/347 |
| 5,448,513 A | 9/1995 | Hu et al. | |
| 5,808,336 A | 9/1998 | Miyawaki | |
| 6,324,101 B1 * | 11/2001 | Miyawaki | 365/185.28 |
| 6,417,538 B1 | 7/2002 | Choi | |
| 6,498,369 B1 | 12/2002 | Yamazaki et al. | |
| 6,518,594 B1 | 2/2003 | Nakajima et al. | |
| 6,551,948 B2 | 4/2003 | Ohmi et al. | |
| 6,597,034 B2 * | 7/2003 | Yamazaki et al. | 257/314 |
| 6,613,630 B2 | 9/2003 | Lee | |
| 6,686,623 B2 * | 2/2004 | Yamazaki | 257/315 |
| 6,699,754 B2 | 3/2004 | Huang | |
| 6,713,834 B2 | 3/2004 | Mori et al. | |
| 6,812,086 B2 | 11/2004 | Murthy et al. | |
| 6,828,623 B1 * | 12/2004 | Guo et al. | 257/321 |
| 6,861,689 B2 * | 3/2005 | Burnett | 257/296 |
| 7,098,504 B2 * | 8/2006 | Kawashima et al. | 257/315 |
| 7,245,010 B2 | 7/2007 | Powell et al. | |
| 7,482,651 B2 | 1/2009 | Bhattacharyya | |

(Continued)

FOREIGN PATENT DOCUMENTS

CN    1744330 A    3/2006

(Continued)

OTHER PUBLICATIONS

European Search Report (Application No. 07005513.2) dated Jul. 10, 2007.

(Continued)

*Primary Examiner* — Eugene Lee
(74) *Attorney, Agent, or Firm* — Eric J. Robinson; Robinson Intellectual Property Law Office, P.C.

(57) ABSTRACT

A semiconductor layer having a channel formation region provided between a pair of impurity regions spaced from each other is provided, and a first insulating layer a floating gate, a second insulating layer, and a control gate are provided above the semiconductor layer. The semiconductor material forming the floating gate preferably has a band gap smaller than that of the semiconductor layer. The band gap of a channel formation region in the semiconductor material forming the floating gate is preferably smaller than that of the semiconductor layer by 0.1 eV or more.

43 Claims, 46 Drawing Sheets

U.S. PATENT DOCUMENTS

| | | |
|---|---|---|
| 7,554,854 B2 | 6/2009 | Osame et al. |
| 2002/0079533 A1 | 6/2002 | Horiguchi et al. |
| 2002/0093073 A1* | 7/2002 | Mori et al. ............... 257/510 |
| 2002/0153569 A1* | 10/2002 | Katayama ............... 257/351 |
| 2002/0175376 A1 | 11/2002 | Ohtani et al. |
| 2002/0179964 A1* | 12/2002 | Kato et al. ............... 257/316 |
| 2003/0049900 A1 | 3/2003 | Forbes et al. |
| 2003/0107077 A1* | 6/2003 | Yamazaki et al. ......... 257/314 |
| 2004/0043638 A1 | 3/2004 | Nansei et al. |
| 2004/0104426 A1 | 6/2004 | Forbes et al. |
| 2004/0119110 A1 | 6/2004 | Park |
| 2005/0023577 A1 | 2/2005 | Ito |
| 2005/0095786 A1* | 5/2005 | Chang et al. ............... 438/260 |
| 2005/0112820 A1 | 5/2005 | Chen et al. |
| 2005/0230743 A1 | 10/2005 | Nakagawa et al. |
| 2006/0003531 A1 | 1/2006 | Chang et al. |
| 2006/0043463 A1* | 3/2006 | Liu et al. ............... 257/316 |
| 2006/0118858 A1 | 6/2006 | Jeon et al. |
| 2006/0186458 A1* | 8/2006 | Forbes et al. ............ 257/315 |
| 2006/0246738 A1 | 11/2006 | Isobe et al. |
| 2007/0132004 A1 | 6/2007 | Yasuda et al. |
| 2007/0200167 A1 | 8/2007 | Yamazaki |
| 2007/0221985 A1 | 9/2007 | Yamazaki et al. |
| 2007/0228448 A1 | 10/2007 | Yamazaki et al. |
| 2007/0228449 A1 | 10/2007 | Takano et al. |
| 2007/0228452 A1 | 10/2007 | Asami |
| 2007/0228453 A1 | 10/2007 | Yamazaki et al. |
| 2007/0230254 A1 | 10/2007 | Osame et al. |
| 2007/0235793 A1 | 10/2007 | Yamazaki et al. |
| 2007/0235794 A1 | 10/2007 | Yamazaki et al. |
| 2009/0257283 A1 | 10/2009 | Osame et al. |

FOREIGN PATENT DOCUMENTS

| | | |
|---|---|---|
| EP | 0682370 | 9/2000 |
| JP | 51-007036 | 3/1976 |
| JP | 52-023532 | 6/1977 |
| JP | 55-015869 | 4/1980 |
| JP | 3-119765 | 5/1991 |
| JP | 06-097454 | 4/1994 |
| JP | 06-244432 | 9/1994 |
| JP | 08-097307 | 4/1996 |
| JP | 10-135357 | 5/1998 |
| JP | 11-040682 | 2/1999 |
| JP | 2000-058685 | 2/2000 |
| JP | 2004-221448 | 8/2004 |
| JP | 2005-347328 | 12/2005 |
| JP | 2006-114905 A | 4/2006 |

OTHER PUBLICATIONS

European Search Report (Application No. 07005506.6) Dated Jul. 2, 2008.

Search Report (Application No. 07005506.6) dated Sep. 11, 2008.

\* cited by examiner

Writing "0"

Writing "1"

Erasing

Reading

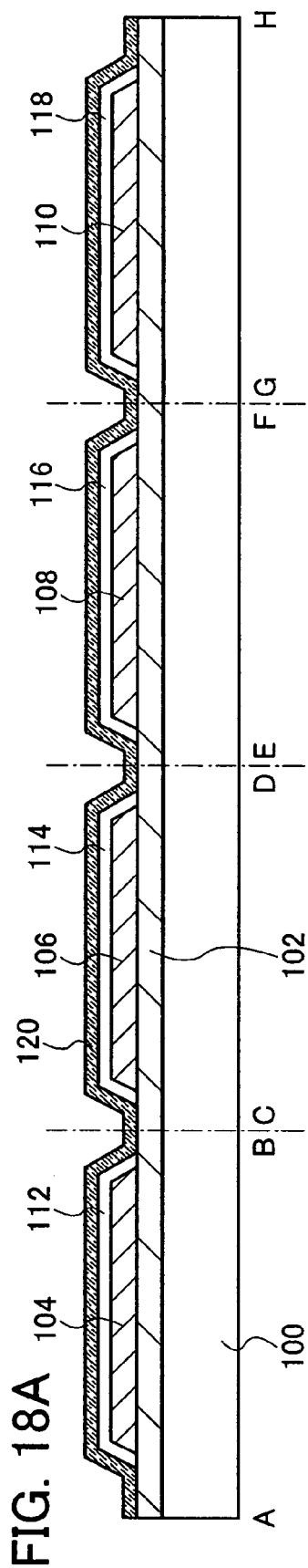
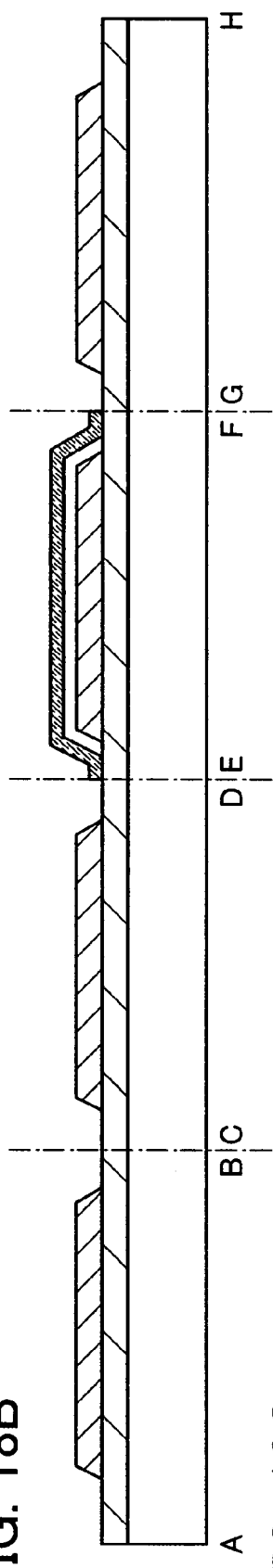
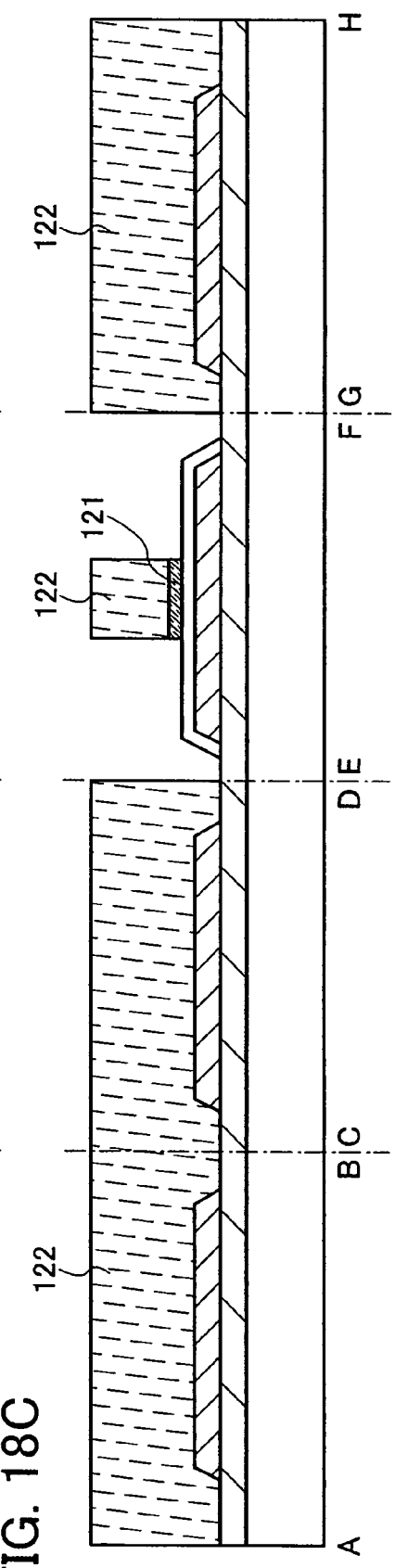
FIG. 18A
FIG. 18B
FIG. 18C

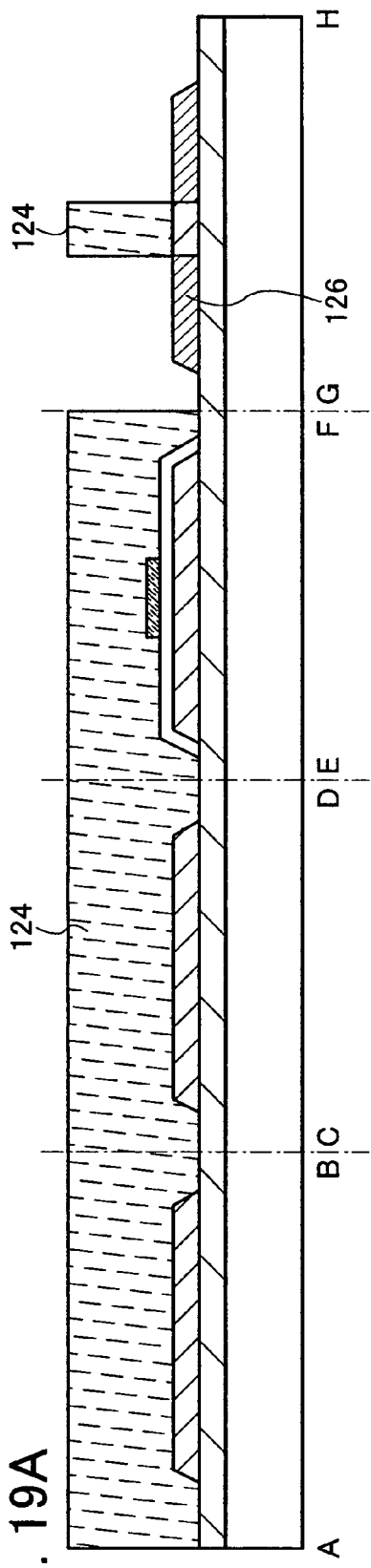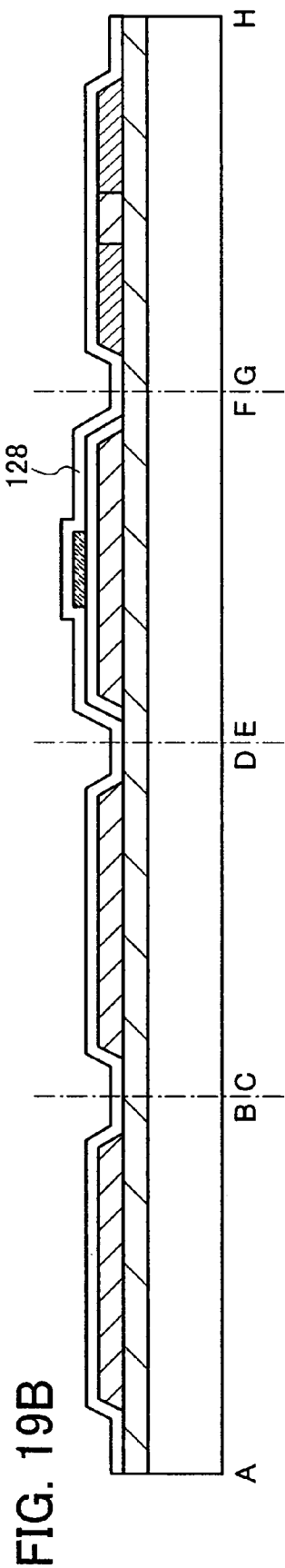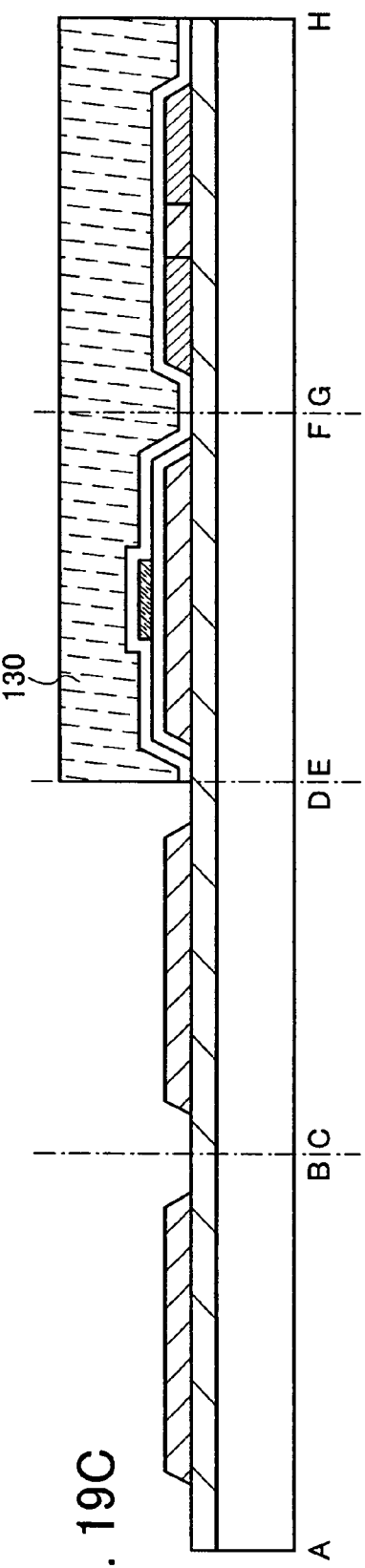

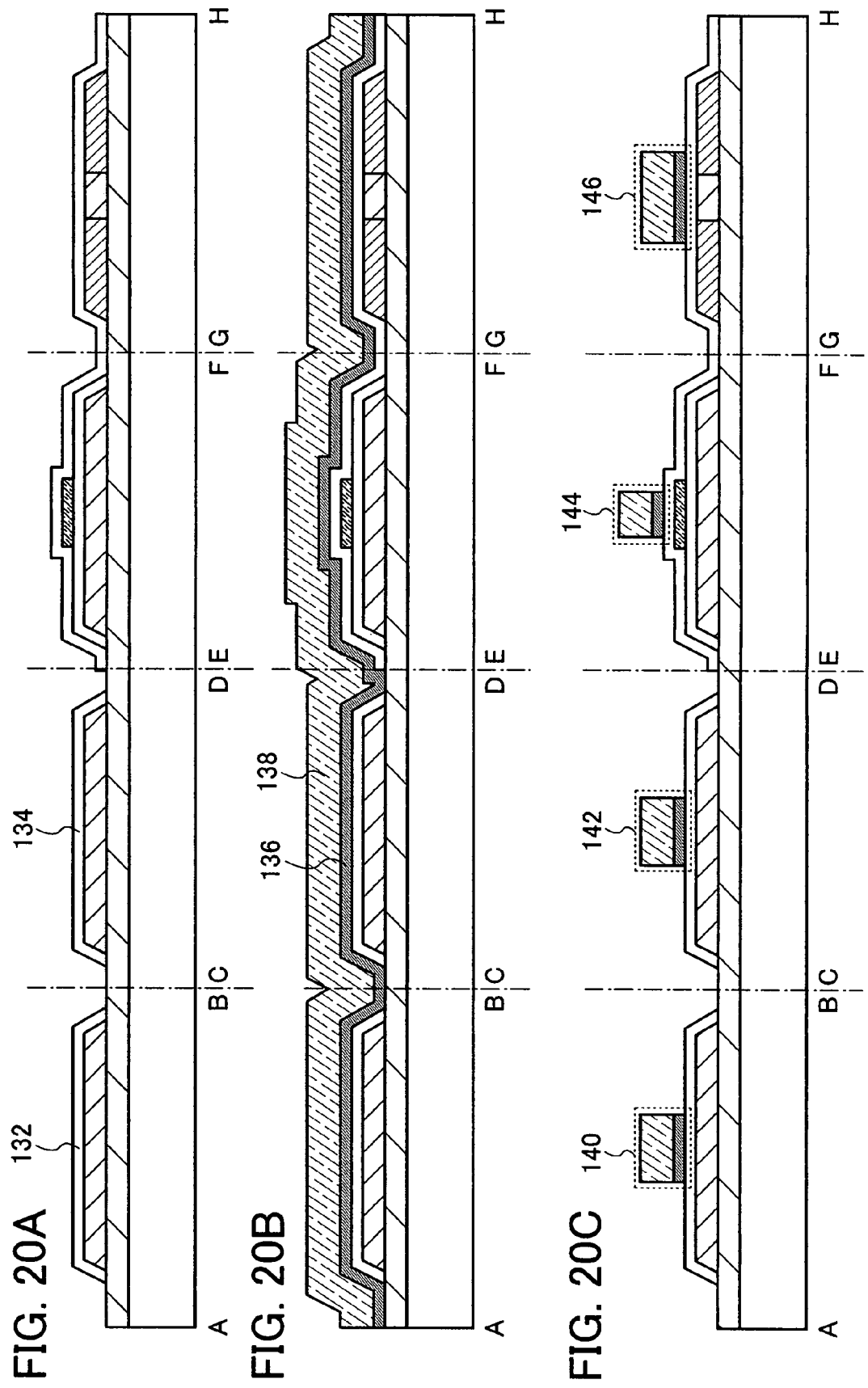

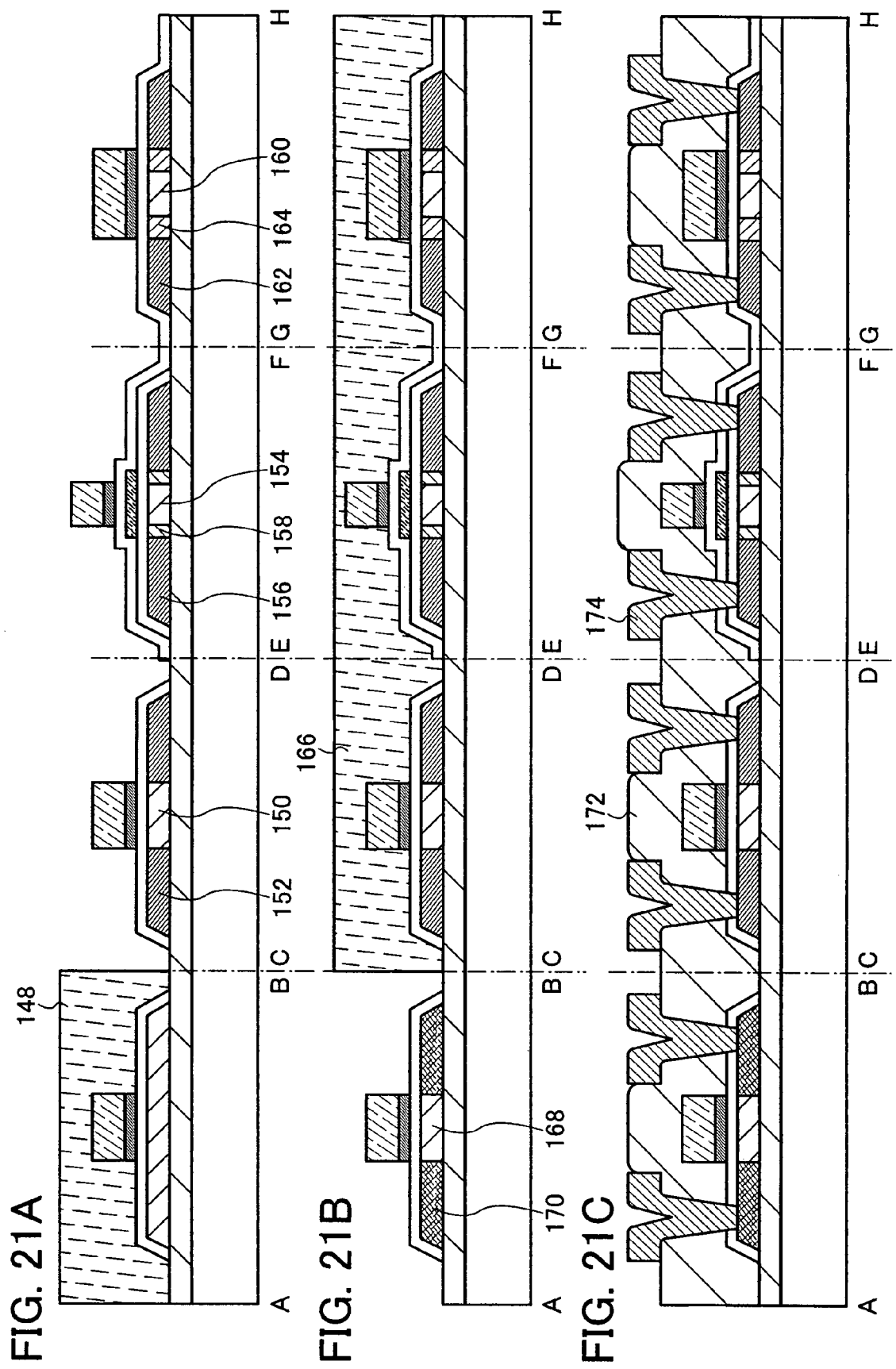

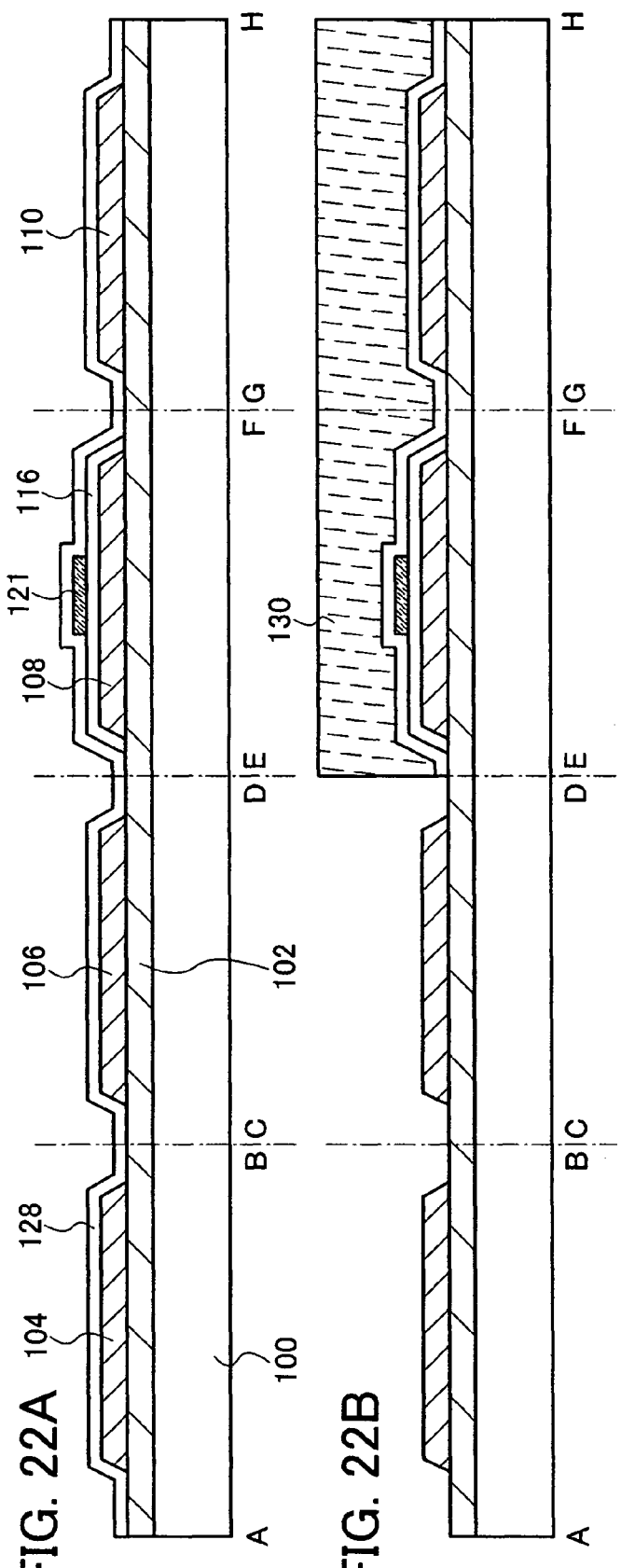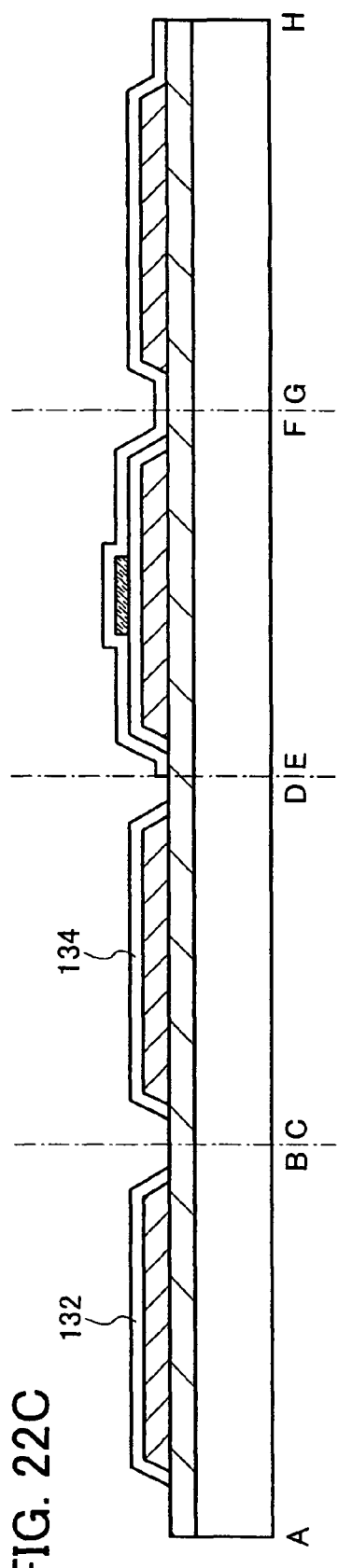

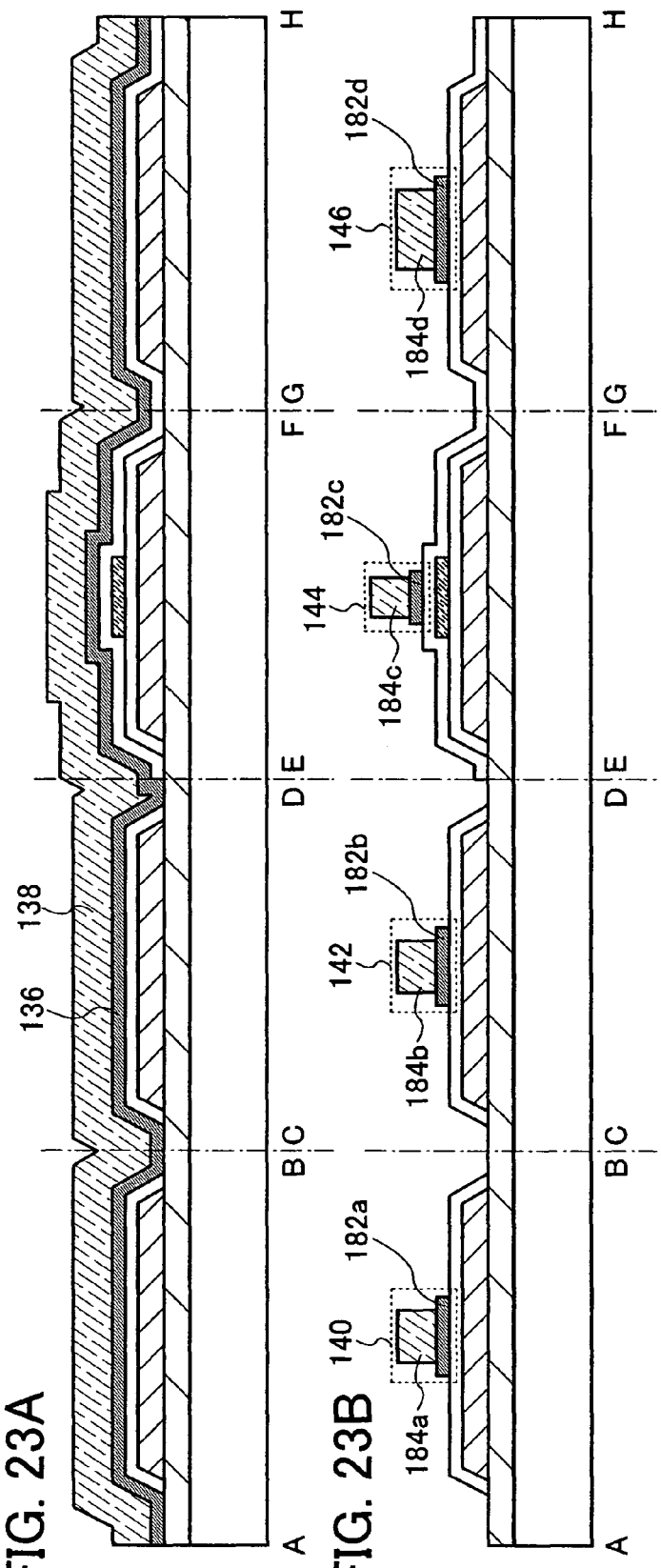

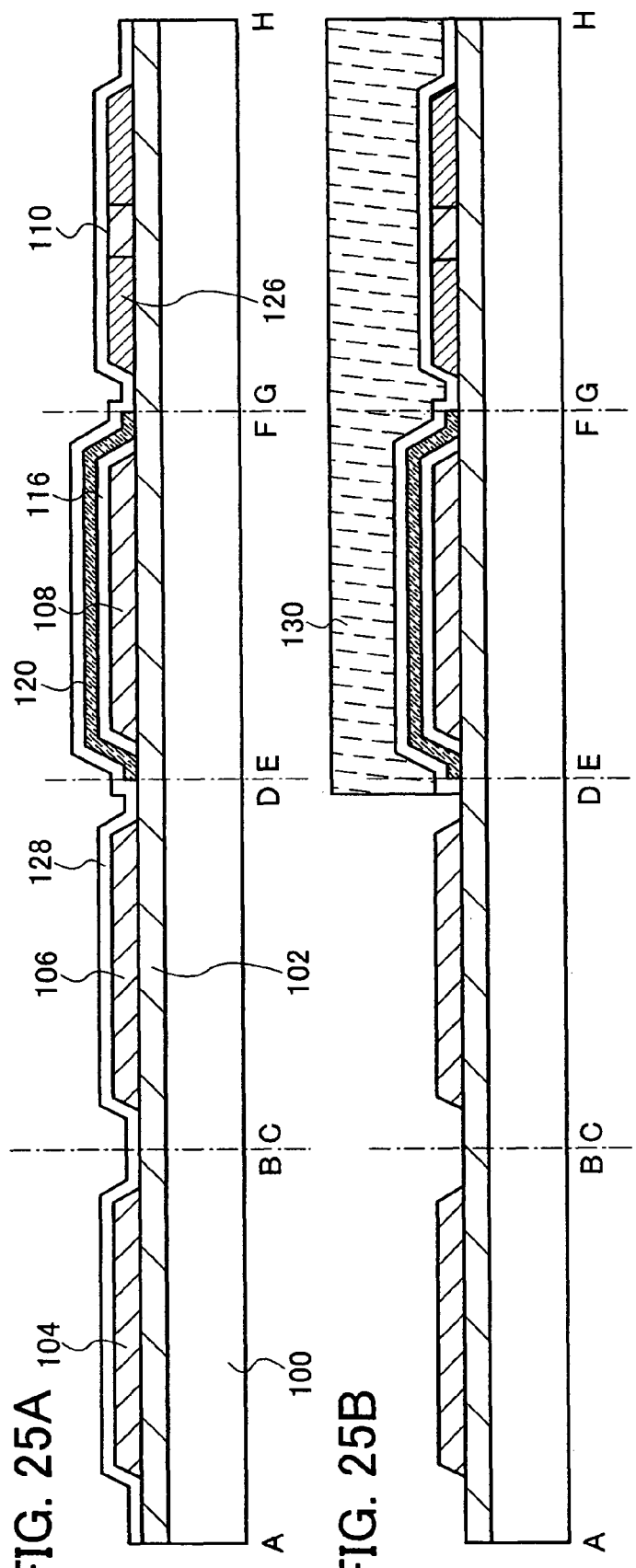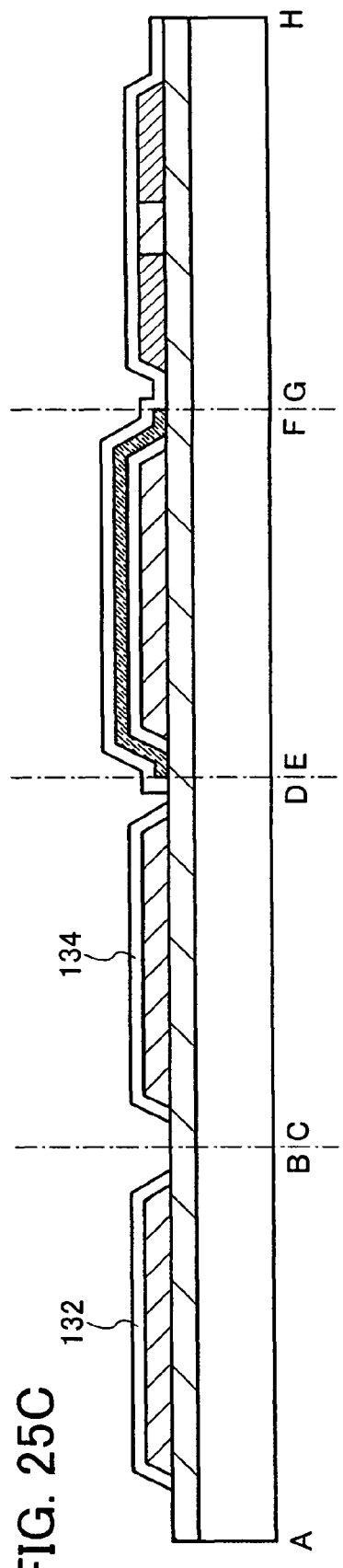

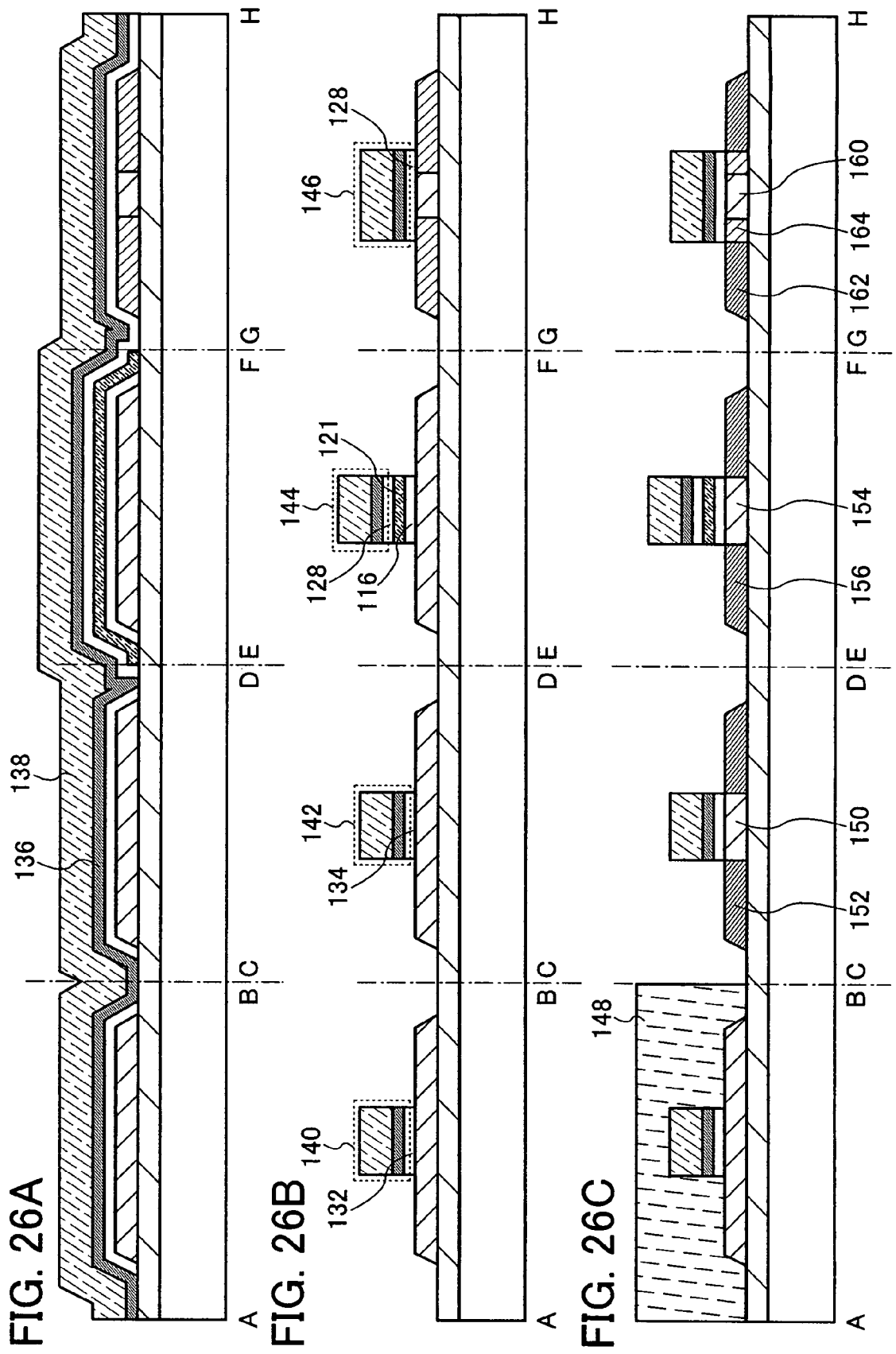

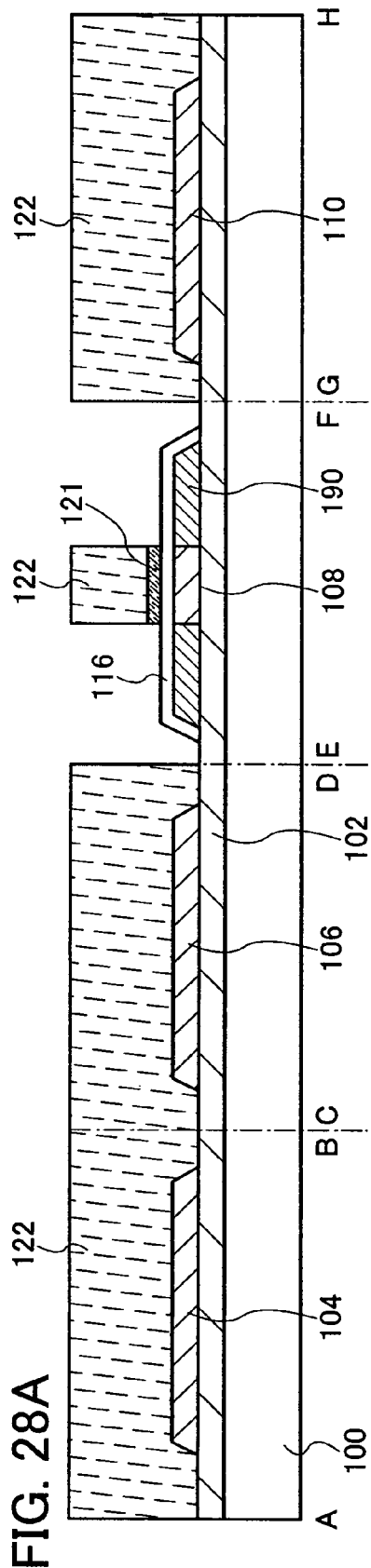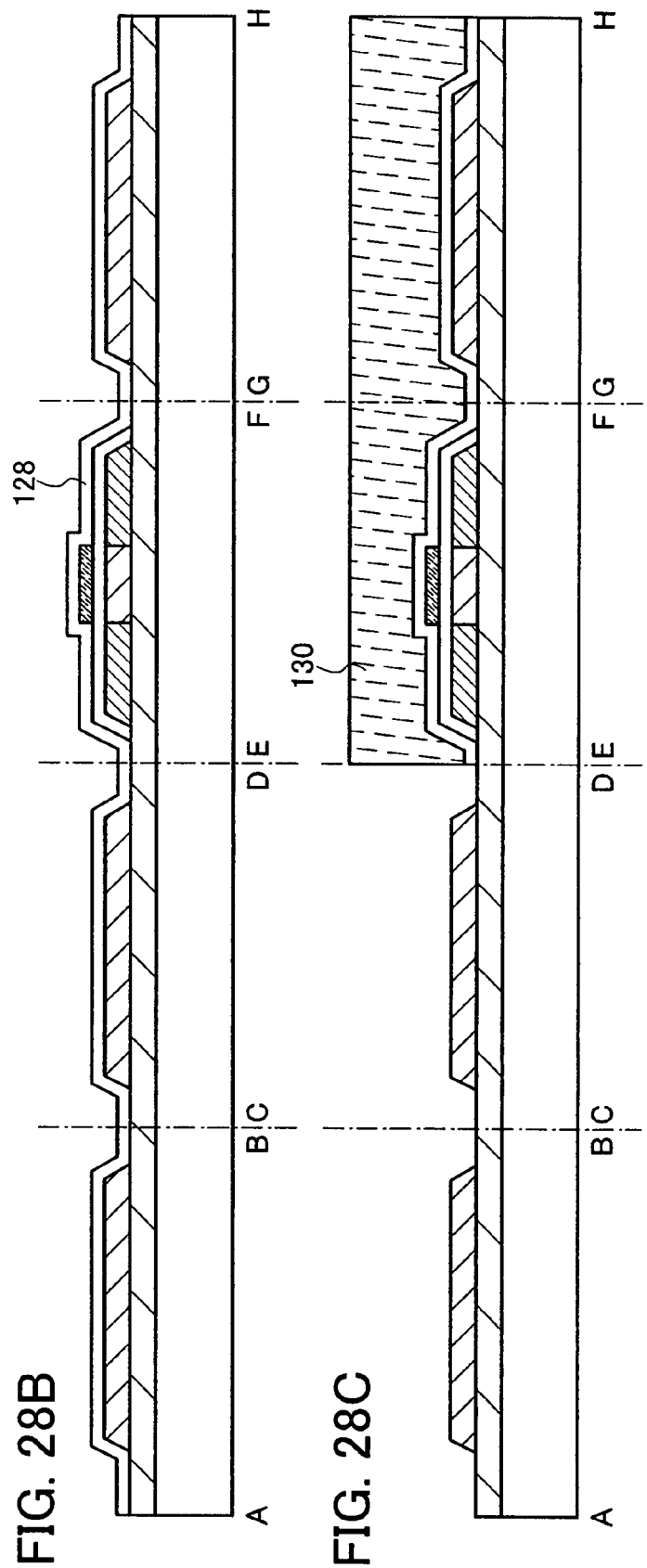

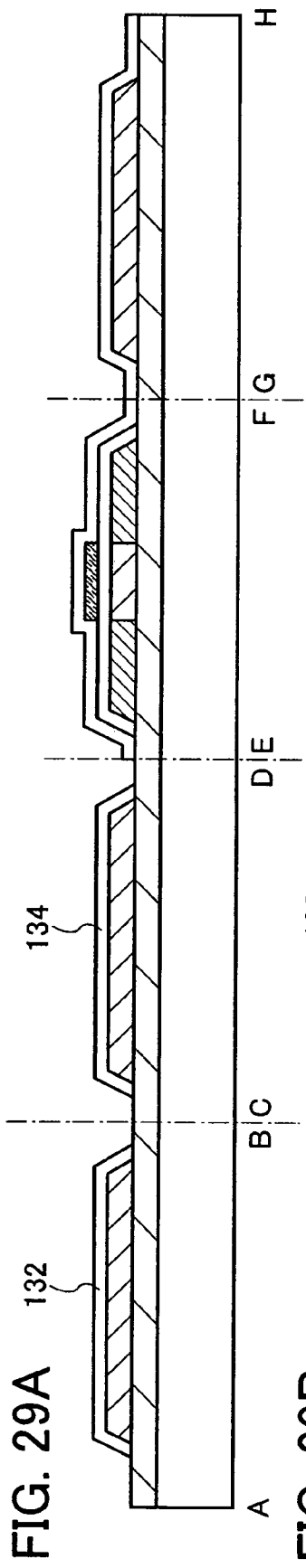
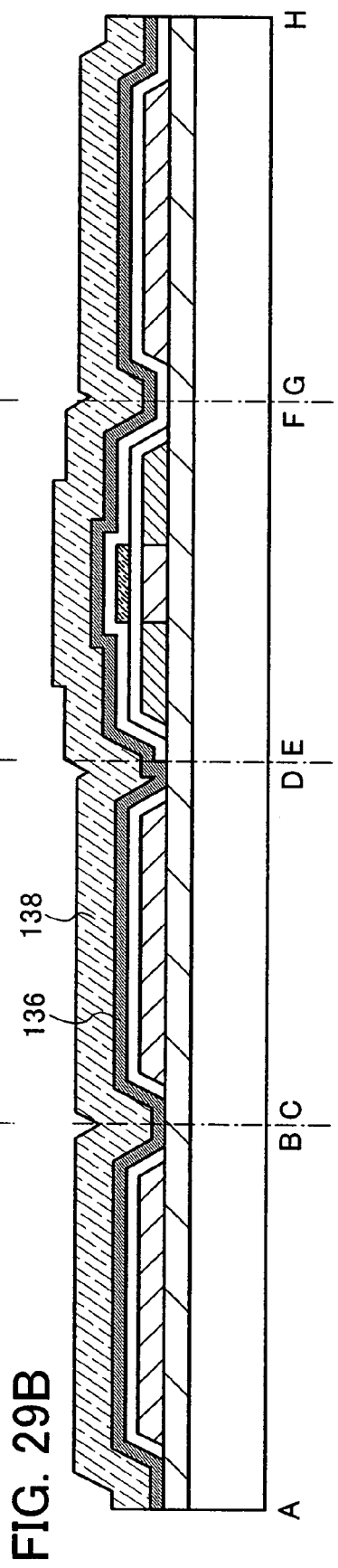
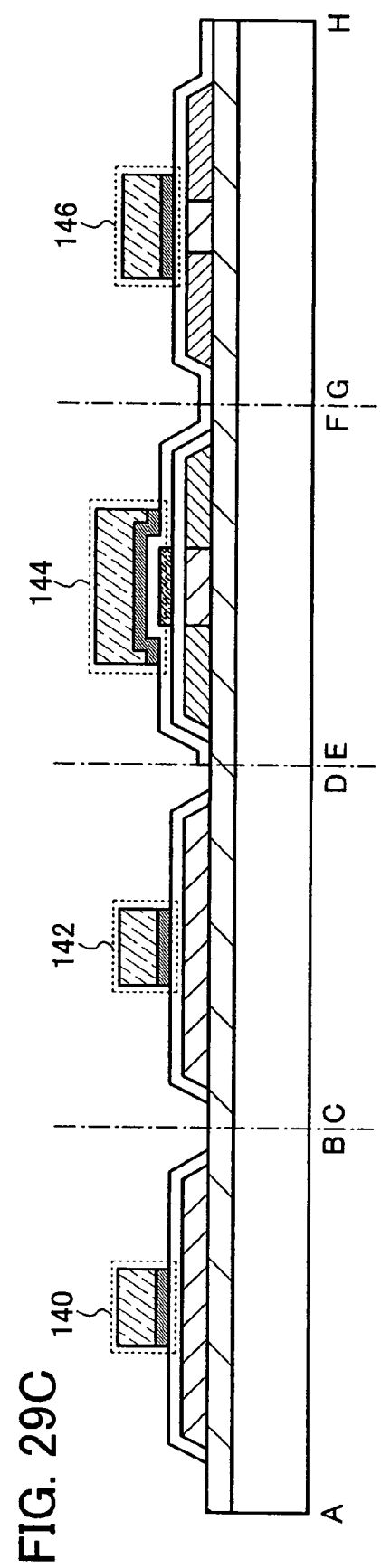
FIG. 29A
FIG. 29B
FIG. 29C

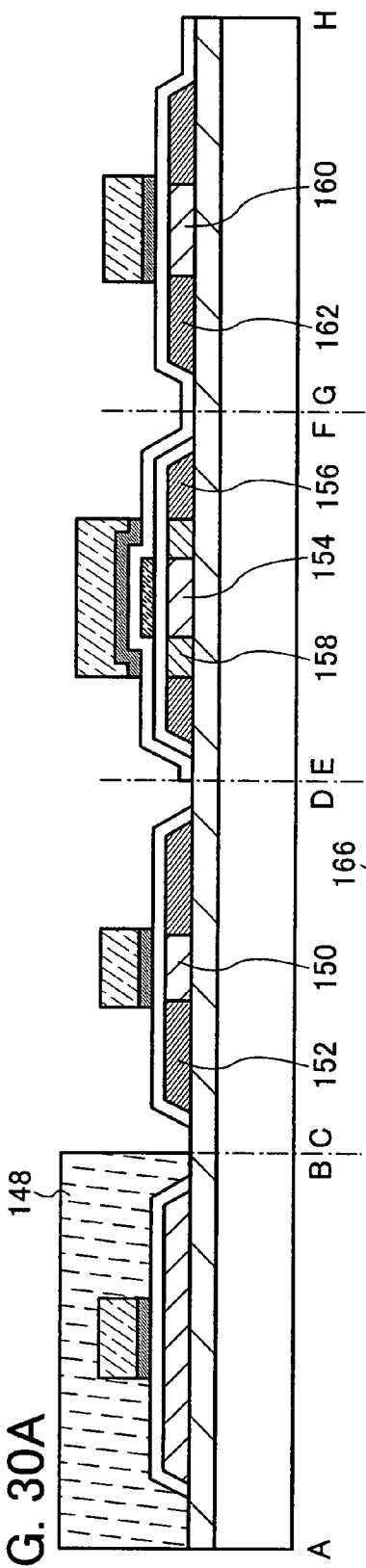
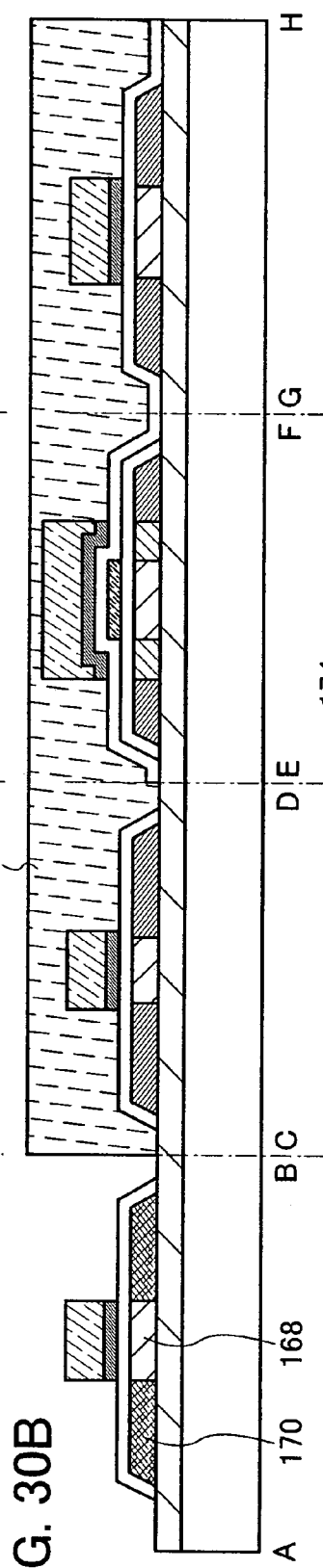
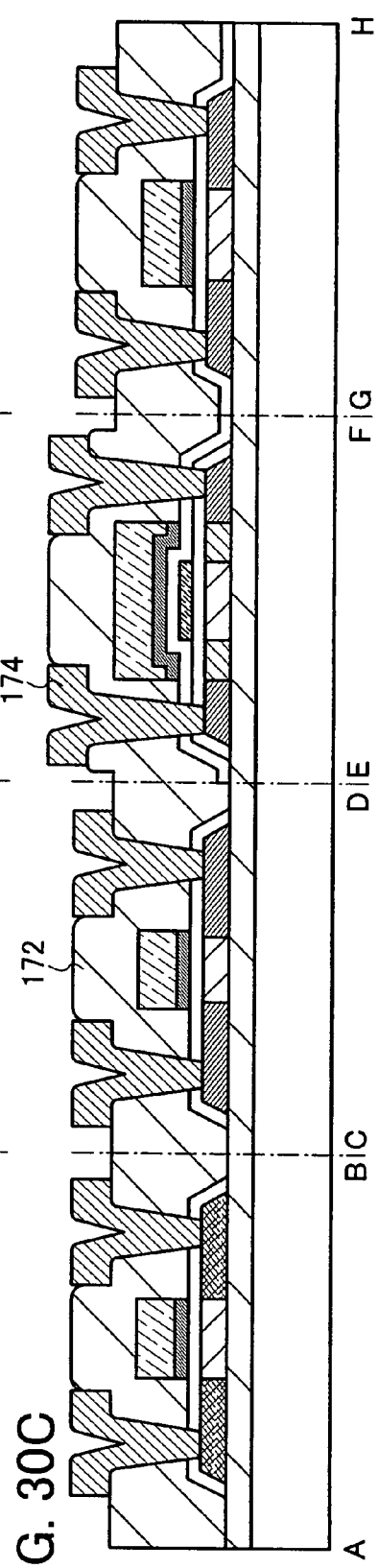

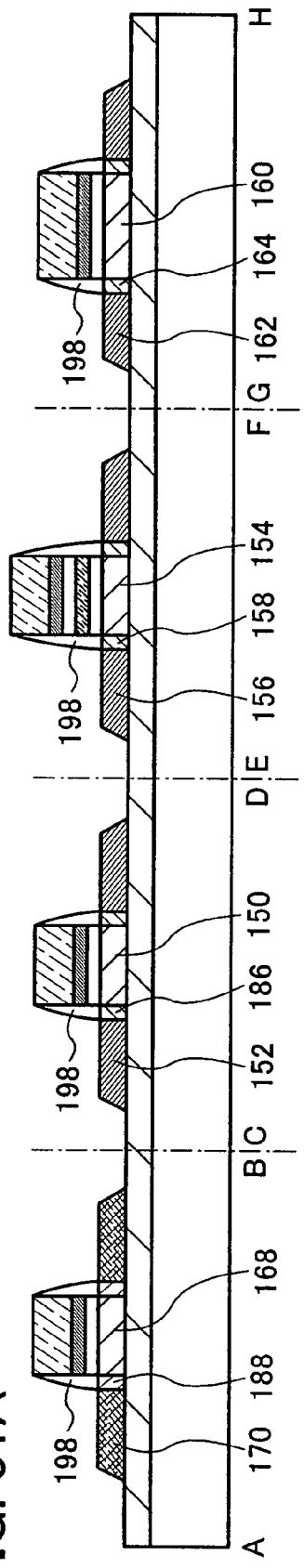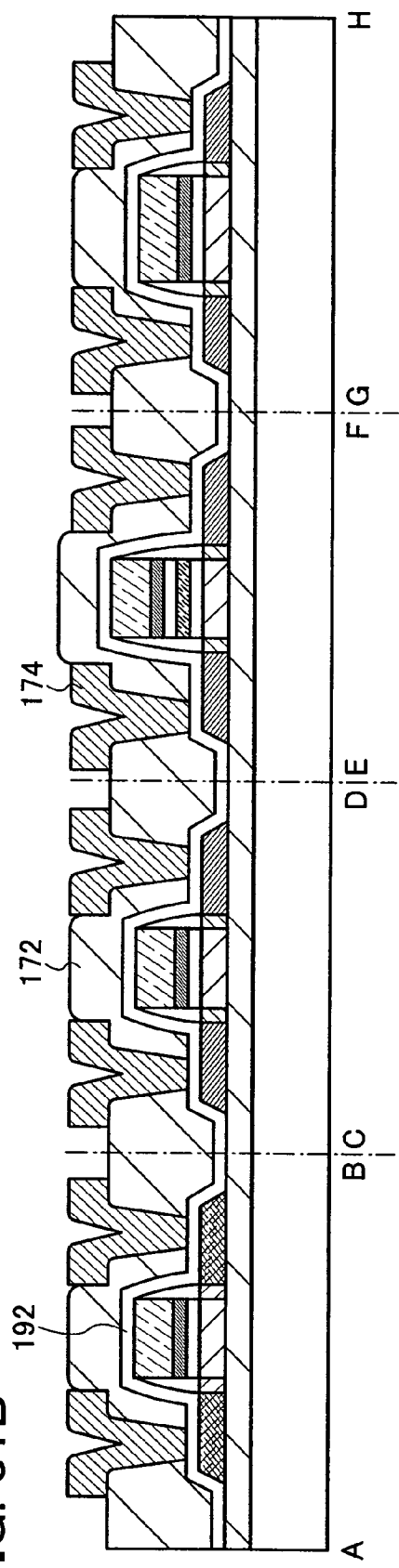
FIG. 31A
FIG. 31B

FIG. 34
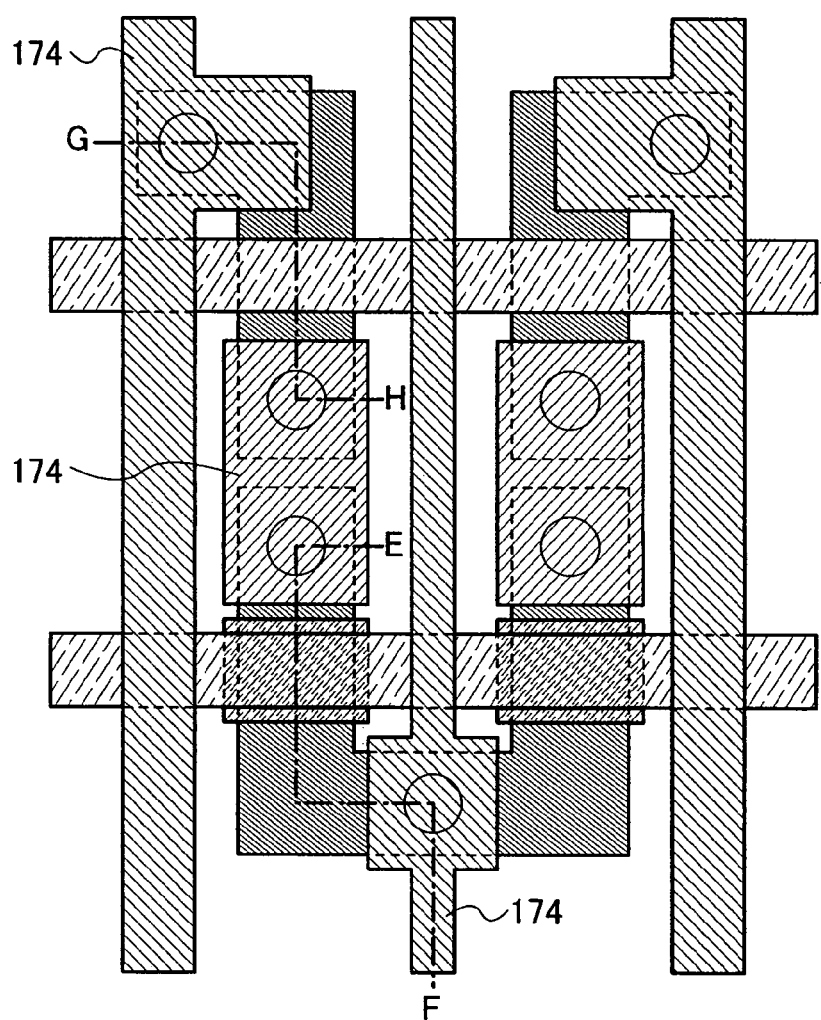
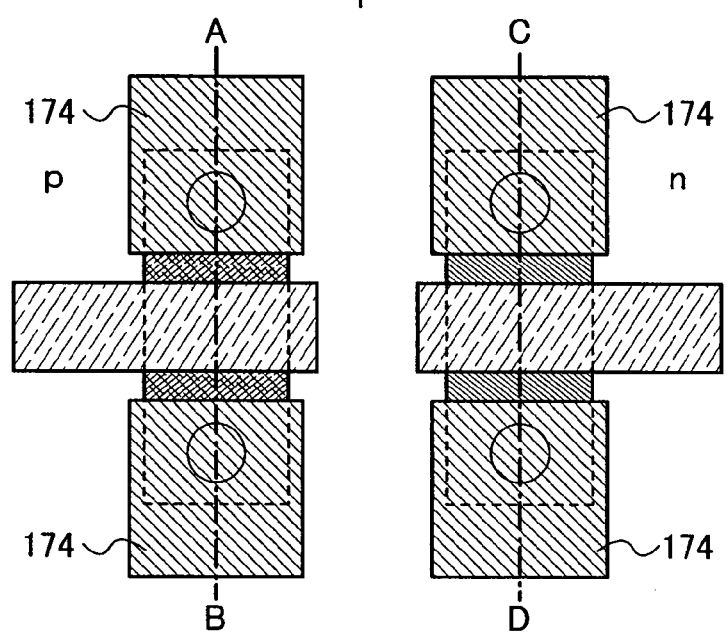

FIG. 45
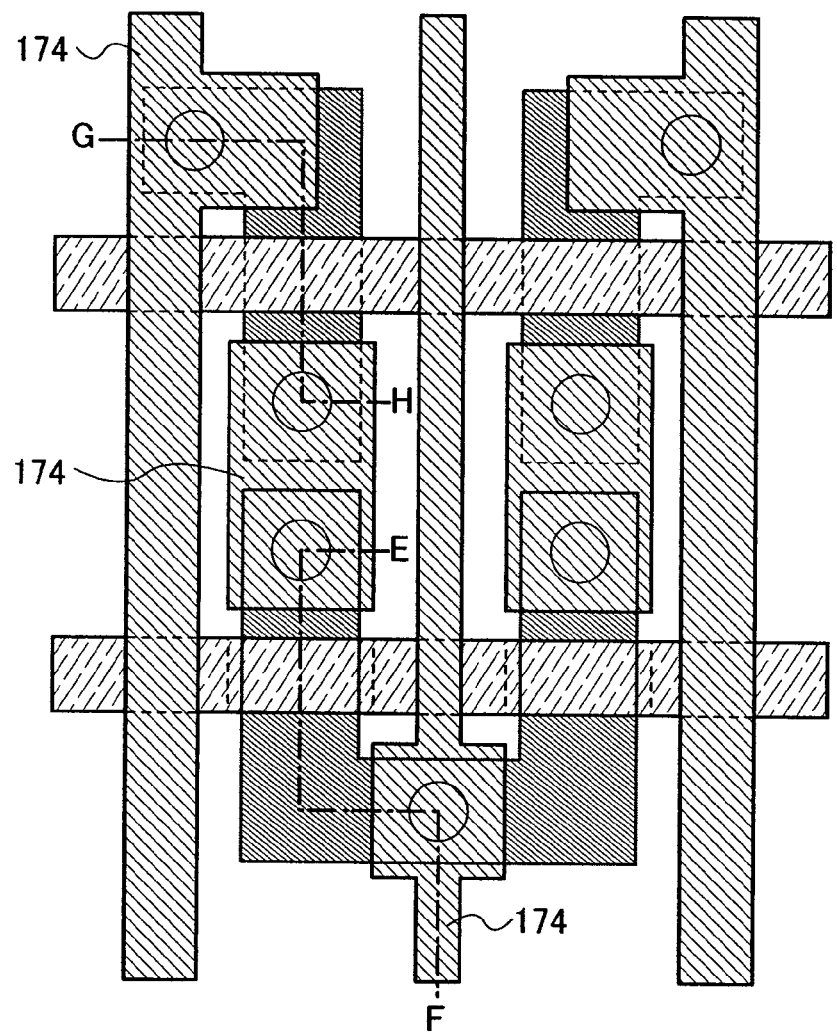
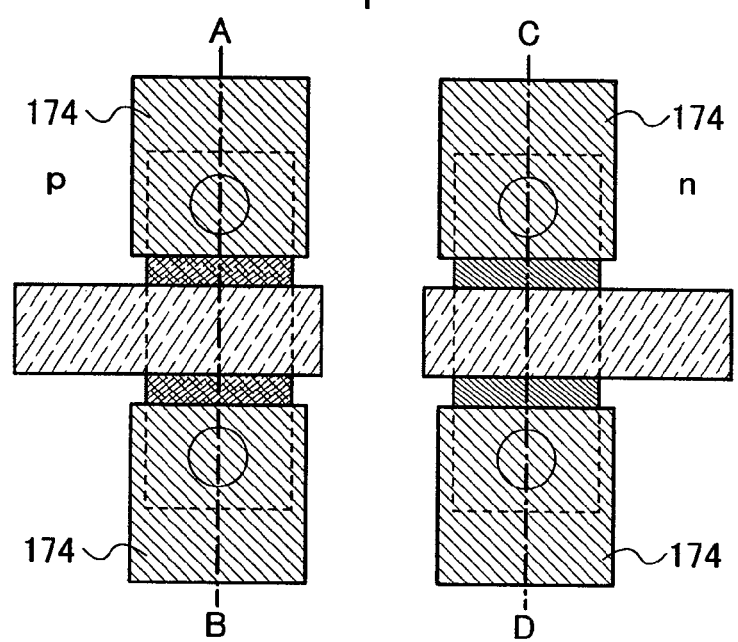

NONVOLATILE SEMICONDUCTOR MEMORY DEVICE

BACKGROUND OF THE INVENTION

1. Field of the Invention

The present invention relates to a nonvolatile semiconductor storage device that is electrically writable, readable, and erasable, and its manufacturing method. In particular, the present invention relates to a structure of a floating gate in the nonvolatile semiconductor storage device.

2. Description of the Related Art

The market in nonvolatile memories in which data can be electrically rewritten and data can be stored even after the power is turned off is expanding. Features of a nonvolatile memory lie in that its structure is similar to that of a MOSFET (Metal Oxide Semiconductor Field Effect Transistor) and a region capable of accumulating charges for a long period of time is provided over a channel formation region. The charge storage region is formed over an insulating layer and is electrically isolated from the surroundings; therefore, it is also referred to as a floating gate. A floating gate is surrounded by an insulator and thus electrically isolated from the surroundings; therefore, the floating gate has a characteristic that it retains charges injected thereinto. A gate electrode called a control gate is provided over the floating gate with an insulating layer therebetween. The control gate is distinguished from the floating gate because a predetermined voltage is applied to the control gate in writing or reading of data.

A floating gate type nonvolatile memory having such a structure has a mechanism of storing data by electrically controlling injection of charges into the floating gate and release of charges from the floating gate. Specifically, the injection of charges into the floating gate and the release of charges from the floating gate are carried out by applying high voltage between the control gate and a semiconductor layer in which a channel formation region is formed. Here, Fowler-Nordheim (F-N) tunneling current (in the case of NAND type) or thermoelectrons (in the case of NOR type) is/are said to flow in the insulating layer over the channel formation region. Thus, the insulating layer is also called a tunnel insulating layer.

A floating gate type nonvolatile memory is required to have properties of retaining the charges stored in a floating gate for 10 years or more to insure reliability. Accordingly, a tunnel insulating layer is required to be formed with a thickness such that tunneling current can flow and to have high insulation property thereby preventing leakage of the charges.

Further, the floating gate formed over the tunnel insulating layer is formed of silicon which is the same semiconductor material as the semiconductor layer in which the channel formation region is formed. Specifically, a method of forming a floating gate from polycrystalline silicon is widely used. For example, a polysilicon film deposited to a thickness of 400 nm is known (Reference 1: Japanese Published Patent Application No. 2000-58685 (p. 7, FIG. 7)).

SUMMARY OF THE INVENTION

Since the floating gate and the channel formation region of the nonvolatile memory is formed of the same silicon material, the energy level of the bottom of the conduction band in view of the band model is the same. When the floating gate is formed of polycrystalline silicon with a thinner thickness, it rather has higher energy level at the bottom of the conduction band than a layer forming the channel formation region. When such a state occurs, electrons come to be hardly injected into the floating gate from the semiconductor layer forming the channel formation region; therefore, high write voltage is required. Accordingly, in order to reduce write voltage of the nonvolatile memory of which floating gate is formed of polycrystalline silicon to any extent, an n-type impurity such as phosphorus or arsenic is added to the floating gate to shift the Fermi level toward the conduction band.

A gate insulating layer provided between the floating gate and the semiconductor layer is required to be thin in thickness so that charges can be injected into the floating gate at a low voltage. On the other hand, in order to stably retain the charges of the floating gate for a long period of time, the film thickness is required to be thick thereby preventing leakage of the charges.

Eventually, a conventional nonvolatile memory requires high write voltage. Besides, error detection and error correction are carried out by providing a redundant memory cell or devising a controller to counter degradation of charge retention characteristics by repetitive rewriting, thereby insuring reliability.

In view of the above, it is an object of the present invention to provide a nonvolatile semiconductor memory device excellent in writing characteristics and charge retention characteristics.

The present invention is a nonvolatile semiconductor memory device having a semiconductor layer provided with a channel formation region provided between a pair of impurity regions spaced from each other; a first insulating layer, a floating gate, a second insulating layer, and a control gate that are positioned above the semiconductor layer to overlap with the channel formation region. In the present invention, the floating gate is formed form a semiconductor material. The semiconductor material can be selected from a plurality of materials in relation to the material of the semiconductor layer forming the channel formation region.

The semiconductor material forming the floating gate can be selected from the materials satisfying one or a plurality of the conditions below. The semiconductor material forming the floating gate preferably has a band gap smaller than that of the semiconductor layer. For example, the band gap of the semiconductor material forming the floating gate is preferably smaller than that of the semiconductor layer by 0.1 eV or more.

Further, the semiconductor material is preferably formed from a material having a higher electron affinity than a material forming the semiconductor layer. Preferably, the semiconductor material is such that the barrier energy formed by the first insulating layer for electrons of the floating gate is higher than the barrier energy formed by the first insulating layer for electrons of the semiconductor layer.

As the material forming the floating gate, germanium or a germanium compound is typically used preferably.

The floating gate is applied to a nonvolatile semiconductor memory device according to the present invention for charge accumulation without limitation to germanium or a germanium compound, a layer of an oxide or a nitride of germanium or a germanium compound, or an oxide layer or a nitride layer containing germanium or a germanium compound can be used as long as it is a layer having a similar function, that is, a layer functioning as a charge accumulating layer.

In a nonvolatile semiconductor memory device of the present invention, the semiconductor layer is preferably formed on an insulating surface and separated into island-shaped semiconductor layers. At least, a semiconductor layer forming a memory element and a semiconductor layer forming a logic circuit are preferably separated. Accordingly, the present invention is a nonvolatile semiconductor memory device having a semiconductor layer having a channel formation region provided between a pair of impurity regions spaced from each other; a first insulating layer, a floating gate, a second insulating layer, and a control gate that are positioned above the semiconductor layer to overlap with the channel formation region. Further, the semiconductor layer may be formed on an insulating surface.

In the case of forming a floating gate over a semiconductor layer with a first insulating layer serving as a tunnel insulating layer therebetween, the floating gate is formed of a semiconductor material at least containing germanium, whereby charges can be easily injected from the semiconductor layer to the floating gate and charge retention characteristics of the floating gate can be improved.

Further, when the floating gate is formed using a material having similar properties to silicon, a nonvolatile semiconductor memory device with excellent characteristics can be manufacture without loss of the productivity. Since germanium is a semiconductor and is a material of the group XIV of the periodic table of elements as the same as silicon, a thin film can be microfabricated without putting a load on manufacturing facilities.

BRIEF DESCRIPTION OF THE DRAWINGS

In the accompanying drawings,

FIGS. 18A to 18C illustrate an example of a method for manufacturing a nonvolatile semiconductor memory device of the present invention;

FIGS. 19A to 19C illustrate an example of a method for manufacturing a nonvolatile semiconductor memory device of the present invention;

FIGS. 20A to 20C illustrate an example of a method for manufacturing a nonvolatile semiconductor memory device of the present invention;

FIGS. 21A to 21C illustrate an example of a method for manufacturing a nonvolatile semiconductor memory device of the present invention;

FIGS. 22A to 22C illustrate an example of a method for manufacturing a nonvolatile semiconductor memory device of the present invention;

FIGS. 23A to 23C illustrate an example of a method for manufacturing a nonvolatile semiconductor memory device of the present invention;

FIGS. 25A to 25C illustrate an example of a method for manufacturing a nonvolatile semiconductor memory device of the present invention;

FIGS. 26A to 26C illustrate an example of a method for manufacturing a nonvolatile semiconductor memory device of the present invention;

FIGS. 28A to 28C illustrate an example of a method for manufacturing a nonvolatile semiconductor memory device of the present invention;

FIGS. 29A to 29C illustrate an example of a method for manufacturing a nonvolatile semiconductor memory device of the present invention;

FIGS. 30A to 30C illustrate an example of a method for manufacturing a nonvolatile semiconductor memory device of the present invention;

FIGS. 31A and 31B illustrate an example of a method for manufacturing a nonvolatile semiconductor memory device of the present invention;

FIG. 34 illustrates an example of a top view of a nonvolatile semiconductor memory device of the present invention;

FIG. 45 illustrates an example of a top view of a nonvolatile semiconductor memory device of the present invention.

DETAILED DESCRIPTION OF THE INVENTION

Figure 1:
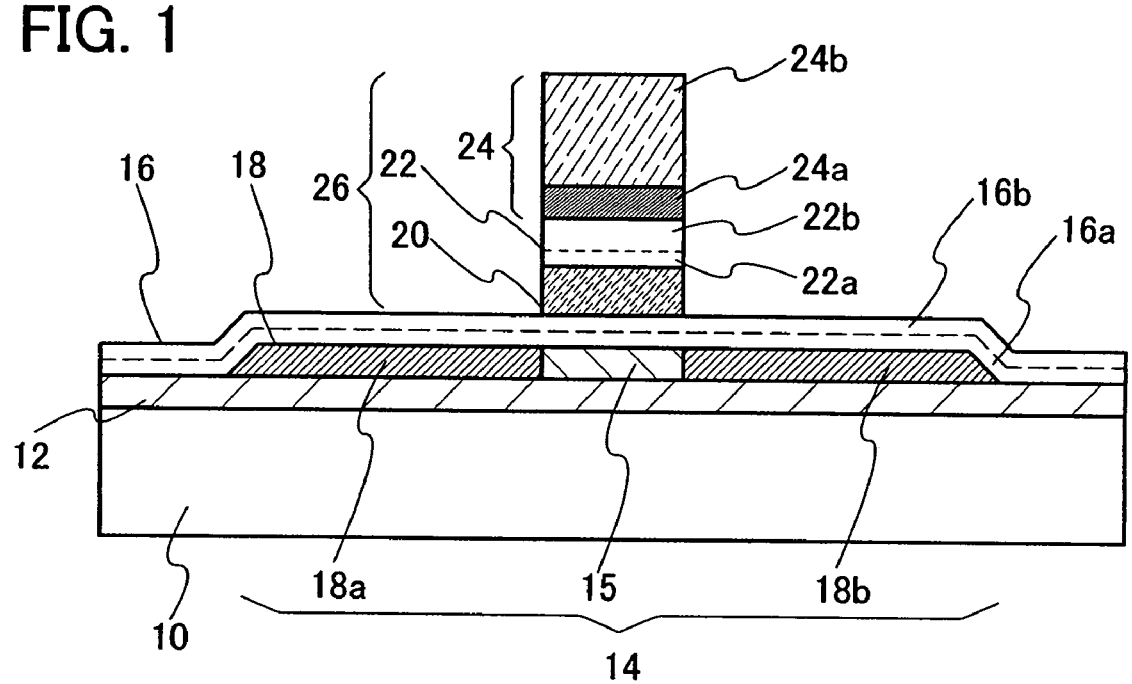
FIG. 1 is a cross-sectional view illustrating a main structure of nonvolatile semiconductor memory device of the present invention.

An embodiment mode and embodiments of the present invention will be hereinafter described with reference to the drawings. However, it is easily understood by those skilled in the art that the present invention is not limited by the following description and that the mode and detail can be variously changed without departing from the scope and spirit of the present invention. Therefore, the present invention is not construed as being limited to the description of the embodiment mode and embodiments hereinafter shown. In the structure of the present invention described below, a reference numeral denoting the same part may be used in common throughout the drawings.

Embodiment Mode

FIG. 1 is a cross-sectional view for explaining a main structure of a nonvolatile semiconductor memory device of the present invention. FIG. 1 especially shows an essential part of the nonvolatile memory element. This nonvolatile memory element is manufactured using a substrate 10 having an insulating surface. As the substrate 10 having an insulating surface, a glass substrate, a quartz substrate, a sapphire substrate, a ceramic substrate, a metal substrate provided with an insulating layer on its surface, or the like can be used.

A semiconductor layer 14 is formed over the substrate 10 having an insulating surface. A base insulating layer 12 may be provided between the substrate 10 and the semiconductor layer 14. This base insulating layer 12 may be provided as appropriate, whereby preventing impurities such as alkali metal from diffusing into the semiconductor layer 14 from the substrate 10 and from contaminating the semiconductor layer 14.

The base insulating layer 12 is formed of an insulating material such as silicon oxide, silicon nitride, silicon oxynitride ($SiO_xN_y$, x>y), or silicon nitride oxide ($SiN_xO_y$, x>y), by CVD, sputtering, or the like. For example, in a case where the base insulating layer 12 has a two-layer structure, a silicon nitride oxide film may be formed as a first insulating film and a silicon oxynitride film may be formed as a second insulating film. Alternatively, a silicon nitride film may be formed as the first insulating film and a silicon oxide film may be formed as the second insulating film.

The semiconductor layer 14 is preferably formed from a single crystal semiconductor or a polycrystalline semiconductor. For example, a semiconductor layer may be formed over the substrate 10 by sputtering, plasma CVD, or LPCVD; crystallized; and selectively etched to form the semiconductor layer 14. Specifically, for the purpose of device isolation, it is preferable to form an island-shaped semiconductor layer over the insulating surface, and to form one or a plurality of nonvolatile memory elements over the semiconductor layer. As the semiconductor material, silicon is preferable, and a silicon germanium semiconductor can also be used. The semiconductor film may be formed by a crystallization method such as a laser crystallization method, a crystallization method by heat treatment using rapid thermal annealing (RTA) or an annealing furnace, a crystallization method using a metal promoting crystallization, or a combination of them. Further, instead of such a thin film process, a so-called SOI (Silicon on Insulator) substrate in which a single crystal semiconductor layer is formed on the insulating surface can be used.

Thus, when a semiconductor layer is formed over the insulating surface and separated into island-shaped semiconductor layers, device isolation can be carried out effectively even in the case where a memory element array and a peripheral circuit are formed over one substrate. Specifically, a memory element array in which a voltage of from approximately 10V to 20V is required to write and erase, and a peripheral circuit which operates at a voltage of from approximately 3V to 7V to mainly input and output data and control commands are formed over one substrate, mutual interference due to the difference of the voltages applied to each element can be prevented.

A p-type impurity may be injected into the semiconductor layer 14. As the p-type impurity, for example, boron is used and added at a concentration of approximately from $5 \times 10^{15}$ atoms/cm$^3$ to $1 \times 10^{16}$ atoms/cm$^3$. The impurity is added for controlling the threshold of a transistor, and the impurity effectively operates when it is added to a channel formation region 15. The channel formation region 15 is formed in a region, which almost corresponds to a gate 26 described later, and positioned between a pair of impurity regions 18 of the semiconductor layer 14.

The pair of impurity regions 18 serves as a source region and a drain region in the nonvolatile memory element. The pair of impurity regions 18 is formed by doping with phosphorus or arsenic which is an n-type impurity at a concentration of approximately from $1 \times 10^{19}$ atoms/cm$^3$ to $1 \times 10^{21}$ atoms/cm$^3$.

A first insulating layer 16, a floating gate electrode 20, a second insulating layer 22, and a control gate electrode 24 are formed over the semiconductor layer 14. In this specification, a stacked structure from the floating gate 20 to the control gate electrode 24 may be referred to as a gate 26.

The first insulating layer 16 is formed using silicon oxide or a stacked structure of silicon oxide and silicon nitride. The first insulating layer 16 may be formed by depositing an insulating film by plasma CVD or LPCVD; however, it is preferably formed by solid-phase oxidation or solid-phase nitridation using plasma treatment. This is because the insulating layer formed by oxidizing or nitriding a semiconductor layer (typically, a silicon layer) by plasma treatment is dense and has high withstand voltage and high reliability. Since the first insulating layer 16 is used as a tunnel insulating layer for injecting charges into the floating gate electrode 20, it is preferable that the insulating layer is dense and has high withstand voltage and high reliability. This first insulating layer 16 is preferably formed to a thickness of from 1 nm to 20 nm, preferably from 3 nm to 6 nm. For example, when the gate length is 600 nm, the first insulating layer 16 can be formed to a thickness of from 3 nm to 6 nm.

Plasma used for solid-phase oxidation or solid-phase nitridation by plasma treatment is preferably under the following conditions: excited by microwave (typically, 2.45 GHz) at an electron density of from $1 \times 10^{11}$ cm$^{-3}$ to $1 \times 10^{13}$ cm$^{-3}$ and at an electron temperature of from 0.5 eV to 1.5 eV. The conditions are preferred to form a dense insulating film at a practical reaction rate solid-phase oxidation or solid-phase nitridation at 500° C. or less.

The oxidation of the surface of the semiconductor layer 14 with this plasma treatment is performed in an oxygen atmosphere (e.g., in an atmosphere containing oxygen ($O_2$) or dinitrogen monoxide ($N_2O$), and a rare gas (containing at least one of He, Ne, Ar, Kr, and Xe), or in an atmosphere containing oxygen or dinitrogen monoxide, hydrogen ($H_2$), and a rare gas). The nitridation of the surface of the semiconductor layer 14 with this plasma treatment is performed in a nitrogen atmosphere (e.g., in an atmosphere containing nitrogen ($N_2$) and a rare gas (containing at least one of He, Ne, Ar, Kr, and Xe), in an atmosphere containing nitrogen, hydrogen, and a rare gas, or in an atmosphere containing $NH_3$ and a rare gas). As the rare gas, Ar can be used for example. Further, a gas in which Ar and Kr are mixed may also be used.

Figure 15:
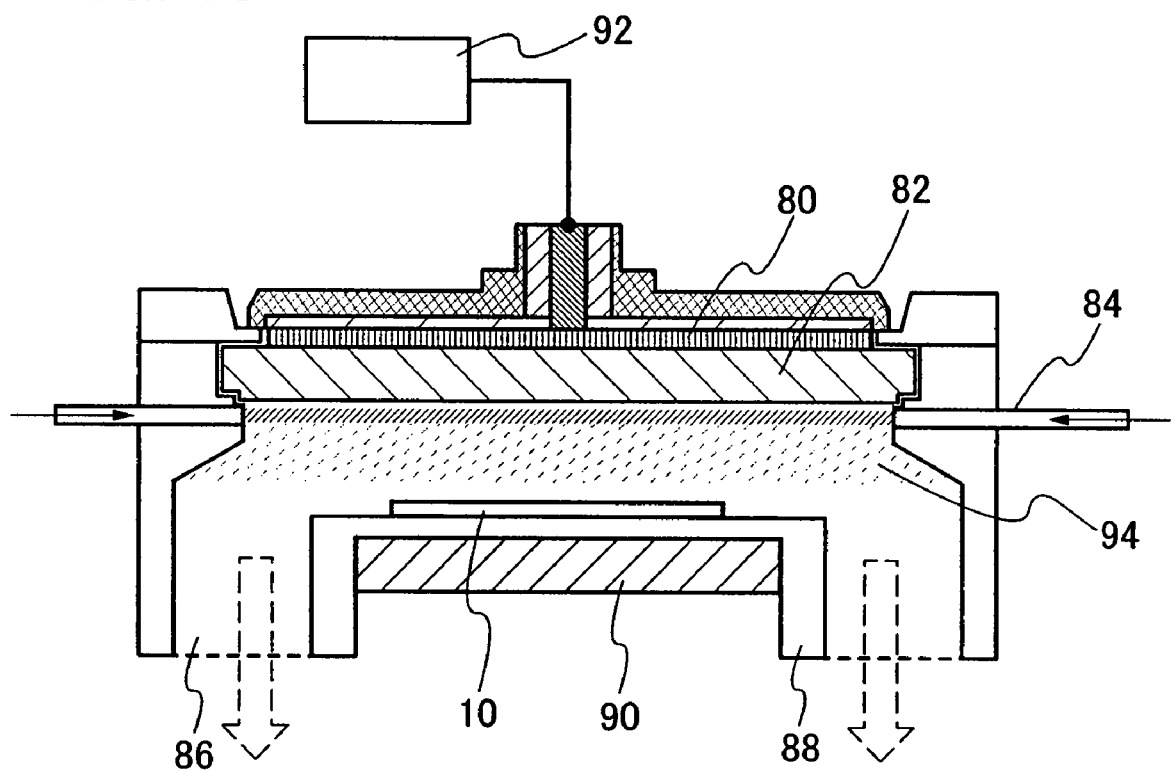
FIG. 15 illustrates a structure of a plasma treatment apparatus.

FIG. 15 shows a structure example of an apparatus for performing plasma treatment. This plasma treatment apparatus includes a support 88 for placing the substrate 10, a gas supply portion 84 for introducing a gas, an exhaust port 86 connected to a vacuum pump for exhausting a gas, an antenna 80, a dielectric plate 82, and a microwave supply portion 92 for supplying a microwave for generating plasma. In addition, by providing a temperature control portion 90 for the support 88, the temperature of the substrate 10 can also be controlled.

Plasma treatment will be described below. Note that the plasma treatment includes oxidation treatment, nitridation treatment, oxynitridation treatment, hydrogenation treatment, and surface reforming treatment performed to a semiconductor layer, an insulating layer, and a conductive layer. In each treatment, a gas supplied from the gas supply portion 84 can be selected in accordance with its purpose.

Oxidation treatment or nitridation treatment may be performed as follows. First, a treatment chamber is evacuated, and a plasma treatment gas containing oxygen or nitrogen is introduced from the gas supply portion 84. The substrate 10 is heated to room temperature or a temperature of 100° C. to 550° C. by the temperature control portion 90. Note that the distance between the substrate 10 and the dielectric plate 82 is approximately 20 mm to 80 mm (preferably, 20 mm to 60 mm). Next, microwaves are supplied to the antenna 80 from the microwave supply portion 92. Then, the microwaves are introduced into the treatment chamber from the antenna 80 through the dielectric plate 82, thereby plasma 94 is generated. By exciting plasma with microwave introduction, plasma with a low electron temperature (3 eV or less, preferably 1.5 eV or less) and a high electron density ($1 \times 10^{11}$ $cm^{-3}$ or more) can be generated. With oxygen radicals (which may include OH radicals) and/or nitrogen radicals (which may include NH radicals) generated by this high-density plasma, the surface of the semiconductor layer can be oxidized and/or nitrided. By mixing a rare gas such as argon into the plasma treatment gas, oxygen radicals or nitrogen radicals can be effectively generated by excited species of the rare gas. This method enables solid-phase oxidation, solid-phase nitridation, solid-phase oxynitridation, or solid-phase nitridation-oxidation at a low temperature of 500° C. or less by efficiently utilizing the active radicals excited with the plasma.

In FIG. 1, one preferable example of the first insulating layer 16 has a layered structure in which a silicon oxide layer 16a is formed with a thickness of 3 nm to 6 nm inclusive on the surface of the semiconductor layer 14 by plasma treatment in an oxygen atmosphere and then a silicon nitride layer 16b is formed by nitriding a surface of the silicon oxide layer 16a in a nitrogen atmosphere. When a silicon material is used as a typical example of the semiconductor layer 14, the surface of the silicon layer is oxidized by plasma treatment, so that a dense oxide film without distortion at the interface can be formed. Furthermore, by nitriding the oxide film by plasma treatment so that oxygen in the superficial layer portion is replaced with nitrogen to form a nitride layer, the density of the first insulating layer 16 can be further improved. Consequently, an insulating layer which is high in withstand voltage can be formed.

In any case, when solid-phase oxidation or solid-phase nitridation by the above plasma treatment is used, even in the case of using a glass substrate having the upper temperature limit of 700° C. or less, an insulating layer equivalent to a thermal oxide film formed at from 950° C. to 1050° C. can be obtained. Thus, a tunnel insulating layer having high reliability can be formed as the tunnel insulating layer of the nonvolatile memory element.

The floating gate electrode 20 is formed over the first insulating layer 16. For the floating gate electrode 20, a semiconductor material is preferably used, and a semiconductor material which satisfies one or a plurality of the following conditions can be selected.

It is preferable that a band gap of the semiconductor material forming the floating gate electrode 20 be smaller than that of the semiconductor layer 14. For example, it is preferable that there be a difference of 0.1 eV or more between the band gap of the semiconductor material forming the floating gate and that of the semiconductor layer, and the former be smaller than the latter. This is because, by making the bottom energy level of a conduction band of the floating gate electrode 20 lower than that of the semiconductor layer 14, a charge (electron) injecting property is improved and charge retention characteristics are improved.

It is preferable that the semiconductor material forming the floating gate electrode 20 have a higher electron affinity than the material forming the semiconductor layer 14. This is because, by making the bottom energy level of the conduction band of the floating gate electrode 20 lower than that of the semiconductor layer 14, the carrier (electron) injecting property is improved and the charge retention characteristics are improved. The electron affinity of a semiconductor corresponds to an energy difference from the bottom of the conduction band to the vacuum level.

The material forming the floating gate electrode 20 is preferably such that a barrier energy formed by the first insulating layer 16 for electrons of the floating gate electrode 20 is higher than that formed by the first insulating layer 16 for electrons of the semiconductor layer 14. This is because it becomes easy to inject charges (electrons) from particularly the semiconductor layer 14 into the floating gate electrode and charges are prevented from being vanished from the floating gate electrode 20.

As the semiconductor material used for the floating gate electrode 20, which satisfies the above conditions, germanium or a germanium compound can be typically selected. As a typical example of the germanium compound, silicon-germanium can be given, which preferably contains germanium at 10 atomic % or more in this case. This is because, if the concentration of the germanium is less than 10 atomic %, an effect of germanium as a constituting element is weakened and the band gap does not become small.

It is needless to say that another material can also be used for forming the floating gate electrode 20 as long as the similar effect is developed. For example, a ternary semiconductor material containing germanium can be used. The semiconductor material can also be hydrogenated. In addition, as a floating gate electrode having a function as a charge-accumulating layer of the nonvolatile memory element, a layer of an oxide or a nitride of germanium or a germanium compound, or an oxide layer or a nitride layer containing germanium or a germanium compound can be used.

The second insulating layer 22 is formed of a single layer or a plurality of layers of silicon oxide, silicon oxynitride ($SiO_xN_y$ (x>y)), silicon nitride ($SiN_x$), silicon nitride oxide ($SiN_xO_y$ (x>y)), aluminum oxide ($Al_xO_y$), and the like by low-pressure CVD, plasma CVD, or the like. The second insulating layer 22 may preferably be formed to a thickness of greater than or equal to 1 nm and less than or equal to 20 nm, preferably greater than or equal to 5 nm and less than or equal to 10 nm. For example, a silicon nitride layer 22a is deposited with a thickness of 3 nm, and a silicon oxide layer 22b is deposited thereover with a thickness of 5 nm, to be used. Further, a nitride film may also be formed by performing plasma treatment on the floating gate electrode 20 to perform nitridation treatment on a surface of the floating gate electrode 20 (e.g., germanium nitride in the case where germanium is used for the floating gate electrode 20). In any case, either or both of a side of the first insulating layer 16 and a side of the second insulating layer 22, which are in contact with the floating gate electrode 20, are nitride layers or layers subjected to nitridation treatment; thus, the floating gate electrode 20 can be prevented from being oxidized.

The control gate electrode 24 is preferably formed of a metal selected from tantalum (Ta), tungsten (W), titanium (Ti), molybdenum (Mo), chromium (Cr), niobium (Nb), or the like, or an alloy material or a compound material containing the metal as a main component. Alternatively, polycrystalline silicon to which an impurity element such as phosphorus is added can be used. Further alternatively, a staked-layer structure of a metal nitride layer 24a including one layer or a plurality of layers and a metal layer 24b described above may also be formed as the control gate electrode 24. As the metal nitride, tungsten nitride, molybdenum nitride, or titanium nitride can be used. By providing the metal nitride layer 24a, adhesion of the metal layer 24b can be improved and peeling can be prevented. In addition, since metal nitride such as tantalum nitride has a high work function, the thickness of the first insulating layer 16 can be thick due to synergistic effect with the second insulating layer 22.

An operation mechanism of the nonvolatile memory element shown in FIG. 1 will be described with reference to band diagrams. In the band diagrams described below, the same elements as those in FIG. 1 are denoted by the same reference numerals.

Figure 2:
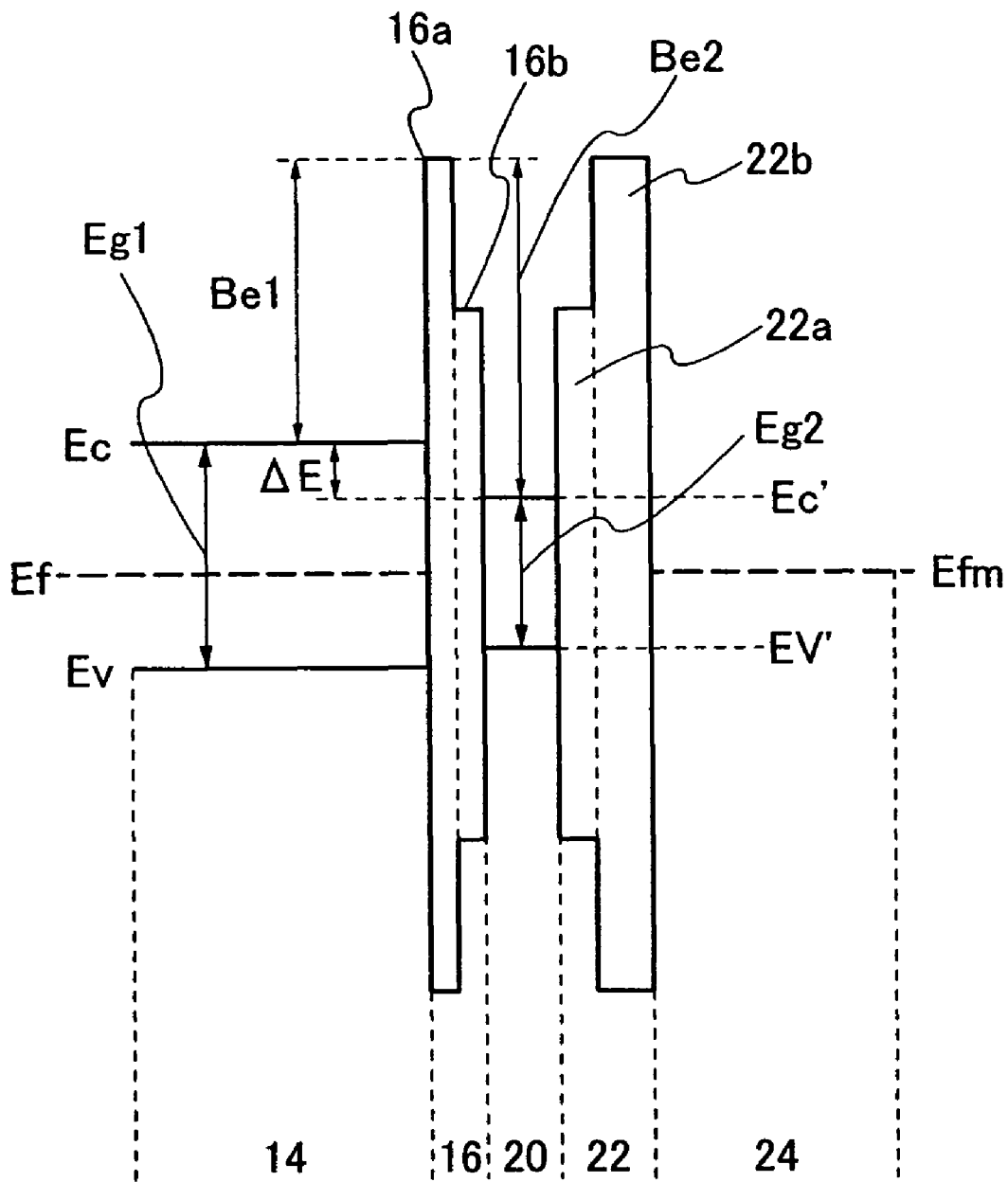
FIG. 2 is a band diagram of a nonvolatile memory in an initial state (charge emission state)

FIG. 2 shows the state where the semiconductor layer 14, the first insulating layer 16, the floating gate electrode 20, the second insulating layer 22, and the control gate electrode 24 are stacked. FIG. 2 shows the case where no voltage is applied to the control gate electrode 24 and a Fermi level Ef of the semiconductor layer 14 and a Fermi level Efm of the control gate electrode 24 are equal to each other.

The semiconductor layer 14 and the floating gate electrode 20 are formed of different materials with the first insulating layer 16 interposed therebetween. They are combined such that a band gap Eg1 (an energy difference between a bottom end Ec of a conduction band and a top end Ev of a valence band) of the semiconductor layer 14 is deferent from a band gap Eg2 of the floating gate electrode 20 and the latter band gap is smaller. For example, silicon (1.12 eV) for the semiconductor layer 14, and germanium (0.72 eV) or silicon-germanium (0.73 eV to 1.0 eV) for the floating gate electrode 20 can be combined. Note that the first insulating layer 16 is illustrated as the silicon oxide layer 16a (about 8 eV) and the silicon nitride layer 16b (about 5 eV) which is obtained by nitriding the silicon oxide with plasma treatment. Further, the second insulating layer 22 also has the state where the silicon nitride layer 22a and the silicon oxide layer 22b are stacked from the floating gate electrode 20 side.

Note that in the case where the vacuum level is 0 eV, the energy level of the conduction band of silicon is −4.05 eV and the energy level of the conduction band of germanium is −4.1 eV. Further, the energy level of conduction band of silicon oxide is −0.9 eV. Therefore, by thus combining the semiconductor layer 14 and the floating gate electrode 20 with each other, a barrier energy (Be2) formed by the first insulating layer 16 for electrons of the floating gate electrode 20 can be higher than a barrier energy (Be1) formed by the first insulating layer 16 for electrons of the semiconductor layer 14. That is, barrier energies for electrons, namely the first barrier energy Be1 and the second barrier energy Be2 have different values to satisfy the relationship of Be2>Be1.

Further, at this state, the band gap Eg1 of silicon of the semiconductor layer 14 and the band gap Eg2 of germanium of the floating gate electrode 20 satisfy a relationship of Eg1>Eg2. Further, when considering the electron affinity as described above, an energy difference ΔE occurs between the bottom energies of the conduction bands of the semiconductor layer 14 and the floating gate electrode 20. As described later, this energy difference ΔE, which acts so as to accelerate electrons when the electrons are injected from the semiconductor layer 14 to the floating gate electrode 20, contributes to decrease in write voltage.

Figure 16:
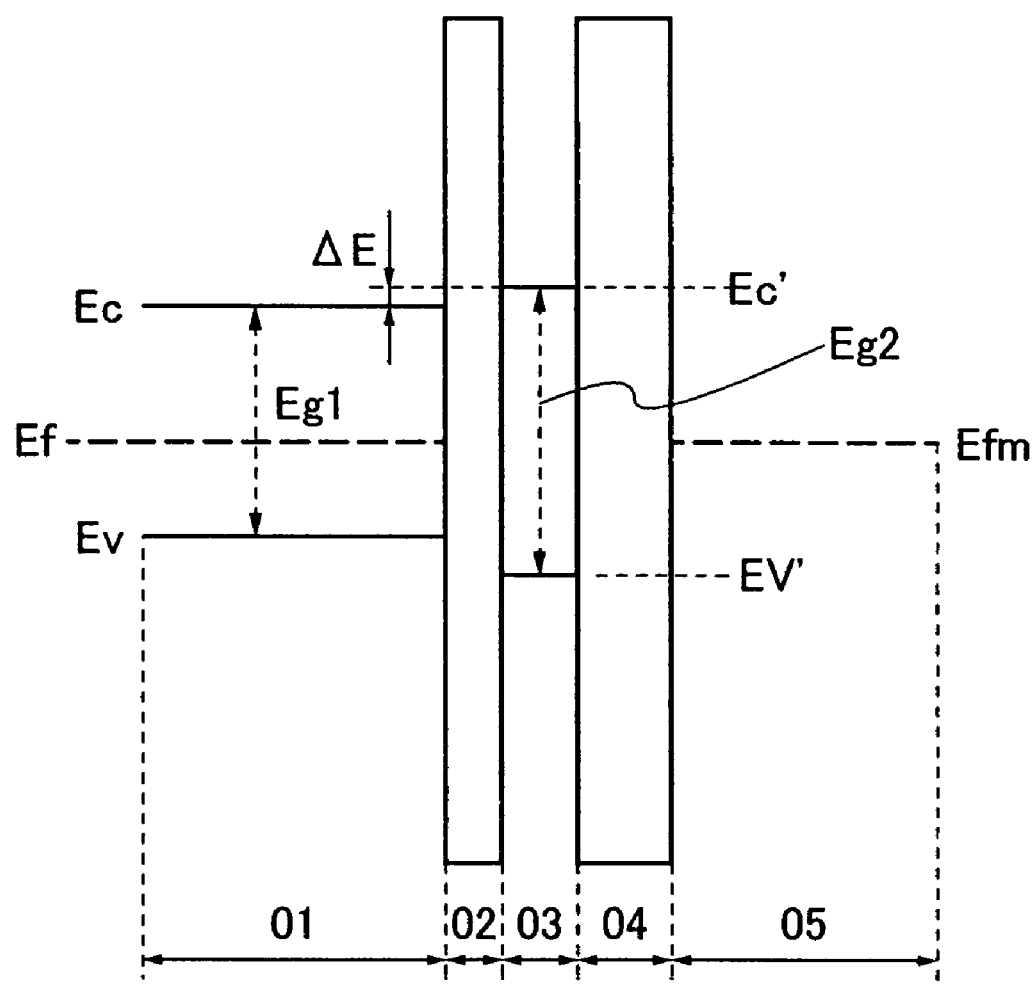
FIG. 16 is a band diagram of a conventional nonvolatile memory.

For comparison, a band diagram in the case where a semiconductor layer and a floating gate electrode are formed of the same semiconductor material is shown in FIG. 16. This band diagram shows the state where a semiconductor layer 01, a first insulating layer 02, a floating gate electrode 03, a second insulating layer 04, and a control gate electrode 05 are stacked sequentially. Even when the semiconductor layer 01 and the floating gate electrode 03 are formed from the same silicon material, the band gaps may differ if the floating gate electrode 03 is formed thin. In FIG. 16, the band gap of the semiconductor layer 01 is denoted by Eg1 and the band gap of the floating gate electrode 03 is denoted by Eg2. For example, it is said that the band gap of silicon is increased to approximately 1.4 eV in the form of a thin film from 1.12 eV in the bulk state. Consequently, an energy difference −ΔE in a direction which obstructs electron injection occurs between the semiconductor layer 01 and the floating gate electrode 03. In this state, a high voltage is required to inject electrons from the semiconductor layer 01 to the floating gate electrode 03. That is, in order to decrease the write voltage, it is required that the floating gate electrode 03 is formed as thick as bulk silicon or it is doped with phosphorus or arsenic as an n-type impurity at a high concentration. This is a defect of a conventional nonvolatile memory.

There are the following methods for injecting electrons into the floating gate electrode 20: a method utilizing hot electrons and a method utilizing F-N tunneling current. In the case of utilizing hot electrons, a positive voltage is applied to the control gate electrode 24 and a high voltage is applied to a drain to generate hot electrons. Thus, the hot electrons can be injected into the floating gate electrode 20. In the case of utilizing F-N tunneling current, a positive voltage is applied to the control gate electrode 24 so that electrons are injected into the floating gate electrode 20 from the channel formation region 15 in the semiconductor layer 14 by using F-N tunneling current.

Figure 6A:
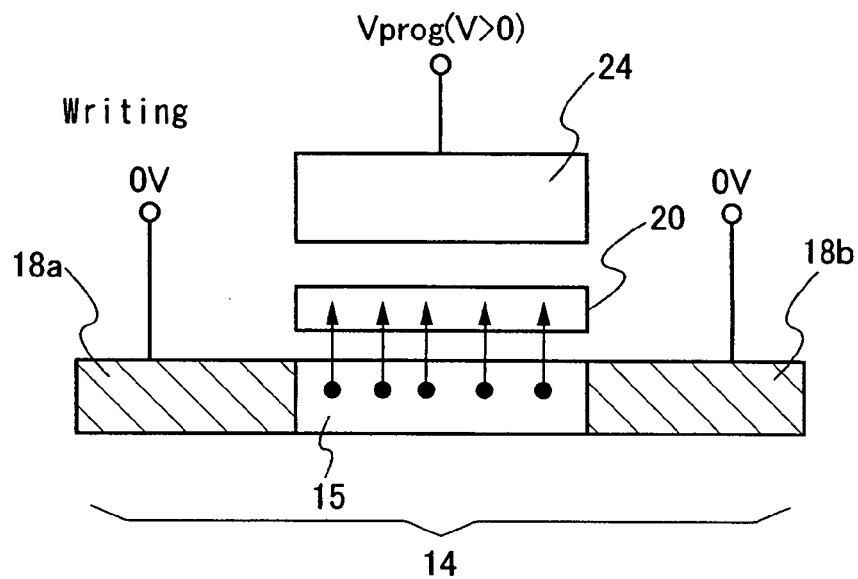
FIGS. 6A and 6B are diagrams illustrating write and read operations of a nonvolatile memory.

Voltages applied when electrons are injection into the floating gate electrode 20 by using F-N tunneling current are shown in FIG. 6A. A positive high voltage (10 V to 20 V) is applied to the control gate electrode 24, and 0 V is set to a source region 18a and a drain region 18b. A band diagram at this time is FIG. 3. Electrons in the semiconductor layer 14 are injected into the first insulating layer 16 by a high electrical field, and F-N tunneling current flow. As explained in FIG. 2, the relationship between the band gap Eg1 of the semiconductor layer 14 and the band gap Eg2 of the floating gate electrode 20 is Eg1>Eg2. This difference acts as a self-bias so as to accelerate electrons injected from the channel formation region 15 of the semiconductor layer 14 toward the floating gate electrode 20. Accordingly, an injecting property of electrons can be improved.

The bottom energy level of the conduction band of the floating gate electrode 20 is lower than the bottom energy level of the conduction band of the semiconductor layer 14 by ΔE. Therefore, an internal electrical field caused by this energy difference acts when injecting electrons into the floating gate electrode 20; this is realized by the above-described combination of the semiconductor layer 14 and the floating gate electrode 20. That is, it becomes easy to inject electrons from the semiconductor layer 14 into the floating gate electrode 20 so that writing characteristics in the nonvolatile memory element can be improved. This effect is similar also to the case of electron injection into the floating gate electrode 20 by utilizing hot electrons.

Figure 4:
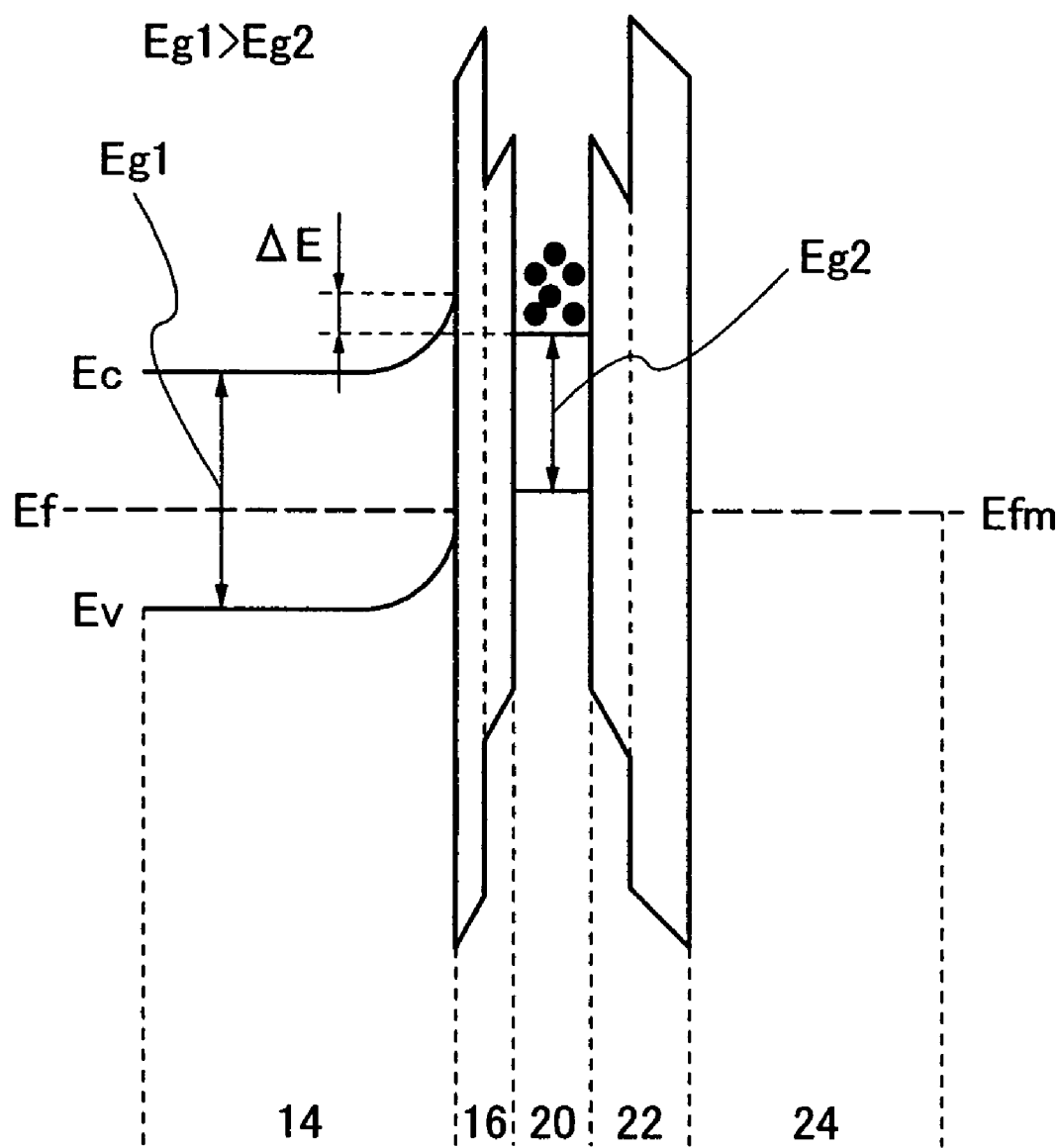
FIG. 4 is a band diagram of a nonvolatile memory in a charge storing state.

During a period in which electrons are held in the floating gate electrode 20, the threshold voltage of the nonvolatile memory element is shifted in a positive direction. This state can be denoted by a state where data "0" is written. FIG. 4 is a band diagram in the state of charge holding. Electrons of the floating gate electrode 20 which are sandwiched between the first insulating layer 16 and the second insulating layer 22 are energetically trapped. Although the potential is increased by the carriers (electrons) accumulated in the floating gate electrode 20, the electrons are not discharged from the floating gate electrode 20 unless an energy which is higher than the barrier energy is provided for the electrons. Further, since the bottom energy level of the conduction band of the floating gate electrode 20 is lower than the bottom energy level of the conduction band of the semiconductor layer 14 by ΔE, an energy barrier with respect to electrons is formed. Due to this barrier, the electrons can be prevented from being discharged into the semiconductor layer 14 by tunneling current. That is, even when a reliability test is conducted by allowing the floating gate to stand at a constant temperature of 150° C., charges accumulated in the floating gate electrode can be held.

Figure 6B:
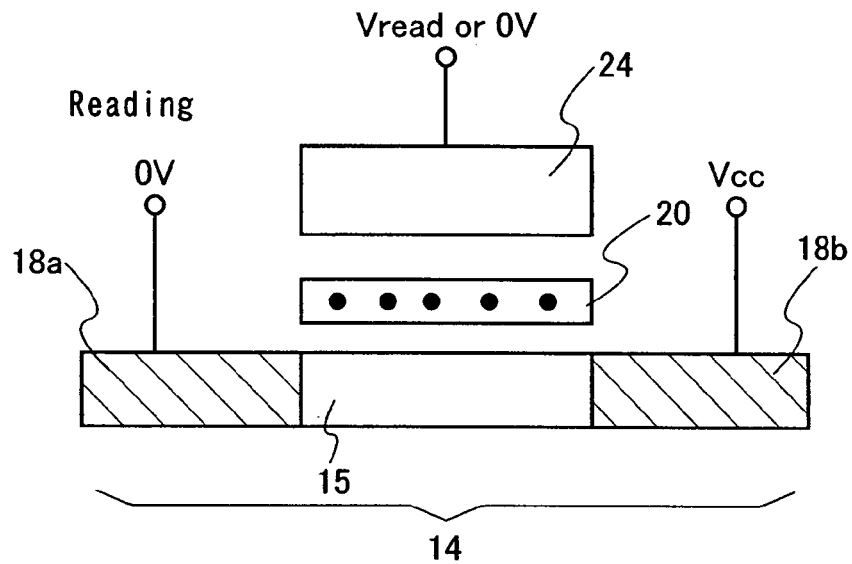

The state where data "0" is written can be detected by detecting that the transistor is not turned on when applying a midpoint potential Vread to the control gate electrode 24 by using a circuit. The midpoint potential is an intermediate potential between a threshold voltage Vth1 in the case where data is "1" and a threshold voltage Vth2 in the case where data is "0" (in this case, Vth1<Vread<Vth2). Alternatively, it can be judged by whether the nonvolatile memory element is turned on or not when a bias is applied between the source region 18a and the drain region 18b and 0 V is applied to the control gate electrode 24 as shown in FIG. 6B.

Figure 7A:
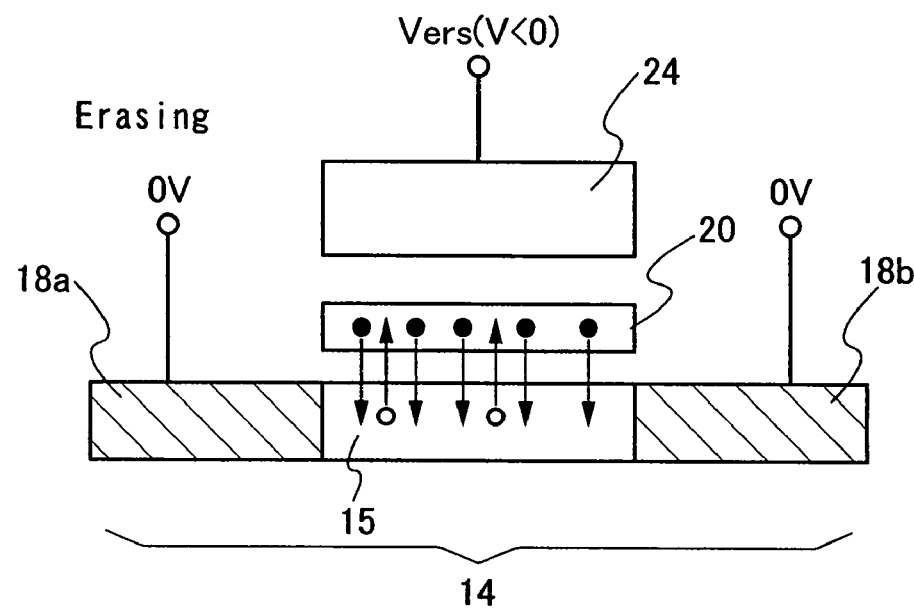
FIGS. 7A and 7B are diagrams illustrating erase operation of a nonvolatile memory.
Figure 7B:
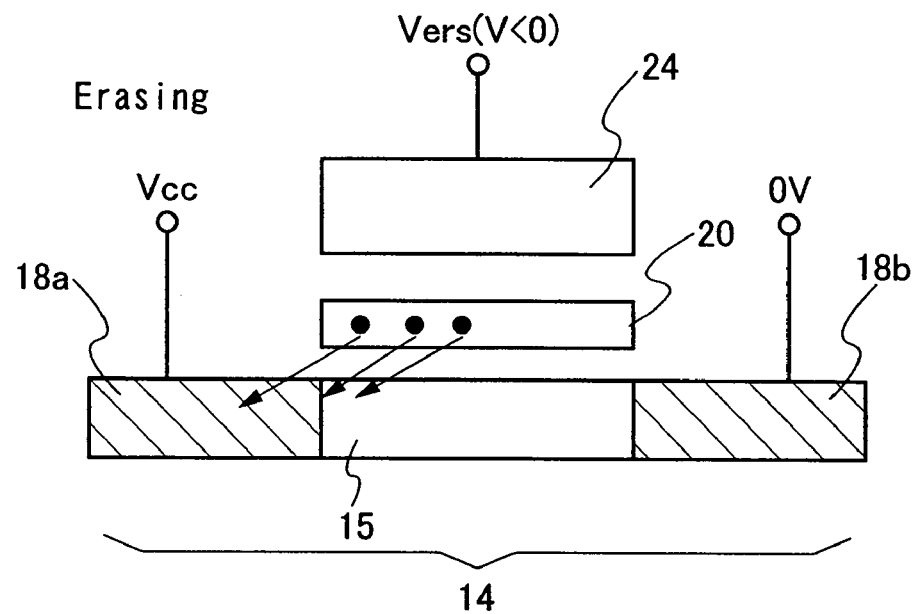

FIG. 7A shows the state where charges are discharged from the floating gate electrode 20 so that data is erased from the nonvolatile memory element. In this case, a negative bias is applied to the control gate electrode 24, so that F-N tunneling current flow between the semiconductor layer 14 and the floating gate electrode 20. Alternatively, as shown in FIG. 7B, a negative bias may be applied to the control gate electrode 24 and a positive high voltage may be applied to the source region 18a, so that F-N tunneling current may be generated to extract electrons to the source region 18a side.

Figure 5:
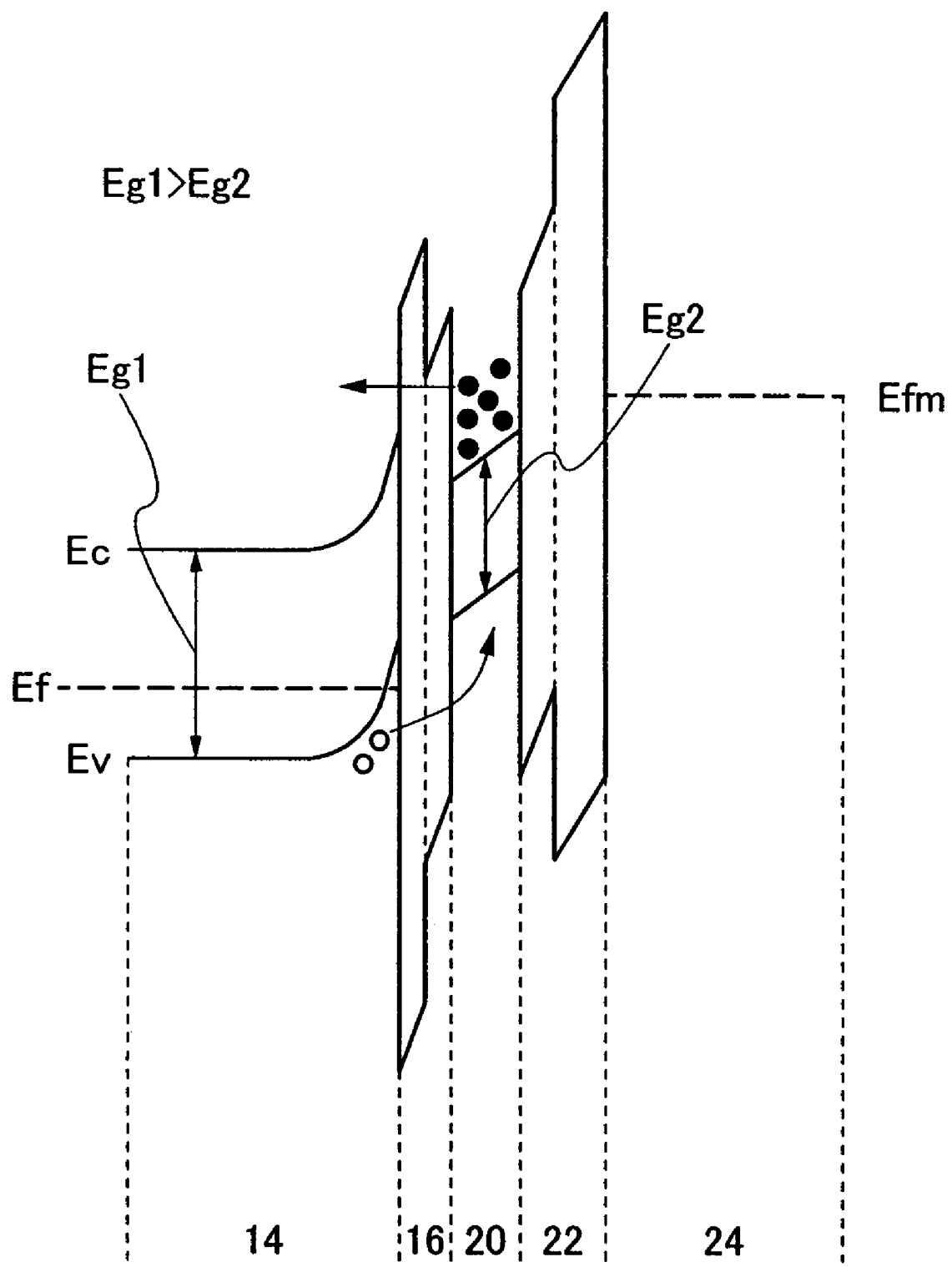
FIG. 5 is a band diagram of a nonvolatile memory in an erasing state.

FIG. 5 is a band diagram of this erasing state. Since the first insulating layer 16 can be formed thin, electrons of the floating gate electrode 20 can be discharged toward the semiconductor layer 14 side by F-N tunneling current in an erasing operation. In addition, holes are injected more easily from the semiconductor layer 14, and by injecting the holes into the floating gate electrode 20, a substantial erasing operation can be performed.

By forming the floating gate electrode 20 by using germanium or a germanium compound, the first insulating layer 16 can be made thin. Consequently, it becomes easy to inject electrons into the floating gate electrode 20 through the first insulating layer 16 by a tunneling current, so that an operation can be performed at a low voltage. Further, charges can be held at a low energy level, so that such a significant effect that charges can be held at a stable state can be provided.

Figure 3:
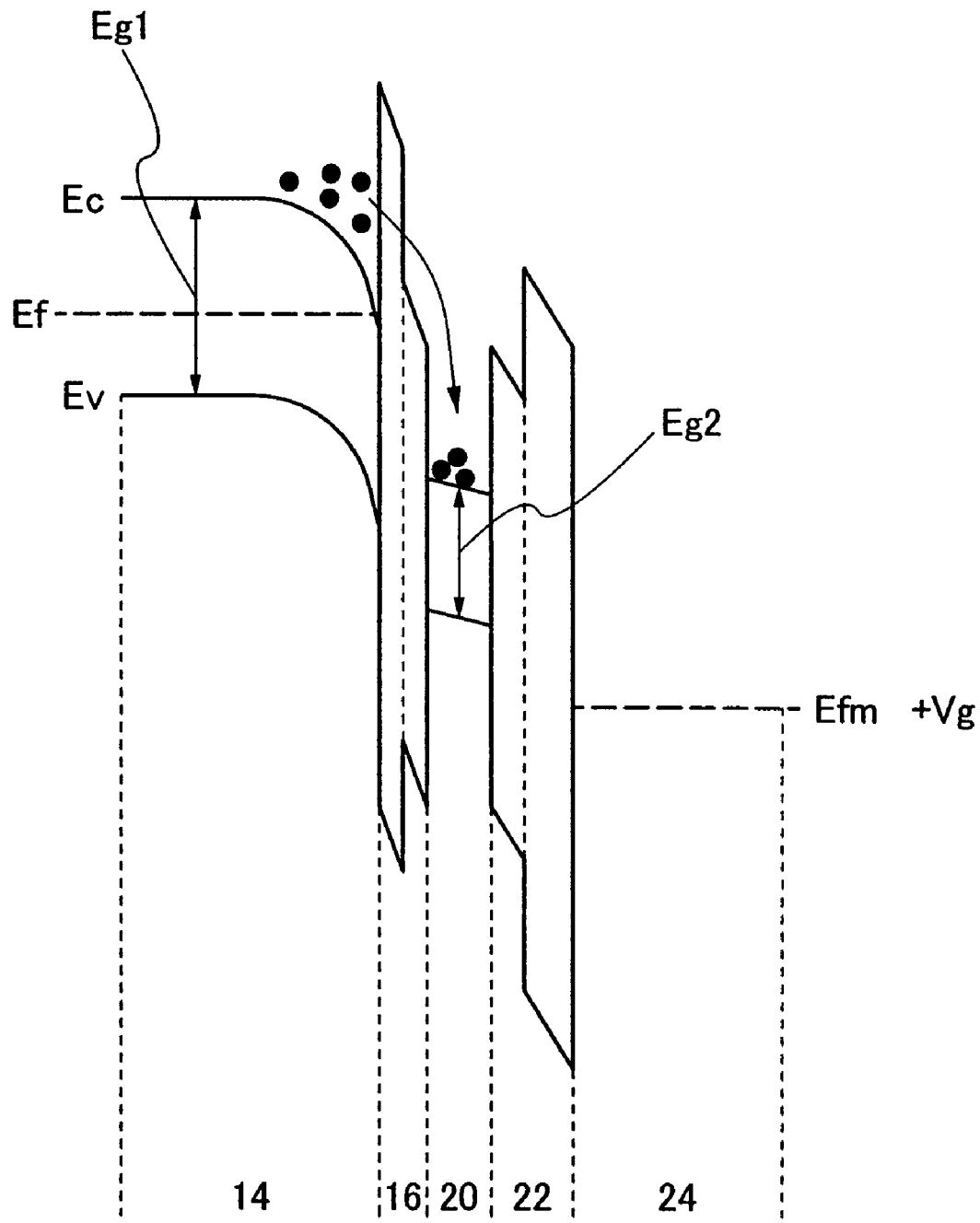
FIG. 3 is a band diagram of a nonvolatile memory in a writing state.

As shown in FIGS. 2 and 3, the nonvolatile memory element of the present invention is structured such that the semiconductor layer 14 and the floating gate electrode 20 have the relationship of Eg1>Eg2 to generate a self-bias therebetween. This relationship is extremely important and acts so that carriers are easily injected from the channel formation region in the semiconductor layer into the floating gate electrode. That is, the write voltage can be reduced. To the contrary, it is made difficult to discharge carriers from the floating gate electrode; this acts so that the memory retention characteristics of the nonvolatile memory element are improved. Further, by adding an n-type impurity into a germanium layer as the floating gate electrode, the bottom energy level of conduction band thereof can be further reduced, thereby the self-bias can be acted so as to further easily inject carriers into the floating gate electrode. That is, the write voltage can be reduced and the memory retention characteristics of the nonvolatile memory element can be improved.

As set forth above, in the nonvolatile memory element of the present invention, charges can be injected easily from the semiconductor layer into the floating gate electrode and charges can be prevented from being vanished from the floating gate electrode. That is, in the case of operating as a memory, highly efficient writing at a low voltage can be performed and charge retention characteristics can be improved.

Figure 8:
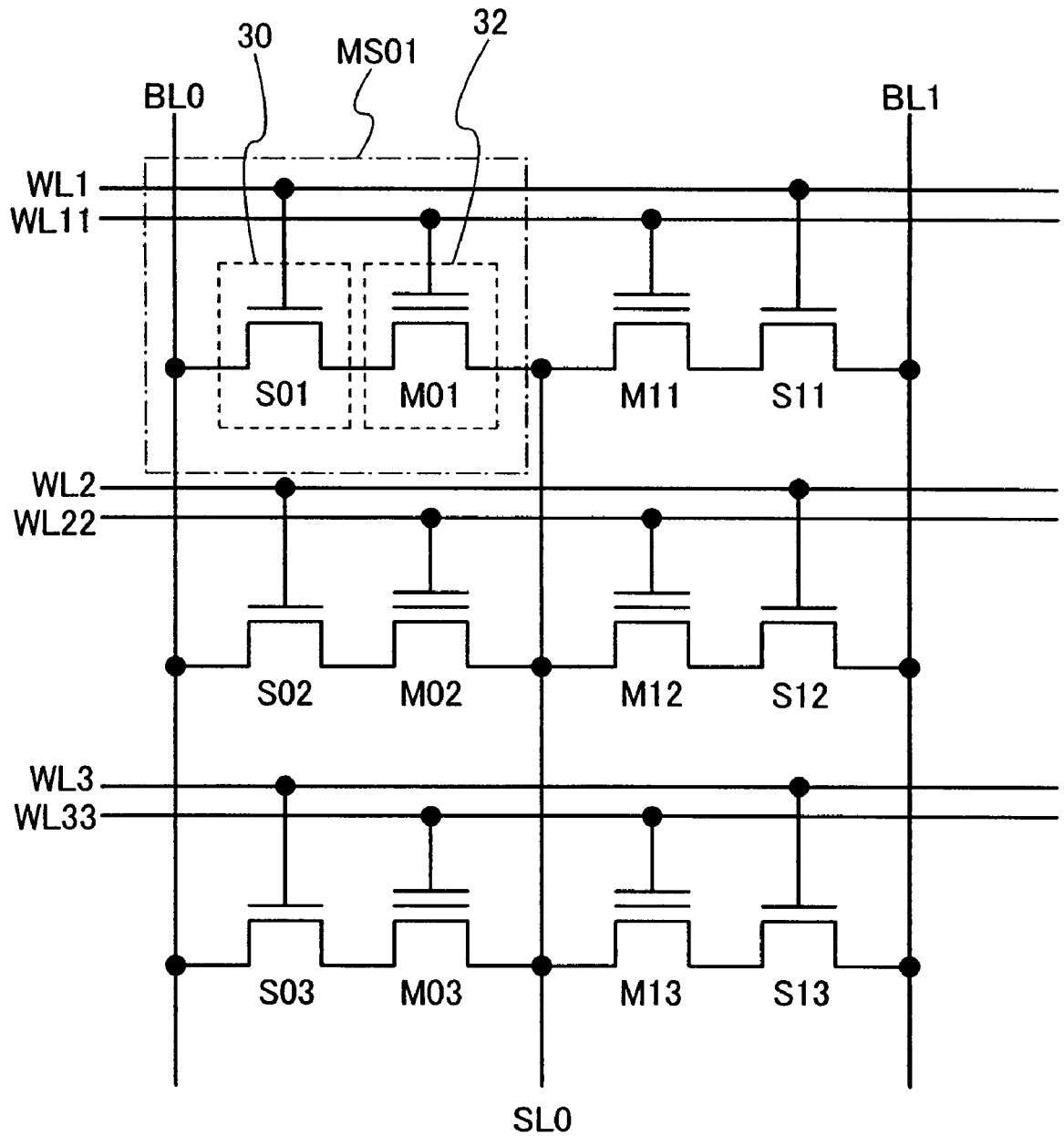
FIG. 8 illustrates an example of an equivalent circuit of a nonvolatile memory cell array.

By using such a nonvolatile memory element, nonvolatile semiconductor memory devices in various modes can be obtained. FIG. 8 shows one example of an equivalent circuit of a nonvolatile memory cell array. A memory cell MS01 which stores 1-bit data includes a selecting transistor S01 and a nonvolatile memory element M01. The selecting transistor S01 is disposed in series between a bit line BL0 and the nonvolatile memory element M01, and a gate thereof is connected to a word line WL1. A gate of the nonvolatile memory element M01 is connected to a word line WL11. When data is written into the nonvolatile memory element M01, potentials of the word line WL1 and the bit line BL0 are set at H level while a potential of a bit line BL1 is set at L level, and a high voltage is applied to the word line WL11, so that charges are accumulated in a floating gate as described above. When data is erased, the potentials of the word line WL1 and the bit line BL0 may be set at H level while a negative high voltage may be applied to the word line WL11.

In the memory cell MS01, the select transistor S01 and the nonvolatile memory element M01 are respectively formed using semiconductor layers 30 and 32, which are formed separately into islands over the insulating surface, interference with other selection transistors or nonvolatile memory elements can be prevented without specially providing a device isolation region. Further, since the select transistor S01 and the nonvolatile memory element M01 in the memory cell MS01 are both n-channel type, when they are formed using one semiconductor layer separated into island-shape, wiring connecting the two elements can be omitted.

Figure 9:
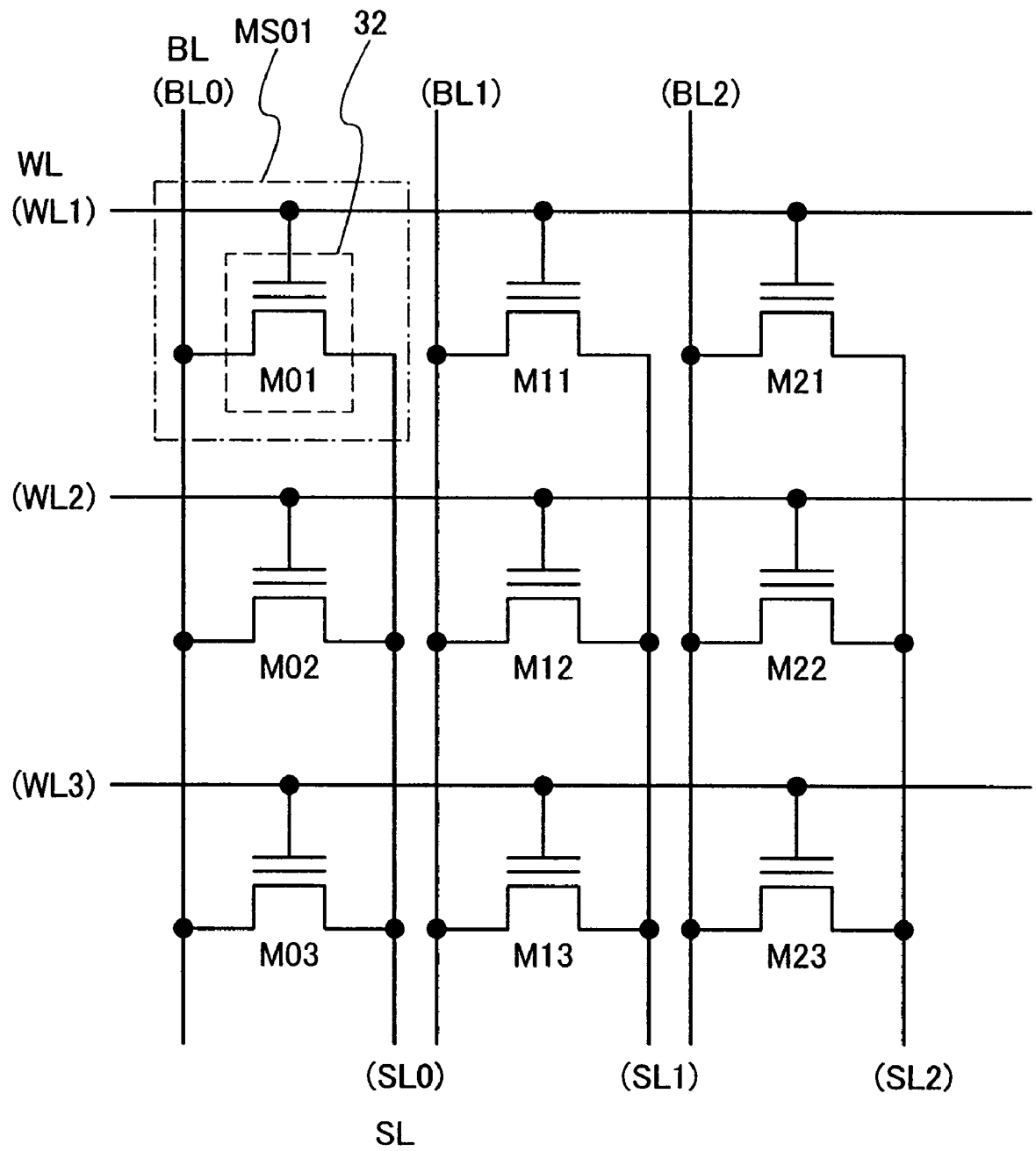
FIG. 9 illustrates an example of an equivalent circuit of a NOR type nonvolatile memory cell array.

FIG. 9 shows an equivalent circuit of a NOR type in which a nonvolatile memory element is directly connected to a bit line. In this memory cell array, word lines WL and bit lines BL are disposed so as to cross each other, and the nonvolatile memory element is disposed at each intersection. In the case of a NOR type, drains of the nonvolatile memory elements are connected to the bit lines BL. Sources of the nonvolatile memory elements are connected to the source lines SL in common.

Also in this case, in the memory cell MS01, the nonvolatile memory element M01 is formed using a semiconductor layer 32, which is formed separately into islands over the insulating surface; thus, interference with other nonvolatile memory elements can be prevented without specially providing a device isolation region. Further, a plurality of nonvolatile memory elements (for example, M01 to M23 shown in FIG. 9) are handled as one block, and those nonvolatile memory elements are formed using one semiconductor layer separated into island-shape; thus, erase operation can be performed in blocks.

Operations of the NOR type are, for example, as follows. When data is written, 0 V is set at the source lines SL, a high voltage is applied to a word line WL selected for data writing, and potentials corresponding to data "0" and data "1" are supplied to the bit lines BL. For example, a H-level potential and a L-level potential corresponding to data "0" and data "1" respectively are supplied to the bit lines BL. In each nonvolatile memory element to which the H-level potential for writing data "0" is applied, hot electrons are generated near the drain, and are injected into the floating gate. Such an electron injection is not performed in the case of data "1".

In a memory cell to which data "0" is supplied, hot electrons are generated near the drain by a strong transverse electrical field between the source and the drain, and are injected into the floating gate electrode. A state where the threshold voltage is increased by the electron injection into the floating gate is "0". In the case of data "1", hot electrons are not generated and electrons are not injected into the floating gate, thereby the state where the threshold voltage is low, namely an erased state is kept.

When data is erased, a positive voltage of approximately 10 V is applied to the source lines SL and the bit lines BL are set in a floating state. Then, a negative high voltage is applied to the word lines WL (a negative high voltage is applied to each control gate), thereby electrons are extracted from each floating gate. In this manner, the erased state of data "1" can be obtained.

When data is read, whether current of the nonvolatile memory element has been drawn or not is judged with a sense amplifier connected to the bit lines BL, by setting 0 V to the source lines SL and approximately 0.8 V to the bit lines BL, and supplying a reading voltage which is set at an intermediate value of threshold values of the data "0" and the data "1" to a selected word line WL.

Figure 10:
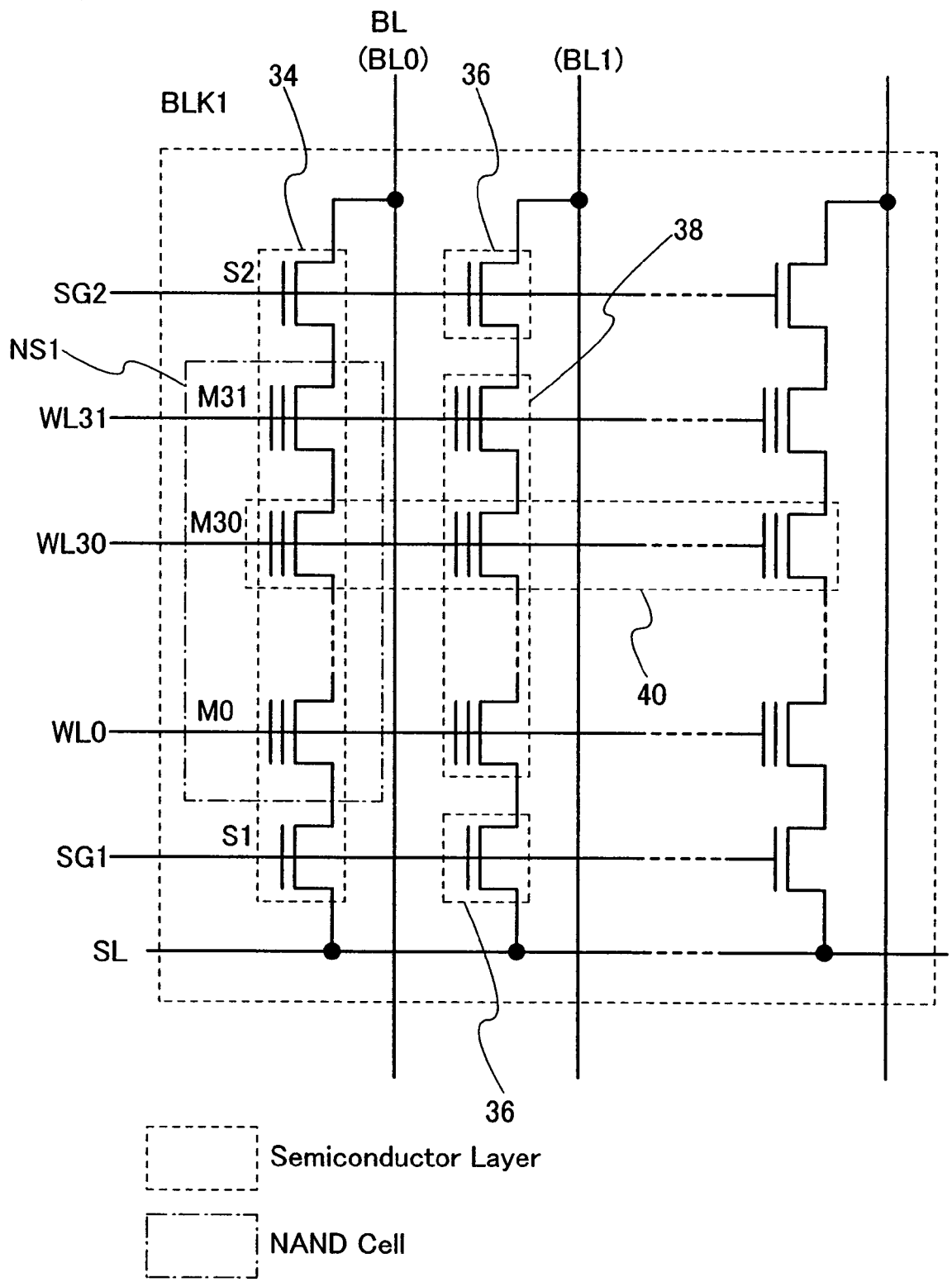
FIG. 10 illustrates an example of an equivalent circuit of a NAND type nonvolatile memory cell array.

FIG. 10 shows an equivalent circuit of a NAND type memory cell array. A NAND cell NS1 in which a plurality of nonvolatile memory elements are connected in series is connected to a bit line BL. A block BLK includes a plurality of NAND cells. A block BLK1 shown in FIG. 10 has 32 word lines (word lines WL0 to WL31). Nonvolatile memory elements disposed at the same row in the block BLK1 are connected to a common word line corresponding to the row.

In this case, since select transistors S1 and S2 are connected to the nonvolatile memory element M0 to a nonvolatile memory element M31 in series, they may be formed as a set using one semiconductor layer 34. Thus, wiring for connecting the nonvolatile memory elements can be omitted, thereby performing integration. Further, adjacent NAND cells can be easily separated from each other. Further, semiconductor layers 36 of the select transistors S1 and S2 may be formed separately from a semiconductor layer 38 of the NAND cells. At a time of erase operation in which charges are removed from floating gates of the nonvolatile memory elements M0 to M31, the erase operation can be performed in units of the NAND cells. Further, nonvolatile memory elements (for example, in the row of the nonvolatile memory element M30) connected to one common word line may be formed from one semiconductor layer 40.

A writing operation is carried out after the NAND cell NS1 is brought into the erased state, namely the threshold value of each nonvolatile memory element in the NAND cell NS1 is placed in a negative voltage state. Writing is performed in order from a nonvolatile memory element M0 on the source line SL side. Description will be made roughly on the writing operation below using writing into the nonvolatile memory element M0 as an example.

Figure 11A:
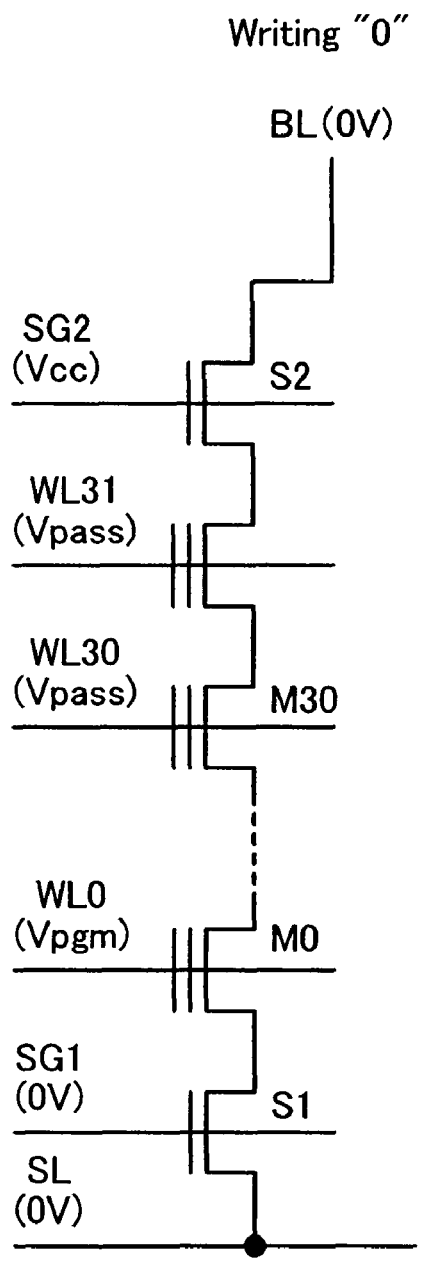
FIGS. 11A and 11B each illustrates a write operation of a NAND type nonvolatile memory.

In the case of writing "0", as shown in FIG. 11A, Vcc (power source voltage) is, for example, applied to a selection gate line SG2 to turn on a selecting transistor S2, and 0 V (ground voltage) is set to a bit line BL0. 0 V is set to a selection gate line SG1 to turn off a selecting transistor S1. Next, a high voltage Vpgm (approximately 20 V) is set to the word line WL0 of a nonvolatile memory element M0 and a midpoint voltage Vpass (approximately 10 V) is set to the other word lines. Since the voltage of the bit line BL0 is 0 V, the potential of the channel formation region of the selected nonvolatile memory element M0 is 0 V. Since the potential difference between the word line WL0 and the channel formation region is large, electrons are injected into the floating gate of the nonvolatile memory element M0 by a F-N tunneling current as described above. In this manner, the state in which the threshold voltage of the nonvolatile memory element M0 is positive (the state in which "0" is written) is obtained.

Figure 11B:
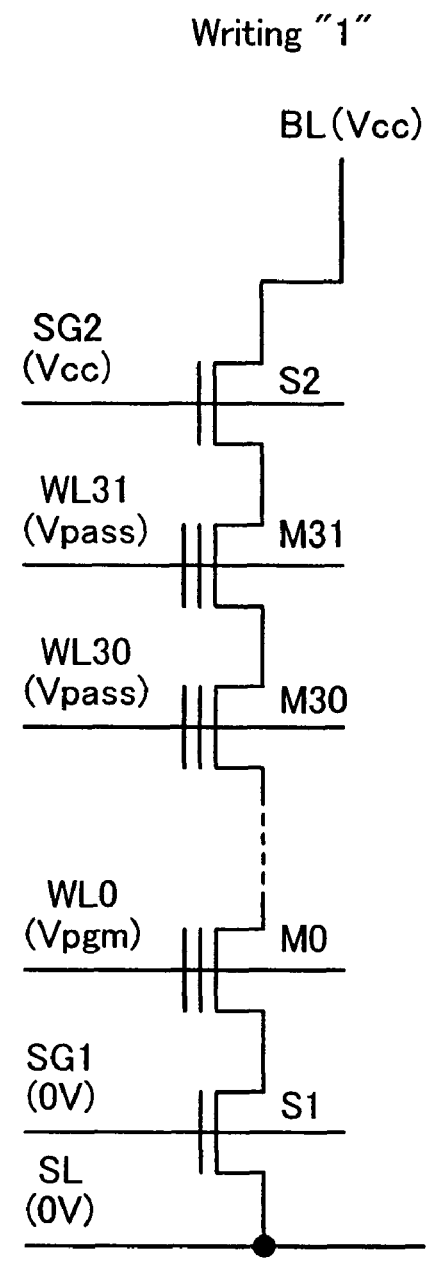

In the case of writing "1", as shown in FIG. 11B, Vcc (power source voltage) is, for example, applied to the bit line BL0. Since the voltage of the selection gate line SG2 is Vcc, the selecting transistor S2 is cut off when the voltage of the channel formation region becomes (Vcc-Vth) with respect to the threshold voltage Vth of the selecting transistor S2. Consequently, the channel formation region of the nonvolatile memory element M0 is brought into a floating state. Next, a high voltage Vpgm (approximately 20 V) is applied to the word line WL0 while a midpoint voltage Vpass (approximately 10 V) is applied to the other word lines, so that the voltage of the channel formation region is increased from (Vcc-Vth) to, for example, approximately 8 V by capacitive coupling between each word line and each channel formation region. Since the voltage of the channel formation region is increased to such a high voltage, the potential difference between the word line WL0 and the channel formation region is small unlike the case of writing "0". Therefore, electron injection by F-N tunneling current does not occur into the floating gate of the nonvolatile memory element M0. In this manner, the state where the threshold voltage of the nonvolatile memory element M0 is negative (the state in which "1" is written) is maintained.

Figure 12A:
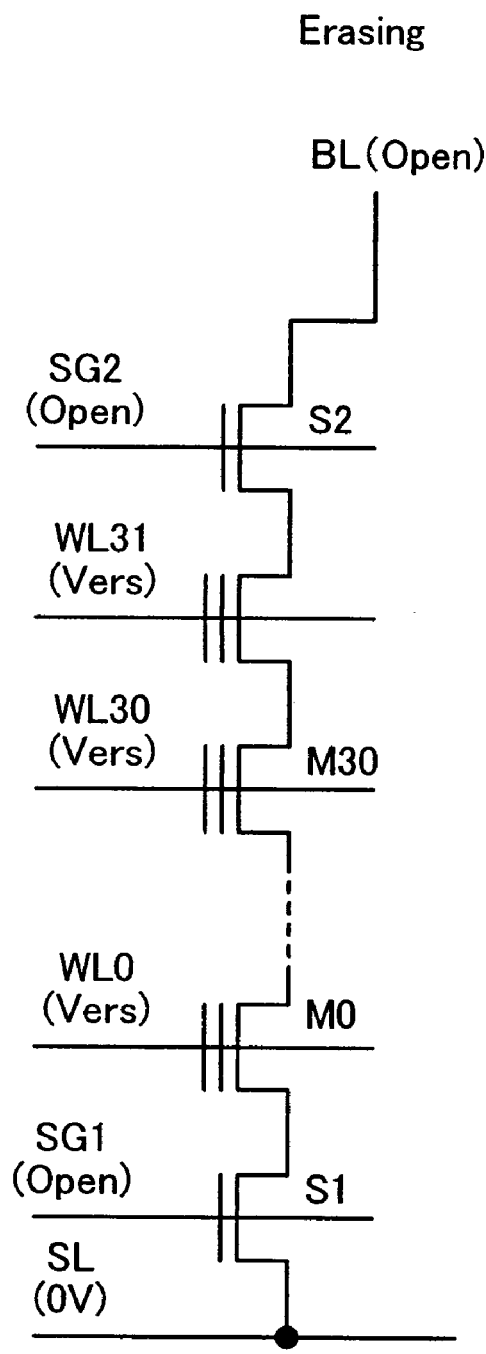
FIGS. 12A and 12B each illustrates erase and read operations of a NAND type nonvolatile memory.
Figure 12B:
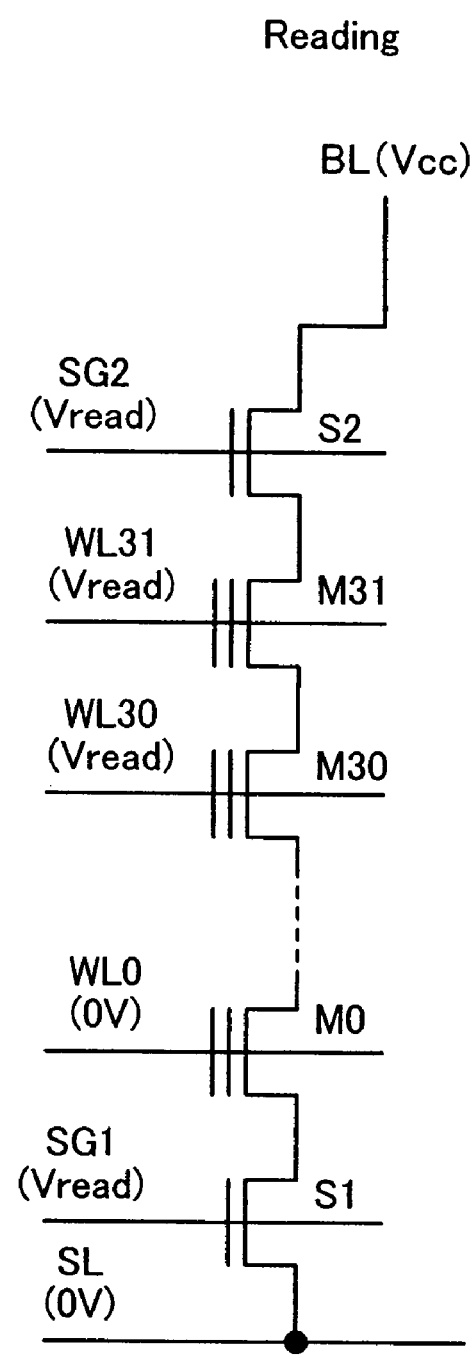

In the case of performing an erasing operation, as shown in FIG. 12A, a negative high voltage (Vers) is applied to all the word lines included in the selected block. The bit line BL and the source line SL are set in a floating state. As a result of this, electrons in the floating gate are discharged into the semiconductor layer by tunneling current in all the memory cells in the block. Consequently, threshold voltage of each memory cells is shifted in the negative direction.

Figure 13:
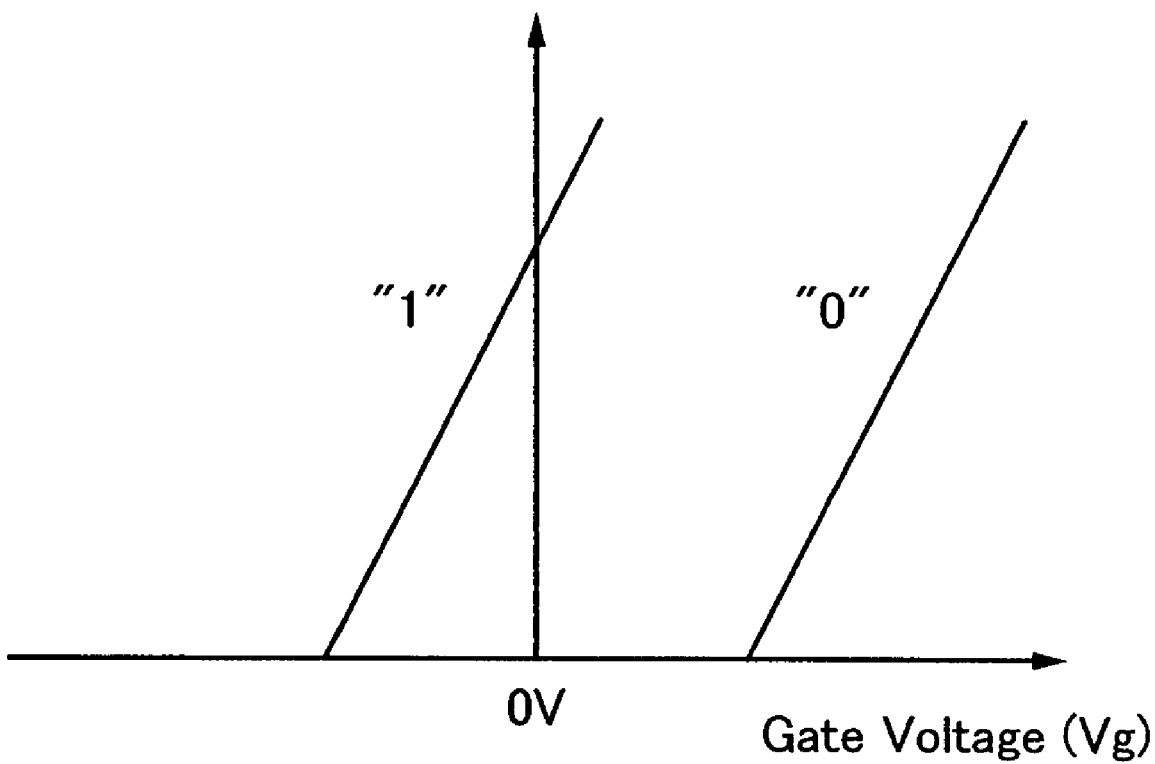
FIG. 13 shows change in the threshold voltage of a nonvolatile memory in the case of "0" where the charges are stored and "1" where the charges are erased.

In a writing operation shown in FG. 12B, a voltage Vr (e.g., 0 V) is set to the word line WL0 of the nonvolatile memory element M0 selected for reading, and a reading midpoint voltage Vread which is a little higher than the power source voltage is set to the word lines WL1 to WL31 of unselected memory cells and the selection gate lines SG1 and SG2. That is, as shown in FIG. 13, the memory elements other than the selected memory element function as transfer transistors. In this way, whether a current flows or not through the nonvolatile memory element M0 selected for reading is detected. That is, in the case where the data stored in a nonvolatile memory element M0 is "0", the bit line BL is not discharged since the nonvolatile memory element M0 is off; whereas in the case where the data stored in the nonvolatile memory element M0 is "1", the bit line BL is discharged since the nonvolatile memory element M0 is on.

Figure 14:
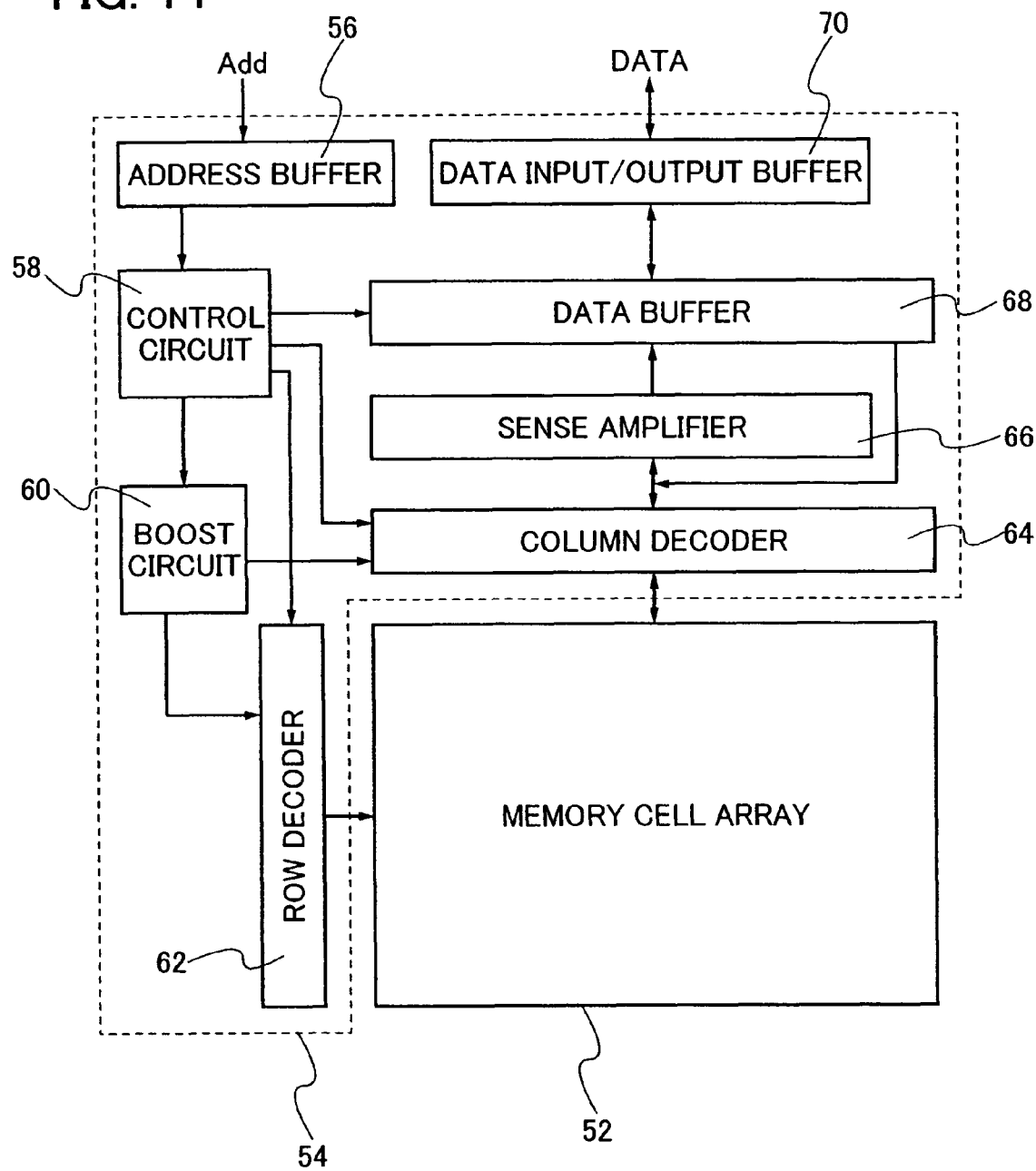
FIG. 14 illustrates an example of a block circuit diagram of a nonvolatile semiconductor memory device.

FIG. 14 is one example of a circuit block diagram of a nonvolatile semiconductor memory device. The nonvolatile semiconductor memory device includes a memory cell array 52 and a peripheral circuitry 54 over the same substrate. The memory cell array 52 has the structure shown in FIG. 8, 9, or 10. A structure of the peripheral circuitry 54 is as follows.

A row decoder 62 for selecting a word line and a column decoder 64 for selecting a bit line are provided in the vicinity of the memory cell array 52. An address is sent to a control circuit 58 through an address buffer 56, and an internal row address signal and an internal column address signal are transferred to the row decoder 62 and the column decoder 64 respectively.

When data is written or erased, a potential obtained by boosting a power source potential is used. For this, a boosting circuit 60 controlled in accordance with an operating mode by the control circuit 58 is provided. Outputs of the boosting circuit 60 are supplied to the word lines WL and the bit lines BL through the row decoder 62 or the column decoder 64. Data outputted from the column decoder 64 is inputted to a sense amplifier 66. Data read from the sense amplifier 66 is stored in a data buffer 68, is accessed in a random manner by control of the control circuit 58, and is outputted through a data input/output buffer 70. Data to be written is stored in the data buffer 68 through the data input/output buffer 70 once, and is transferred to the column decoder 64 by control of the control circuit 58.

Thus, in the nonvolatile semiconductor memory device, it is necessary to use potential that is different from the power source potential in the memory cell array 52. Therefore, at least the memory cell array 52 and the peripheral circuit 54 are desirably electrically isolated from each other. In this case, as in embodiments to be later described, transistors of the nonvolatile memory elements and the peripheral circuit are formed from the semiconductor layer formed on the insulating surface, so that insulation/isolation can easily be performed. Thus, malfunction is reduced and a nonvolatile semiconductor memory device with low power consumption can be obtained.

Embodiments below will describe a nonvolatile semiconductor memory device of the present invention in detail. In each structure of the present invention described below, like portions are denoted by like reference numerals throughout the drawings, and description of them will not be repeated.

Embodiment 1

This embodiment will describe one example of a nonvolatile semiconductor memory device with reference to drawings. A description will be given below of the case where a nonvolatile memory element for forming a memory section is formed at the same time as an elements such as a transistor for forming a logic portion that is provided over the same substrate as the memory section and performs control of the memory section or the like in a nonvolatile semiconductor memory device.

First, an equivalent circuit of a memory section in the nonvolatile semiconductor memory device is shown in FIG. 8.

In the memory section described in this embodiment, a plurality of memory cells each including a selecting transistor and a nonvolatile memory element is provided. In FIG. 8, one memory cell includes a selecting transistor S01 and a nonvolatile memory element M01. Similarly, each memory cell includes a selecting transistor S02 and a nonvolatile memory element M02, a selecting transistor S03 and a nonvolatile memory element M03, a selecting transistor S11 and a nonvolatile memory element M11, a selecting transistor S12 and a nonvolatile memory element M12, or a selecting transistor S13 and a nonvolatile memory element M13.

A gate electrode of the selecting transistor S01 is connected to a word line WL1, one of a source and a drain thereof is connected to a bit line BL0, and the other of the source and the drain is connected to a source or a drain of the nonvolatile memory element M01. A gate electrode of the nonvolatile memory element M01 is connected to a word line WL11, the one of the source and the drain is connected to the source or drain of the selecting transistor S01, and the other of the source and the drain thereof is connected to a source line SL0.

Note that since a driving voltage of the selecting transistor provided in the memory section is higher than that of a transistor provided in a logic portion, gate insulating layers or the like of the transistor provided in the memory section and the transistor provided in the logic portion are preferably formed with different thicknesses. For example, when the driving voltage is low and variations of the threshold voltage are required to be small, a thin film transistor including a gate insulating layer with a small thickness is preferably provided, whereas when the driving voltage is high and a high withstanding capability is required, a thin film transistor including a gate insulating layer with a large thickness is preferably provided.

Therefore, in this embodiment, described will be given of the case where an insulating layer with a small thickness is formed for the transistor in the logic section in which the driving voltage is low and variation in the threshold voltage is required to be small, whereas an insulating layer with a large thickness is formed for the transistor in the memory section where the driving voltage is high and a high withstanding capability is required, with reference to drawings. Note that FIGS. 32 to 34 each show a top view, FIGS. 18A to 21C show cross-sectional views taken along line A-B, line C-D, line E-F, and line G-H in FIGS. 32 to 34, respectively. Further, portions along line A-B and line C-D include thin film transistors formed in the logic section, a portion along line E-F include a nonvolatile memory element formed in the memory section, a portion along line G-H include a thin film transistor formed in the memory section. Further, this embodiment will describe a case where a thin film transistor provided in the portion along line A-B is p-channel type, thin film transistors provided in the portions along line C-D and line G-H are n-channel type, and carrier transfer is performed by electrons in the nonvolatile memory element formed in the portion along line E-F; however, nonvolatile semiconductor devices in accordance with the present invention are not limited thereto.

First, island-shaped semiconductor layers 104, 106, 108, and 110 are formed over a substrate 100 with an insulating layer 102 therebetween, first insulating layers 112, 114, 116, and 118 are formed so as to cover the island-shaped semiconductor layers 104, 106, 108, and 110, respectively. Further, a charge accumulation layer 120 (in this embodiment, a film containing germanium (Ge) as a main component) serving as a floating gate in the nonvolatile memory element is formed so as to cover the first insulating layers 112, 114, 116, and 118 (FIG. 18A). The island-shaped semiconductor layers 104,

106, 108, and 110 can be provided by forming an amorphous semiconductor layer from a material (for example, $Si_xGe_{1-x}$ or the like) containing silicon as a main component, or the like on the insulating layer 102 previously formed over the substrate 100 by sputtering, LPCVD, plasma CVD, or the like; crystallizing the amorphous semiconductor layer and selectively etching it after that. Note that, the amorphous semiconductor layer can be crystallized by a laser crystallization method, a thermal crystallization method using RTA or an annealing furnace, a thermal crystallization method using a metal element promoting crystallization, or a combination of the methods.

Further, when the semiconductor layer is crystallized or recrystallized by laser light irradiation, an LD-pumped continuous wave (CW) laser ($YVO_4$, second harmonic (wavelength: 532 nm)) can be used as a laser light source. The wavelength is not necessarily limited to the second harmonic; however, the second harmonic is superior to other higher harmonics in point of energy efficiency. When a semiconductor layer is irradiated with CW laser light, the semiconductor layer continuously receives energy; therefore, once the semiconductor layer is melted, the melted state can continue. Moreover, it is possible to move a solid-liquid interface of the semiconductor layer by scanning with CW laser light and to form a crystal grain extending in one direction along this moving direction. A solid-state laser is used because its output is so stable that a stable process can be expected as compared with a gas laser or the like. Not only a CW laser but also a pulsed laser with a repetition rate of 10 MHz or more can be used. In a case of using a pulsed laser with high repetition rate, when the pulse interval is shorter than the period after the semiconductor layer is melted and before the melted semiconductor layer is solidified, the semiconductor layer can continuously remaining in a melting state. Then, by moving the solid-liquid interface, the semiconductor layer including a crystal extending in one direction can be formed. Another CW laser or pulsed laser with a repetition rate of 10 MHz or more can also be used. For example, as the gas laser, an Ar laser, a Kr laser, a $CO_2$ laser, or the like is given. As the solid-state laser, a YAG laser, a YLF laser, a $YAlO_3$ laser, a $GdVO_4$ laser, a KGW laser, a KYW laser, an alexandrite laser, a Ti:sapphire laser, a $Y_2O_3$ laser, a $YVO_4$ laser, or the like is given. A YAG laser, a $Y_2O_3$ laser, a $GdVO_4$ laser, a $YVO_4$ laser, and the like are called ceramic lasers. As a metal vapor laser, a helium-cadmium laser or the like is given. Moreover, oscillation of laser light with $TEM_{00}$ (single transverse mode) in a laser oscillator is preferable because the energy homogeneity of a linear beam spot on an irradiation surface can be improved. In addition, a pulsed excimer laser may be used.

As the substrate 100, a glass substrate, a quartz substrate, a metal substrate (such as a stainless steel substrate), a ceramic substrate, or a semiconductor substrate such as a Si substrate can be used. In addition, as a plastic substrate, a substrate formed of polyethylene terephthalate (PET), polyethylene naphthalate (PEN), polyether sulfone (PES), acrylic, or the like can be used.

The insulating layer 102 is formed of an insulating material such as silicon oxide ($SiO_x$), silicon nitride ($SiN_x$), silicon oxynitride ($SiO_xN_y$, (x>y)), or silicon nitride oxide ($SiN_xO_y$, (x>y)) by CVD, sputtering, or the like. For example, in a case where the insulating layer 102 has a two-layer structure, a silicon nitride oxide film may be formed as a first insulating film and a silicon oxynitride film may be formed as a second insulating film. Alternatively, a silicon nitride film may be formed as the first insulating film and a silicon oxide film may be formed as the second insulating film. By forming the insulating layer 102 functioning as a blocking layer in this manner, it is possible to prevent alkaline earth metal or alkali metal such as Na in the substrate 100 from adversely affecting an element to be formed over the insulating layer 102. In cases of using quartz or the like for the substrate 100, the insulating layer 102 can be omitted.

The first insulating layers 112, 114, 116, and 118 can be formed through heat treatment, plasma treatment, or the like performed to the semiconductor layers 104, 106, 108, and 110. For example, oxidation treatment, nitridation treatment, or oxynitridation treatment is performed to the semiconductor layers 104, 106, 108, and 110 by high-density plasma treatment, whereby the first insulating layers 112, 114, 116, and 118 formed using an oxide film, a nitride film, or an oxynitride film are formed over the semiconductor layers 104, 106, 108, and 110, respectively. It is to be noted that the first insulating layers 112, 114, 116, and 118 may also be formed by CVD or sputtering.

For example, in the case where oxidation treatment or nitridation treatment is performed using a semiconductor layer containing silicon as its main component as each of the semiconductor layers 104, 106, 108, and 110 by high-density plasma treatment, a silicon oxide ($SiO_x$) film or a silicon nitride ($SiN_x$) film is formed as each of the first insulating layers 112, 114, 116, and 118. Moreover, after oxidation treatment is performed to the semiconductor layers 104, 106, 108, and 110 by high-density plasma treatment, nitridation treatment may be performed by performing high-density plasma treatment again. In this case, a silicon oxide film is formed to be in contact with each of the semiconductor layers 104, 106, 108, and 110 and a film containing oxygen and nitrogen (hereinafter referred to as an silicon oxynitride film) is formed over the silicon oxide film, whereby a stack of the silicon oxide film and the silicon oxynitride film is formed as each of the first insulating layers 112, 114, 116, and 118.

In this embodiment, the first insulating layers 112, 114, 116, and 118 are each formed to a thickness of from 1 nm to 10 nm, preferably 1 nm to 5 nm. For example, oxidation treatment is performed to the semiconductor layers 104, 106, 108, and 110 by high-density plasma treatment, whereby a silicon oxide film with a thickness of approximately 5 nm is formed over each surface of the semiconductor layers 104, 106, 108, and 110. Thereafter, nitridation treatment is performed by high-density plasma treatment, whereby a silicon oxynitride film with a thickness of approximately 2 nm is formed over the surface of the silicon oxide film. In this case, the silicon oxide film formed over each surface of the semiconductor layers 104, 106, 108, and 110 has a thickness of approximately 3 nm. This is because the thickness of the formed silicon oxynitride film is reduced from the thickness of the silicon oxide film. Moreover, at this time, the oxidation treatment and the nitridation treatment by high-density plasma treatment are preferably performed continuously without exposure to the air. By the high-density plasma treatment continuously performed, prevention of contamination and improvement in production efficiency can be achieved.

In the case where the semiconductor layers are oxidized by high-density plasma treatment, the plasma treatment is performed in an oxygen atmosphere (for example, an atmosphere containing oxygen ($O_2$) or dinitrogen monoxide ($N_2O$) and a rare gas (at least one of He, Ne, Ar, Kr, and Xe), or an atmosphere containing oxygen or dinitrogen monoxide, hydrogen ($H_2$), and a rare gas). On the other hand, in the case where the semiconductor layers are nitrided by high-density plasma treatment, the plasma treatment is performed in a nitrogen atmosphere (for example, an atmosphere containing nitrogen ($N_2$) and a rare gas (at least one of He, Ne, Ar, Kr, and Xe), an atmosphere containing nitrogen, hydrogen, and a rare gas, or an atmosphere containing $NH_3$ and a rare gas).

As the rare gas, Ar can be used, for example. Alternatively, a gas in which Ar and Kr are mixed may also be used. In the case where high-density plasma treatment is performed in a rare gas atmosphere, the first insulating layers 112, 114, 116, and 118 may contain the rare gas (at least one of He, Ne, Ar, Kr, and Xe) used in the plasma treatment. When Ar is used, the first insulating layers 112, 114, 116, and 118 may contain Ar.

Moreover, the high-density plasma treatment is performed in an atmosphere containing the aforementioned gas with an electron density of greater than or equal to $1\times10^{11}$ cm$^{-3}$ and plasma electron temperatures of less than or equal to 1.5 eV. More specifically, the electron density is greater than or equal to $1\times10^{11}$ cm$^{-3}$ and less than or equal to $1\times10^{13}$ cm$^{-3}$, and the plasma electron temperature is greater than or equal to 0.5 eV and less than or equal to 1.5 eV. Since the plasma electron density is high and the electron temperature around an object to be processed that is formed over the substrate 100 (the semiconductor layers 104, 106, 108, and 110 in this embodiment) is low, plasma damage to the object to be processed can be prevented. Moreover, since the plasma electron density is as high as $1\times10^{11}$ cm$^{-3}$ or more, an oxide film or a nitride film formed by oxidizing or nitriding the object to be processed by using the plasma treatment can be dense and superior in uniformity of its thickness and the like compared to a film formed by CVD, sputtering, or the like. Furthermore, since the plasma electron temperature is as low as less than or equal to 1.5 eV, oxidation treatment or nitridation treatment can be performed at a lower temperature than that in the conventional plasma treatment or thermal oxidation method. For example, even plasma treatment at temperatures lower than the distortion point of a glass substrate by 100° C. or more can sufficiently perform oxidation treatment or nitridation treatment. As the frequency for forming plasma, high frequency such as a microwave (for example, 2.45 GHz) can be used.

In this embodiment, when oxidation treatment is performed to the object to be processed by high-density plasma treatment, a mixed gas of oxygen ($O_2$), hydrogen ($H_2$) and argon (Ar) is introduced. Here, as a mixed gas, 0.1 to 100 sccm of oxygen, 0.1 to 100 sccm of hydrogen, and 100 to 5000 sccm of argon may be introduced. The mixed gas is preferably introduced at a ratio of 1:1:100 (oxygen:hydrogen:argon). For example, 5 sccm of oxygen, 5 sccm of hydrogen, and 500 sccm of argon may be introduced.

In addition, when nitridation treatment is performed by high-density plasma treatment, a mixed gas of nitrogen ($N_2$) and argon (Ar) is introduced. As a mixed gas used here, 20 to 2000 sccm of nitrogen and 100 to 10000 sccm of argon may be introduced. For example, 200 sccm of nitrogen and 1000 sccm of argon may be introduced.

In this embodiment, the first insulating layer 116 formed over the semiconductor layer 108 in the memory section functions as a tunnel oxide film in a nonvolatile memory element to be completed later. Therefore, the thinner the first insulating layer 116 is, the more easily the tunneling current flows, which allows a higher-speed operation as a memory. Further, when the first insulating layer 116 is thinner, charges can be accumulated at lower voltage in a floating gate to be formed later; therefore, power consumption of the nonvolatile semiconductor memory device can be reduced. Accordingly, the first insulating layers 112, 114, 116, and 118 are preferably formed thin.

In general, a thermal oxidation method is used as a method for forming a thin insulating layer over a semiconductor layer. However, when a substrate of which the melting point is not sufficiently high, such as a glass substrate, is used as the substrate 100, it is very difficult to form the first insulating layers 112, 114, 116, and 118 by a thermal oxidation method. Moreover, since an insulating layer formed by CVD or sputtering includes defects in the film, there is a problem in that sufficient withstand voltage cannot be obtained, and when the insulating layer is formed thin, the insulating properties are degraded due to a defect such as a pinhole. In addition, an insulating layer formed by CVD or sputtering does not cover edge portions of the semiconductor layer sufficiently, resulting in that a conductive film and the like which will be formed afterwards over the first insulating layer 116 and the semiconductor layer may be in contact with each other to cause leakage. Thus, when the first insulating layers 112, 114, 116, and 118 are formed by the high-density plasma treatment as shown in this embodiment, the first insulating layers 112, 114, 116, and 118 can be denser than an insulating layer formed by CVD, sputtering, or the like. Moreover, the first insulating layers 112, 114, 116, and 118 can sufficiently cover the edge portions of the semiconductor layers 104, 106, 108, and 110, respectively. As a result, operation speed and charge retention characteristics as a memory can be improved. It is to be noted that when the first insulating layers 112, 114, 116, and 118 are formed by CVD or sputtering, preferably, high-density plasma treatment is performed after the insulating layer is formed, whereby the surface of the insulating layer is subjected to oxidation treatment, nitridation treatment, or oxynitridation treatment.

The charge accumulation layer 120 are formed of a film containing germanium, such as germanium (Ge) or a silicon germanium alloy. In this embodiment, the charge accumulation layer 120 is formed using a film containing germanium as its main component with a thickness of from 1 nm to 20 nm, preferably from 5 nm to 10 nm, by plasma CVD in an atmosphere containing a germanium element (for example, $GeH_4$). When the semiconductor layer is formed using a material containing silicon as its main component and the film containing germanium with a smaller energy gap than that of silicon is provided as the charge accumulation layer over the semiconductor layer with the first insulating layer functioning as a tunnel oxide film interposed therebetween in this manner, a second barrier formed by the insulating layer for charges in the charge accumulation layer becomes energetically higher than a first barrier formed by the insulating layer for charges in the semiconductor layer. As a result, charges can be easily injected from the semiconductor layer to the charge accumulation layer, and the charges are prevented from being discharged from the charge accumulation layer. That is, in the case of an operation as a memory, highly efficient writing is possible at low voltage, and moreover, charge retention characteristics can be improved. Further, the charge accumulation layer 120 formed over the semiconductor layer 108 in the memory section functions as a floating gate in a nonvolatile memory element which will be completed afterwards.

Subsequently, the first insulating layers 112, 114, and 118, and the charge accumulation layer 120 formed over the semiconductor layers 104, 106, and 110 are selectively removed, whereas the first insulating layer 116 and the charge accumulation layer 120 formed over the semiconductor layer 108 are left. In this embodiment, the semiconductor layer 108, the first insulating layer 116, and the charge accumulation layer 120 provided in the memory section are selectively covered with a resist, and the first insulating layers 112, 114, and 118, and the charge accumulation layer 120 formed over the semiconductor layers 104, 106, and 110 are selectively removed by etching (see FIG. 18B).

Figure 32:
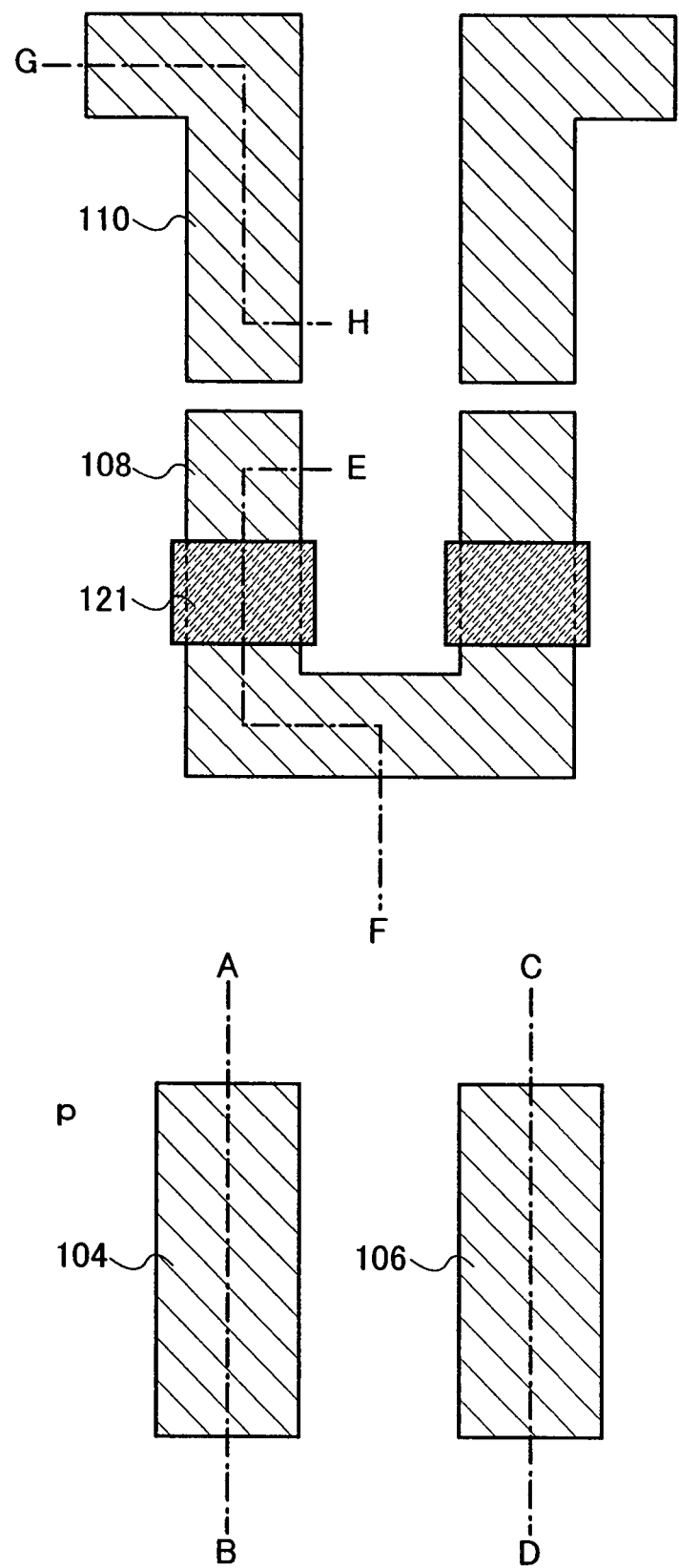
FIG. 32 illustrates an example of a top view of a nonvolatile semiconductor memory device of the present invention.

Next, the semiconductor layers 104, 106, and 110 and part of the charge accumulation layer 120 formed over the semiconductor layer 108 are selectively covered with a resist 122, the charge accumulation layer 120 not covered with the resist 122 are selectively removed by etching, and part of the charge accumulation layer 120 is left, whereby a charge accumulation layer 121 functioning as a floating gate is formed (see FIG. 18C and FIG. 32).

Then, an impurity region is formed in a specific region of the semiconductor layer 110. In this embodiment, after the resist 122 is removed, a resist 124 is formed so as to selectively cover the semiconductor layers 104, 106, and 108 and part of the semiconductor layer 110. Then, an impurity element is introduced to the semiconductor layer 110 not covered with the resist 124, whereby an impurity region 126 is formed (see FIG. 19A). As the impurity element, an impurity element imparting n-type or an impurity element imparting p-type is used. As the impurity element imparting n-type, phosphorus (P), arsenic (As), or the like can be used. As the impurity element imparting p-type, boron (B), aluminum (Al), gallium (Ga), or the like can be used. In this embodiment, as the impurity element, phosphorus (P) is introduced to the semiconductor layer 110.

Subsequently, a second insulating layer 128 is formed so as to cover the semiconductor layers 104, 106, and 110, the first insulating layer 116, and the charge accumulation layer 121 formed over the semiconductor layer 108 (see FIG. 19B).

The second insulating layer 128 is formed by CVD, sputtering, or the like using an insulating material such as silicon oxide, silicon nitride, silicon oxynitride ($SiO_xN_y$, (x>y)), or silicon nitride oxide ($SiN_xO_y$, (x>y)) with a single layer structure or a stacked structure. For example, in the case of the second insulating layer 128 with a single layer structure, a silicon oxynitride film or a silicon nitride oxide film is formed by CVD to a thickness of from 5 nm to 50 nm. In addition, in the case of the second insulating layer 128 with a three-layer structure, a silicon oxynitride film may be formed as a first insulating layer, a silicon nitride film may be formed as a second insulating layer, and a silicon oxynitride film may be formed as a third insulating layer. Alternatively, an oxide or a nitride of germanium may be used as the second insulating layer 128.

It is to be noted that the second insulating layer 128 formed over the semiconductor layer 108 functions as a control insulating layer in a nonvolatile memory element which will be completed afterwards, and the second insulating layer 128 formed over the semiconductor layer 110 functions as a gate insulating film in a transistor which will be completed afterwards.

Subsequently, a resist 130 is selectively formed so as to cover the second insulating layer 128 formed over the semiconductor layers 108 and 110, and the second insulating layer 128 formed over the semiconductor layers 104 and 106 is selectively removed (see FIG. 19C).

Then, third insulating layers 132 and 134 are formed so as to cover the semiconductor layers 104 and 106, respectively (see FIG. 20A).

The third insulating layers 132 and 134 are formed by any of the methods for forming the first insulating layers 112, 114, 116, and 118. For example, oxidation treatment, nitridation treatment, or oxynitridation treatment is performed to the semiconductor layers 104, 106, 108, and 110 by high-density plasma treatment, whereby the third insulating layers 132 and 134 are formed using an oxide film, a nitride film, or an oxynitride film of silicon over the semiconductor layers 104 and 106, respectively.

The third insulating layers 132 and 134 are each formed to a thickness of from 1 nm to 20 nm, preferably greater than or equal to 1 nm and less than or equal to 10 nm. For example, after a silicon oxide film is formed over each surface of the semiconductor layers 104 and 106 by oxidation treatment performed to the semiconductor layers 104 and 106 by high-density plasma treatment, a silicon oxynitride film is formed over the surface of the silicon oxide film by nitridation treatment performed by high-density plasma treatment. In this case, oxidation treatment or nitridation treatment is performed to the surface of the second insulating layer 128 formed over the semiconductor layers 108 and 110, whereby an oxide film or an oxynitride film is formed. The third insulating layers 132 and 134 formed over the semiconductor layers 104 and 106 each function as a gate insulating film in a transistor which will be completed afterwards.

Subsequently, a conductive film is formed so as to cover the third insulating layers 132 and 134 formed over the semiconductor layers 104 and 106, and the second insulating layer 128 formed over the semiconductor layers 108 and 110 (see FIG. 20B). In this embodiment, an example is shown, in which conductive films 136 and 138 are sequentially stacked as the conductive film. Of course, the conductive film may have a single-layer structure or a stacked structure including three or more layers.

The conductive films 136 and 138 can be formed using an element such as tantalum (Ta), tungsten (W), titanium (Ti), molybdenum (Mo), aluminum (Al), copper (Cu), chromium (Cr), or niobium (Nb), or an alloy material or a compound material containing the above element as its main component. In addition, a metal nitride film obtained by nitriding these elements can be used. Besides, a semiconductor material typified by polycrystalline silicon doped with an impurity element such as phosphorus can also be used.

In this embodiment, a stacked structure is provided, in which the conductive film 136 is formed using tantalum nitride and the conductive film 138 is formed using tungsten thereover. Further, a single layer or a stacked layer using tungsten nitride, molybdenum nitride, or titanium nitride can be used as the conductive film 136, and a single layer or a stacked layer using tantalum, molybdenum, or titanium can be used as the conductive film 138.

Figure 33:
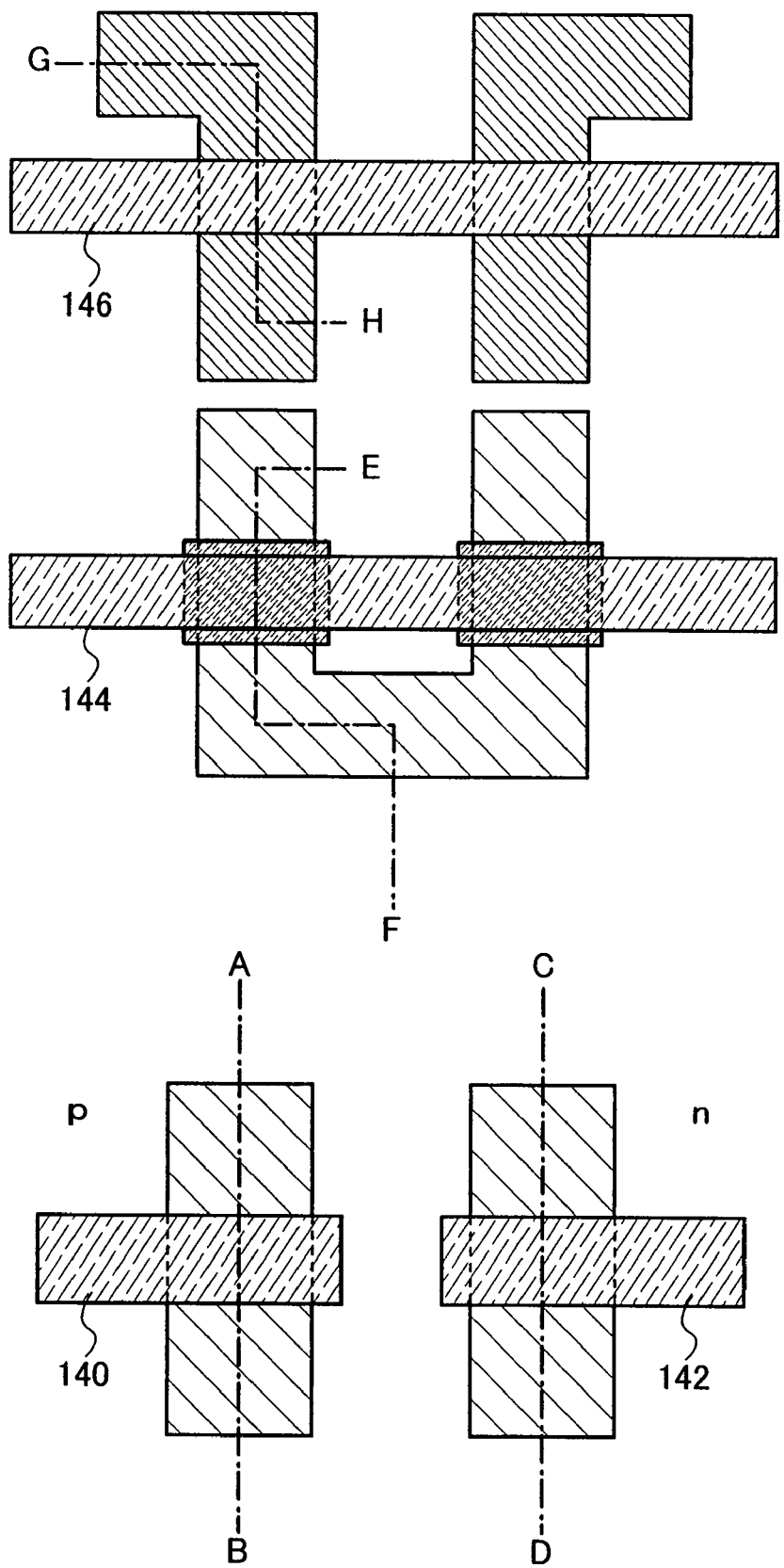
FIG. 33 illustrates an example of a top view of a nonvolatile semiconductor memory device of the present invention.

Next, the stacked conductive films 136 and 138 are selectively removed by etching, and the conductive films 136 and 138 are partially left over the semiconductor layers 104, 106, 108, and 110, whereby conductive films 140, 142, 144, and 146 each functioning as a gate electrode are formed (see FIG. 20C and FIG. 33). It is to be noted that the conductive film 144 formed over the semiconductor layer 108 provided in the memory section functions as a control gate in a nonvolatile memory element which will be completed afterwards. In addition, the conductive films 140, 142, and 146 each function as a gate electrode in a transistor which will be completed afterwards.

Then, a resist 148 is selectively formed so as to cover the semiconductor layer 104. An impurity element is introduced to the semiconductor layers 106, 108, and 110 using the resist 148, and the conductive films 142, 144, and 146 as masks, whereby an impurity region is formed (see FIG. 21A). As the impurity element, an impurity element imparting n-type or an impurity element imparting p-type is used. As the impurity element imparting n-type, phosphorus (P), arsenic (As), or the like can be used. As the impurity element imparting p-type, boron (B), aluminum (Al), gallium (Ga), or the like can be used. In this embodiment, as the impurity element, phosphorus (P) is used.

In FIG. 21A, by introducing the impurity element, an impurity region 152 which forms a source or drain region and a channel forming region 150 are formed in the semiconductor layer 106. In addition, in the semiconductor layer 108, an impurity region 156 which forms a source or drain region, a low-concentration impurity region 158 which forms an LDD region, and a channel forming region 154 are formed. Moreover, in the semiconductor layer 110, an impurity region 162 which forms a source or drain region, a low-concentration impurity region 164 which forms an LDD region, and a channel forming region 160 are formed.

In FIG. 21A, the introduced impurity element passes through the charge accumulation layer 121 functioning as a floating gate, whereby the low-concentration impurity region 158 is formed in the semiconductor layer 108. Therefore, in the semiconductor layer 108, the channel forming region 154 is formed in a region which overlaps with both the conductive film 144 and the charge accumulation layer 121, the low-concentration impurity region 158 is formed in a region which overlaps with the charge accumulation layer 121 and which does not overlap with the conductive film 144, and the high-concentration impurity region 156 is formed in a region which overlaps with neither the conductive film 144 nor the charge accumulation layer 121.

Subsequently, a resist 166 is selectively formed so as to cover the semiconductor layers 106, 108, and 110. An impurity element is introduced to the semiconductor layer 104 using the resist 166 and the conductive film 140 as masks, whereby an impurity region is formed (see FIG. 21B). As the impurity element, an impurity element imparting n-type or an impurity element imparting p-type is used. As the impurity element imparting n-type, phosphorus (P), arsenic (As), or the like can be used. As the impurity element imparting p-type, boron (B), aluminum (Al), gallium (Ga), or the like can be used. In this embodiment, an impurity element having a different conductivity type from that of the impurity element introduced to the semiconductor layers 106, 108, and 110 in FIG. 21A (such as boron (B)) is used. As a result, in the semiconductor layer 104, an impurity region 170 which forms a source or drain region and a channel forming region 168 are formed.

Next, an insulating layer 172 is formed so as to cover the second insulating layer 128, the third insulating layers 132 and 134, and the conductive films 140, 142, 144, and 146. Over the insulating layer 172, a conductive film 174 is formed so as to be electrically connected to the impurity regions 170, 152, 156, and 162 which are formed in the semiconductor layers 104, 106, 108, and 110, respectively (see FIG. 21C and FIG. 34).

The insulating layer 172 is formed by CVD, sputtering, or the like using an insulating layer containing oxygen or nitrogen such as silicon oxide ($SiO_x$), silicon nitride ($SiN_x$), silicon oxynitride ($SiO_xN_y$, (x>y)), or silicon nitride oxide ($SiN_xO_y$, (x>y)), a film containing carbon such as DLC (diamond like carbon), an organic material such as epoxy, polyimide, polyamide, polyvinyl phenol, benzocyclobutene, or acrylic, or a siloxane material such as a siloxane resin with a single layer structure or a stacked structure. The siloxane material is a material including a Si—O—Si bond. Siloxane has a skeleton structure formed of a bond of silicon (Si) and oxygen (O). As a substituent, an organic group containing at least hydrogen (for example, an alkyl group or aromatic hydrocarbon) is used. Alternatively, a fluoro group may be used as a substituent. In addition, as a substituent, both a fluoro group and an organic group containing at least hydrogen may also be used.

The conductive film 174 is formed by CVD, sputtering, or the like using an element such as aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing the above element as its main component with a single layer structure or a stacked structure. An alloy material containing aluminum as its main component corresponds to, for example, an alloy material containing nickel, whose main component is aluminum, or an alloy material containing nickel and one or both of carbon and silicon, whose main component is aluminum. The conductive film 174 preferably employs, for example, a stacked structure of a barrier film, an aluminum-silicon (Al—Si) film, and a barrier film, or a stacked structure of a barrier film, an aluminum-silicon (Al—Si) film, a titanium nitride (TiN) film, and a barrier film. It is to be noted that the barrier film corresponds to a thin film formed using titanium, a nitride of titanium, molybdenum, or a nitride of molybdenum. Aluminum and aluminum silicon which have the low resistance and are inexpensive are optimal materials for forming the conductive film 174. In addition, generation of a hillock of aluminum or aluminum silicon can be prevented when upper and lower barrier layers are provided. Further, when the barrier film is formed using titanium that is a highly reducible element, even if a thin natural oxide film is formed on the crystalline semiconductor layer, the natural oxide film is reduced so that preferable contact with the crystalline semiconductor layer can be obtained.

In this embodiment, the charge accumulation layer 121 functioning as a floating gate in the nonvolatile memory element is formed so as to extend beyond the end portions of the semiconductor layer 108 (see FIG. 32). Therefore, the charge accumulation layer 121 functioning as a floating gate is formed over the end portions of the semiconductor layer 108 provided as island-shape semiconductor layers with the first insulating layer 116 functioning as a tunnel insulating layer therebetween. Accordingly, in the end portions of the semiconductor layer 108, characteristics of the nonvolatile memory element are concerned to be adversely affected due to a coverage defect of the first insulating layer 116 or charges accumulated in the manufacturing process. Therefore, in the above described structure, an impurity region 194 may be selectively provided in a region which overlaps with the charge accumulation layer 121 and the neighborhood in the edge of the semiconductor layer 108 (see FIG. 35).

The impurity region 194 is provided so as to have a different conductivity type from that of the impurity region 156 functioning as a source or drain region in the semiconductor layer 108. For example, when the impurity region 156 is provided so as to have n-type conductivity, the impurity region 194 is provided so as to have p-type conductivity.

Figure 35:
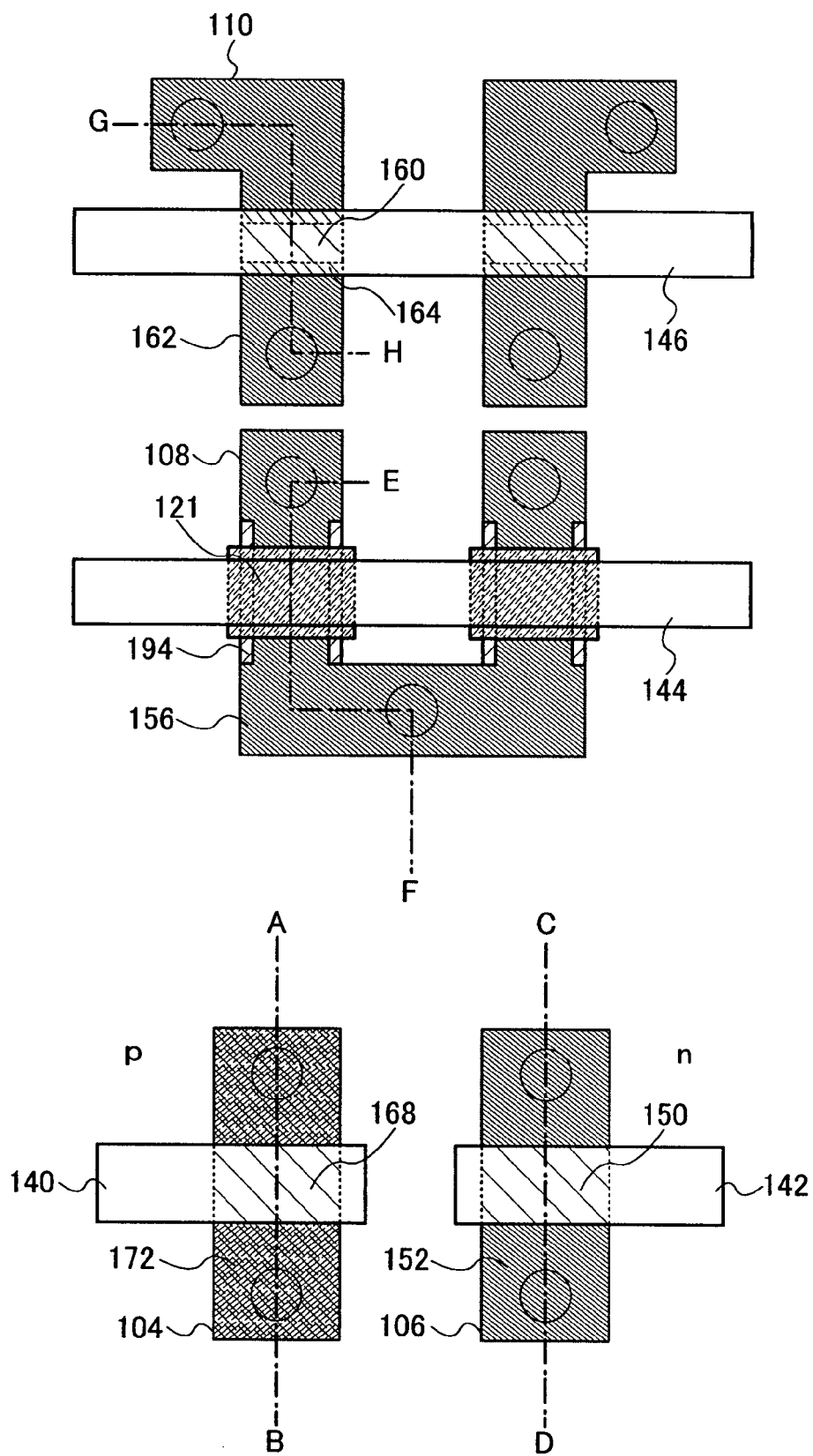
FIG. 35 illustrates an example of a top view of a nonvolatile semiconductor memory device of the present invention.

In addition, FIG. 35 shows an example in which the impurity region 194 is provided in a region at an edge of the semiconductor layer 108, which overlaps with the charge accumulation layer 121 and in the vicinity thereof; however, the present invention is not limited thereto. For example, the impurity region 194 may be provided either only in the region at an edge of the semiconductor layer 108, which overlaps with the charge accumulation layer 121, or in all the peripheral portions of the edge of the semiconductor layer 108. Alternatively, for example, the impurity region 194 may be provided around the region at the edge of the semiconductor layer 108 which overlaps with the charge accumulation layer 121 and would not be provided below the charge accumulation layer 121 (see FIG. 36).

In such a manner, by providing the impurity region 194, resistance is enhanced due to a p-n junction in a portion where the impurity regions 156 and 194 are adjacent. Accordingly, characteristics of the nonvolatile memory element are prevented from being adversely affected due to a coverage defect of the first insulating layer 116 and charges and the like accumulated in the manufacturing process in the edge of the semiconductor layer 108.

Figure 36:
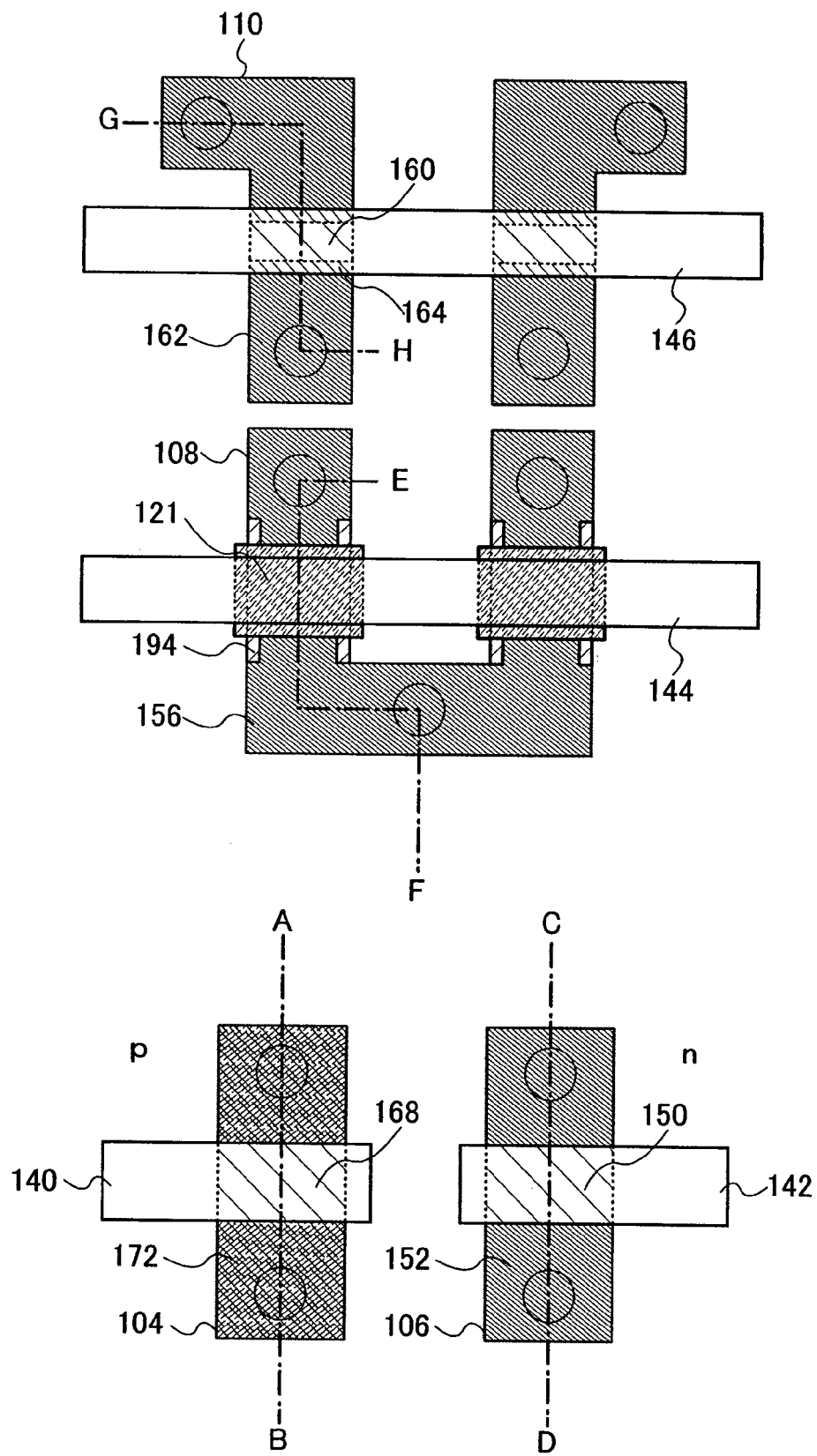
FIG. 36 illustrates an example of a top view of a nonvolatile semiconductor memory device of the present invention.

In this embodiment, the nonvolatile memory element in E-F is explained. However, the impurity region 194 may also be similarly provided in the transistors provided in A-B, C-D, and G-H as shown in FIGS. 35 and 36.

In the nonvolatile semiconductor memory device of this embodiment, low power consumption can be achieved by varying the thickness of an insulating layer of a transistor in accordance with a configuration of a circuit. In addition, a stable operation of the nonvolatile semiconductor memory device can be achieved. Specifically, by formation of a thin gate insulating layer for a transistor included in a logic section, variation in threshold voltage can be reduced, and the memory device can be driven at low voltage. By formation of a thick gate insulating layer for a selection transistor included in a memory section, stability of an operation can be enhanced even when higher voltage than that in the logic section is employed in writing and erasing operations in the nonvolatile memory element. In the nonvolatile memory element, charges can be easily injected from a semiconductor layer to the floating gate electrode, and the charges can be prevented from being discharged from the floating gate electrode. In other words, in the case of an operation as a memory, writing can be performed highly efficiently at low voltage, and charge retention characteristics can be improved. According to this embodiment, a nonvolatile semiconductor memory device which has excellent effect as described above can be manufactured in sequential steps.

This embodiment can be implemented in combination with any of the embodiment mode or the other embodiments shown in this specification.

Embodiment 2

Figure 37:
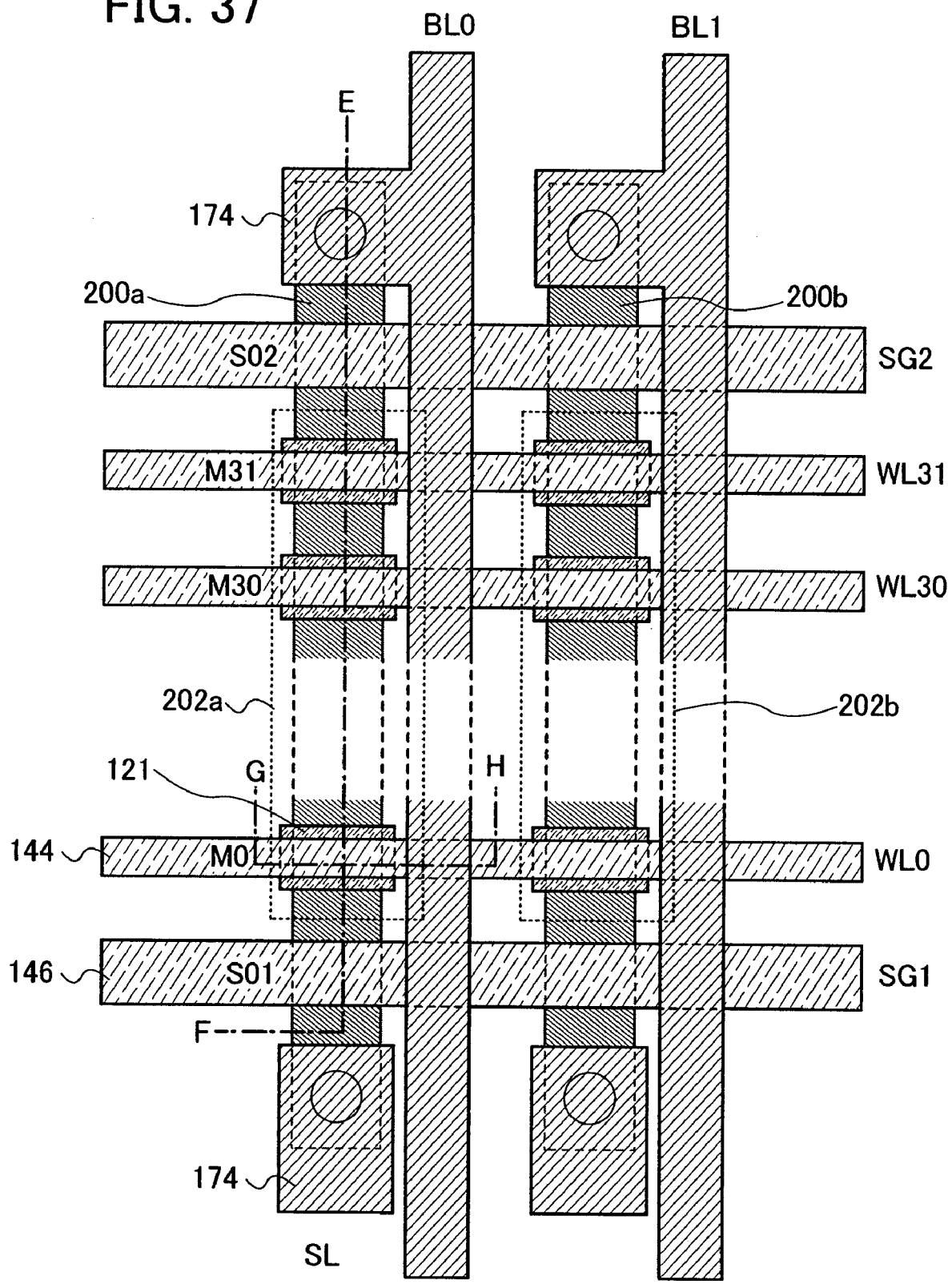
FIG. 37 illustrates an example of a nonvolatile semiconductor memory device of the present invention.
Figure 38A:
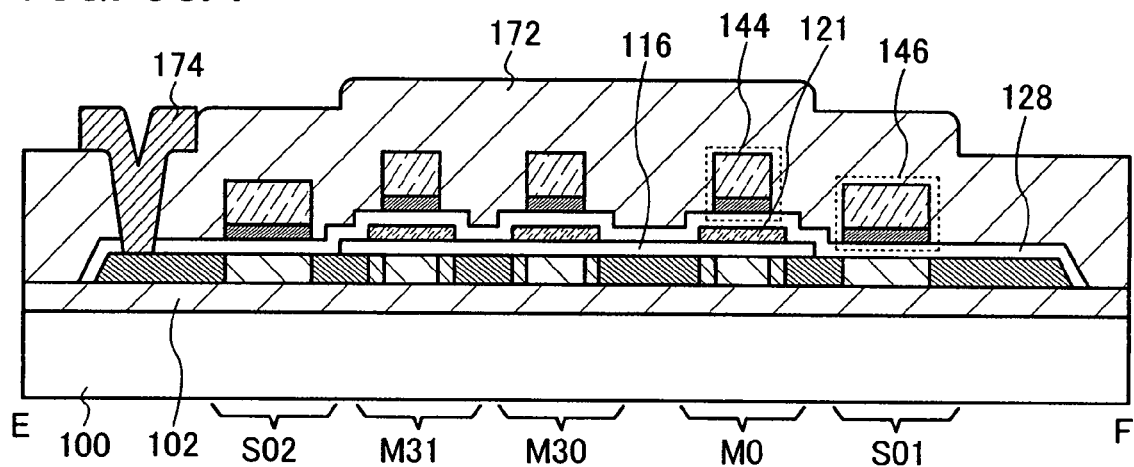
FIGS. 38A and 38B illustrate examples of a nonvolatile semiconductor memory device of the present invention.
Figure 38B:
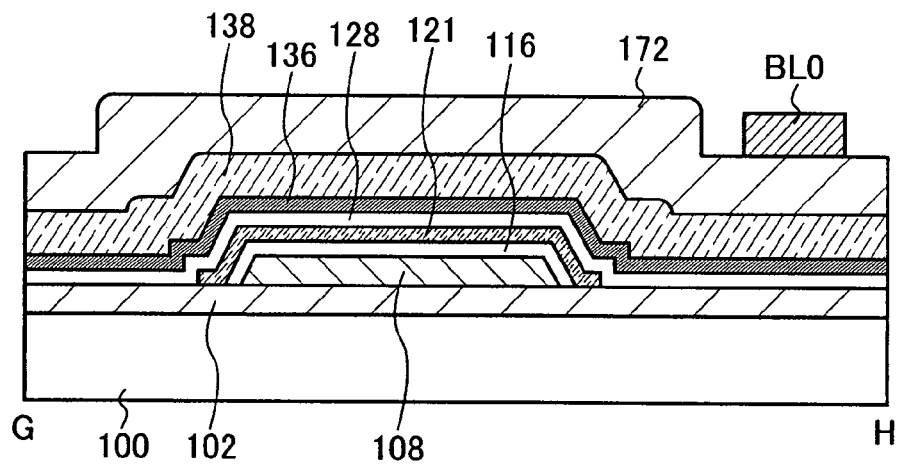

This embodiment will explain the case where a plurality of nonvolatile memory elements are provided on one island-shaped semiconductor layer in the structure shown in Embodiment 1, with reference to the drawings. It is to be noted that the same portions as those in the above embodiment are denoted by the same reference numerals, and explanation thereof will be omitted. FIG. 37 shows a top-view, and FIGS. 38A and 38B show cross-sectional views taken along line E-F and line G-H in FIG. 37.

The nonvolatile semiconductor memory device described in this embodiment includes island-shaped semiconductor layers 200a and 200b electrically connected to bit lines BL0 and BL1, respectively. Each of the island-shaped semiconductor layers 200a and 200b is provided with a plurality of nonvolatile memory elements (see FIGS. 37, and 38A and 38B). Specifically, over the semiconductor layer 200a, a NAND cell 202a including a plurality of nonvolatile memory elements M0 to M31 is provided between selection transistors S01 and S02. Further, over the semiconductor layer 200b, a NAND cell 202b including a plurality of nonvolatile memory elements is provided between selection transistors. In addition, by the semiconductor layers 200a and 200b which are separately provided, the adjacent NAND cells 202a and 202b can be insulated and isolated.

When a plurality of nonvolatile memory elements are provided on one island-shaped semiconductor layer, more integration of the nonvolatile memory elements becomes possible, whereby a large-capacity nonvolatile semiconductor memory device can be formed.

In this embodiment, by formation of a thick gate insulating layer in a selection transistor of a NAND cell as in Embodiment 1, stability of an operation can be enhanced even when higher voltage than that in a logic section is employed in writing and erasing operations in the nonvolatile memory element. In the nonvolatile memory element, charges can be easily injected from a semiconductor layer to a floating gate electrode, and charges can be prevented from being discharged from the floating gate electrode. With such a structure, stability of an operation of the nonvolatile semiconductor memory device according to this embodiment can be achieved.

This embodiment can be implemented in combination with any of the embodiment mode or the other embodiments shown in this specification.

Embodiment 3

This embodiment will explain a manufacturing method of a nonvolatile semiconductor memory device which is different from one in Embodiment 1 with reference to the drawings. It is to be noted that the same portions as those in the above embodiment are denoted by the same reference numerals, and explanation thereof will be omitted. In FIGS. 22A to 24B, portions along line A-B and line C-D each includes a thin film transistor provided in a logic section, a portion along line E-F includes a nonvolatile memory element provided in a memory section, and a portion along line G-H includes a thin film transistor provided in the memory section.

First, the structure shown in FIG. 18C is prepared in the like manner. Thereafter, the resist 122 is removed, and a second insulating layer 128 is formed so as to cover semiconductor layers 104, 106, and 110, and a first insulating layer 116 and a charge accumulation layer 121 functioning as a floating gate formed over a semiconductor layer 108 (see FIG. 22A).

Then, a resist 130 is selectively formed so as to cover the second insulating layer 128 formed over the semiconductor layers 108 and 110, and the second insulating layer 128 formed over the semiconductor layers 104 and 106 is selectively removed (see FIG. 22B).

Then, third insulating layers 132 and 134 are formed so as to cover the semiconductor layers 104 and 106, respectively (see FIG. 22C).

A conductive film is formed so as to cover the third insulating layers 132 and 134 formed over the semiconductor layers 104 and 106, and the second insulating layer 128 formed over the semiconductor layers 108 and 110 (see FIG. 23A). In this embodiment, as the conductive film, an example is shown, in which conductive films 136 and 138 are sequentially stacked. Of course, the conductive film may have a single layer structure or a stacked structure including three or more layers.

Subsequently, the stacked conductive films 136 and 138 are selectively removed by etching, and the conductive films 136 and 138 are partially left over the semiconductor layers 104, 106, 108, and 110, whereby conductive films 140, 142, 144, and 146 each functioning as a gate electrode are formed (see FIG. 23B). It is to be noted that the conductive film 140 includes conductive films 182a and 184a which are provided by stacking the left conductive films 136 and 138. In addition, in this embodiment, the width (the width in a direction almost parallel to a direction in which carriers flow in a channel forming region (a direction connecting a source region and a drain region)) of the lower conductive film 182a is made larger than that of the conductive film 184a in the conductive film 140. Similarly, a conductive film 182b and a conductive film 184b having the narrower width than that of the conductive film 182b are sequentially stacked in the conductive film 142, a conductive film 182c and a conductive film 184c having the narrower width than that of the conductive film 182c are sequentially stacked in the conductive film 144, and a conductive film 182d and a conductive film 184d having the narrower width than that of the conductive film 182d are sequentially stacked in the conductive film 146.

Next, a resist 148 is selectively formed so as to cover the semiconductor layer 104, and an impurity element is introduced to the semiconductor layers 106, 108, and 110 using the resist 148 and the conductive films 142, 144, and 146 as masks, whereby an impurity region is formed (see FIG. 23C). As the impurity element, an impurity element imparting n-type or an impurity element imparting p-type is used. As the impurity element imparting n-type, phosphorus (P), arsenic (As), or the like can be used. As the impurity element imparting p-type, boron (B), aluminum (Al), gallium (Ga), or the like can be used. In this embodiment, as the impurity element, phosphorus (P) is used.

In FIG. 23C, by introducing the impurity element, a high-concentration impurity region 152 which forms a source or drain region, a low-concentration impurity region 186 which forms an LDD region, and a channel forming region 150 are formed in the semiconductor layer 106. In addition, in the semiconductor layer 108, an impurity region 156 which forms a source or drain region, a low-concentration impurity region 158 which forms an LDD region, and a channel forming region 154 are formed. Further, in the semiconductor layer 110, a high-concentration impurity region 162 which forms a source or drain region, a low-concentration impurity region 164 which forms an LDD region, and a channel forming region 160 are formed.

In FIG. 23C, the introduced impurity element passes through the conductive film 182b, whereby the low-concentration impurity region 186 is formed in the semiconductor layer 106. Therefore, in the semiconductor layer 106, the channel forming region 150 is formed in a region which overlaps with both the conductive films 182b and 184b, the low-concentration impurity region 186 is formed in a region which overlaps with the conductive film 182b and which does not overlap with the conductive film 184b, and the high-concentration impurity region 152 is formed in a region which overlaps with neither the conductive film 182b nor 184b.

In FIG. 23C, the introduced impurity element passes through the charge accumulation layer 121, whereby the low-concentration impurity region 158 is formed in the semiconductor layer 108. Therefore, in the semiconductor layer 108, the channel forming region 154 is formed in a region which overlaps with both the conductive film 182c and the charge accumulation layer 121, the low-concentration impurity region 158 is formed in a region which overlaps with the charge accumulation layer 121 and which does not overlap with the conductive film 182c, and the high-concentration impurity region 156 is formed in a region which overlaps with neither the charge accumulation layer 121 nor the conductive film 182c. It is to be noted that when the conductive film 182c is formed thin, a low-concentration impurity region having a concentration that is similar to or lower than that of the low-concentration impurity region 158 may be formed in a region which overlaps with both the conductive film 182c and the charge accumulation layer 121 and which does not overlap with the conductive film 184c in the semiconductor layer 108.

In FIG. 23C, the introduced impurity element passes through the conductive film 182d, whereby the low-concentration impurity region 164 is formed in the semiconductor layer 110. Therefore, in the semiconductor layer 110, the channel forming region 160 is formed in a region which overlaps with both the conductive films 182d and 184d, the low-concentration impurity region 164 is formed in a region which overlaps with the conductive film 182d and which does not overlap with the conductive film 184d, and the high-concentration impurity region 162 is formed in a region which overlaps with neither the conductive film 182d nor 184d.

Subsequently, a resist 166 is selectively formed so as to cover the semiconductor layers 106, 108, and 110. An impurity element is introduced to the semiconductor layer 104 using the resist 166 and the conductive film 140 as masks, whereby an impurity region is formed (see FIG. 24A). As the impurity element, an impurity element imparting n-type or an impurity element imparting p-type is used. As the impurity element imparting n-type, phosphorus (P), arsenic (As), or the like can be used. As the impurity element imparting p-type, boron (B), aluminum (Al), gallium (Ga), or the like can be used. In this embodiment, an impurity element having a different conductivity type from that of the impurity element introduced to the semiconductor layers 106, 108, and 110 in FIG. 23C (such as boron (B)) is used. As a result, in the semiconductor layer 104, a high-concentration impurity region 170 which forms a source or drain region, a low-concentration impurity region 188 which forms an LDD region, and a channel forming region 168 are formed.

In FIG. 23C, the introduced impurity element passes through the conductive film 182a, whereby the low-concentration impurity region 188 is formed in the semiconductor layer 104. Therefore, in the semiconductor layer 104, the channel forming region 168 is formed in a region which overlaps with both the conductive films 182a and 184a, the low-concentration impurity region 188 is formed in a region which overlaps with the conductive film 182a and which does not overlap with the conductive film 184a, and the high-concentration impurity region 170 is formed in a region which overlaps with neither the conductive film 182a nor 184a.

Then, an insulating layer 172 is formed so as to cover the second insulating layer 128, the third insulating layers 132 and 134, and the conductive films 140, 142, 144, and 146. Over the insulating layer 172, a conductive film 174 is formed so as to be electrically connected to the impurity regions 170, 152, 156, and 162 which are formed in the semiconductor layers 104, 106, 108, and 110, respectively (see FIG. 24B).

It is to be noted that the impurity region 194 may be provided also in the structure shown in this embodiment as shown in FIGS. 35 and 36.

In the nonvolatile semiconductor memory device of this embodiment, low power consumption can be achieved by varying the thickness of an insulating layer of a transistor in accordance with a configuration of a circuit. In addition, a stable operation of the nonvolatile semiconductor memory device can be achieved. Specifically, by formation of a thin gate insulating layer for a transistor included in a logic section, variation in threshold voltage can be reduced, and the memory device can be driven at low voltage. By formation of a thick gate insulating layer for a selection transistor included in a memory section, stability of an operation can be enhanced even when higher voltage than that in the logic section is employed in writing and erasing operations in the nonvolatile memory element. In the nonvolatile memory element, charges can be easily injected from a semiconductor layer to a floating gate electrode, and the charges can be prevented from being discharged from the floating gate electrode. In other words, in the case of an operation as a memory, writing can be performed highly efficiently at low voltage, and charge retention characteristics can be improved. According to this embodiment, a nonvolatile semiconductor memory device which has excellent effect as described above can be manufactured in sequential steps.

This embodiment can be implemented in combination with any of the embodiment mode or the other embodiments shown in this specification.

Embodiment 4

Figure 39:
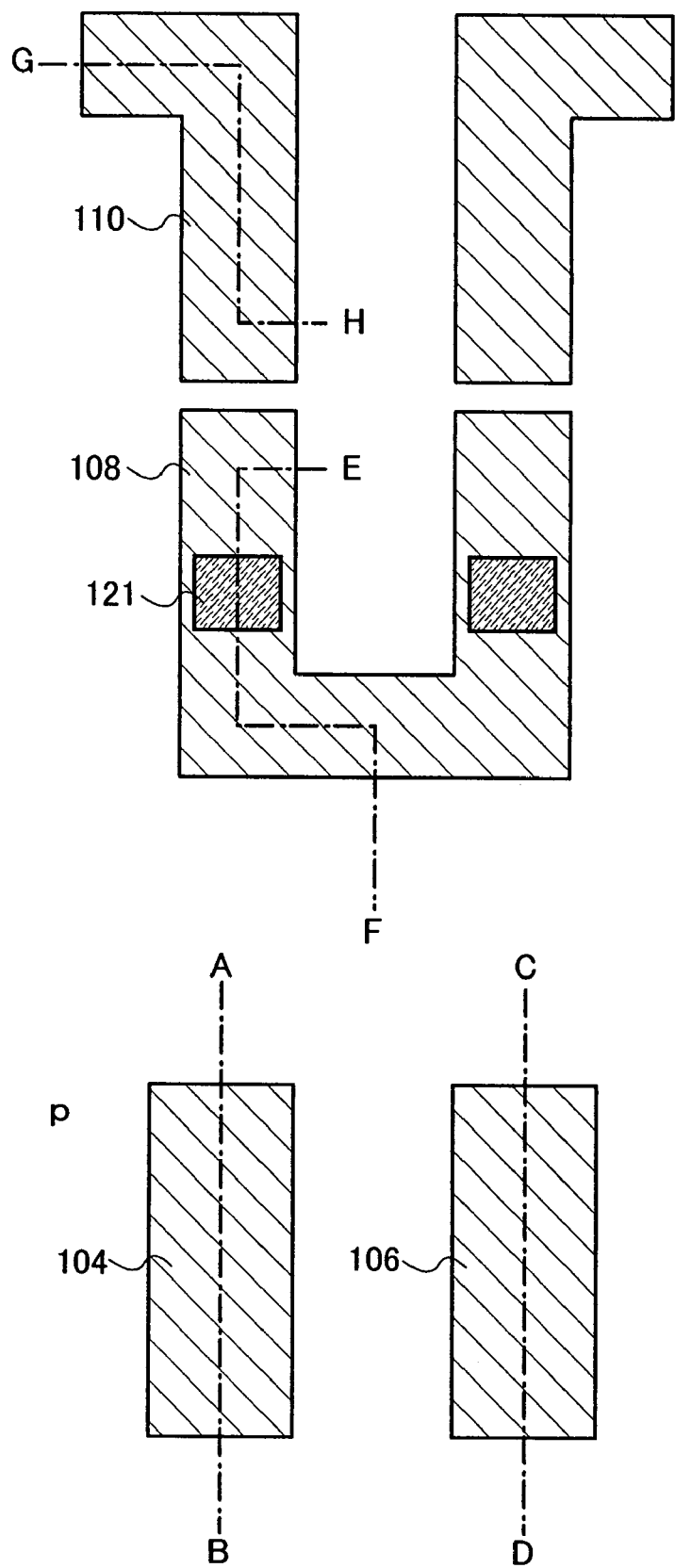
FIG. 39 illustrates an example of a top view of a nonvolatile semiconductor memory device of the present invention.
Figure 40:
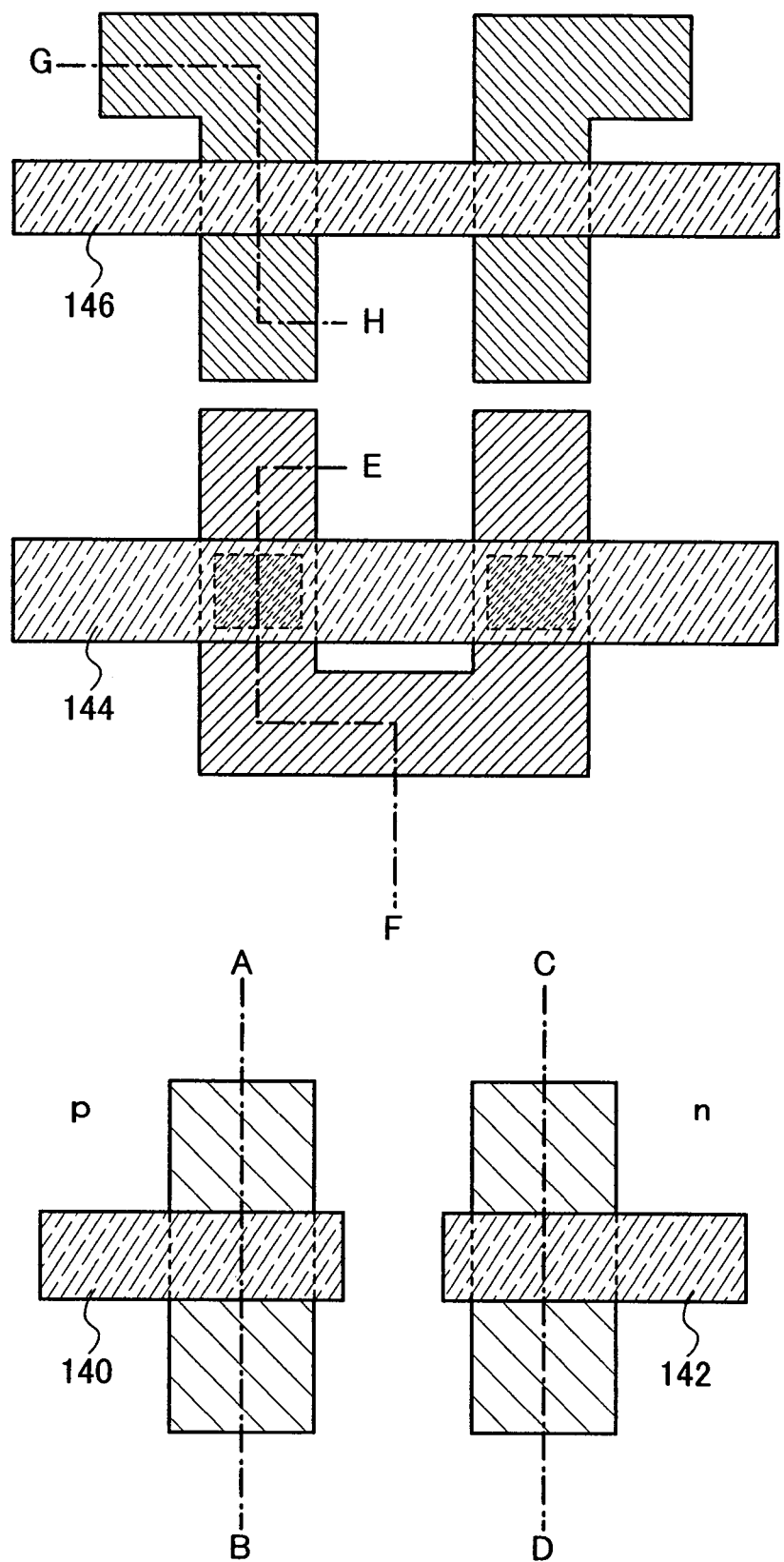
FIG. 40 illustrates an example of a top view of a nonvolatile semiconductor memory device of the present invention.
Figure 41:
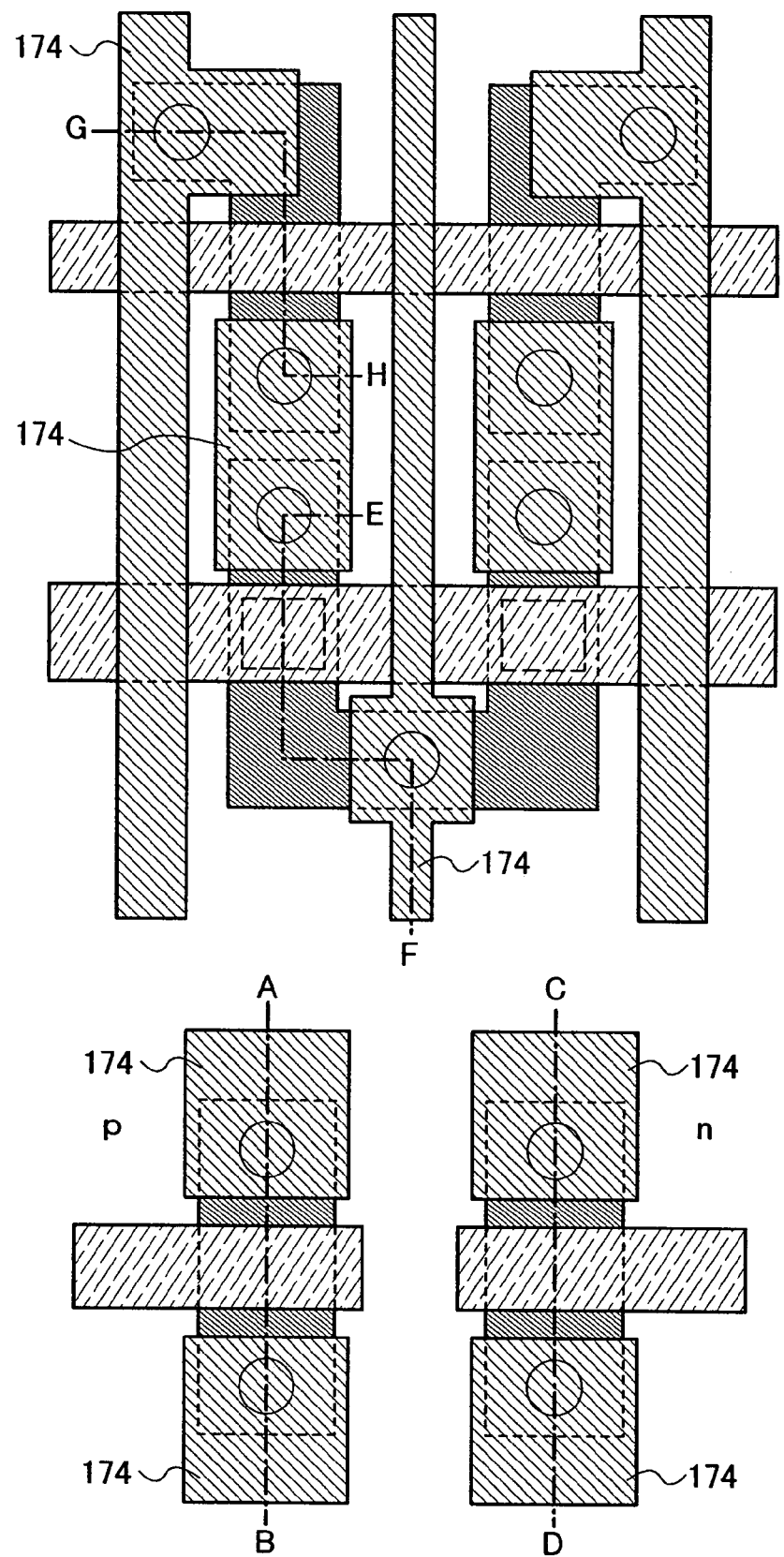
FIG. 41 illustrates an example of a top view of a nonvolatile semiconductor memory device of the present invention.

This embodiment will explain a manufacturing method of a nonvolatile semiconductor memory device which is different from one in the above embodiment with reference to drawings. It is to be noted that the same portions as those in the above embodiment are denoted by the same reference numerals, and explanation thereof will be omitted. FIGS. 39 to 41 show top views, and FIGS. 28A to 30C show cross-sectional views taken along lines A-B, C-D, E-F, and G-H in FIGS. 39 to 41. In the drawings, portions along lines A-B and C-D each includes a thin film transistor provided in a logic section, a portion along line E-F includes a nonvolatile memory element provided in a memory section, and a portion along line G-H includes a thin film transistor provided in the memory section.

First, the structure shown in FIG. 18C is prepared in the like manner. Thereafter, an impurity element is introduced to a semiconductor layer 108 using a resist 122 as a mask, whereby an impurity region 190 is formed (see FIG. 28A). As the impurity element, an impurity element imparting n-type or an impurity element imparting p-type is used. As the impurity element imparting n-type, phosphorus (P), arsenic (As), or the like can be used. As the impurity element imparting p-type, boron (B), aluminum (Al), gallium (Ga), or the like can be used. In this embodiment, as the impurity element, phosphorus (P) is introduced to the semiconductor layer 108. It is to be noted that, in this embodiment, the width of a charge accumulation layer 121 functioning as a floating gate is made smaller than that of the semiconductor layer 108. In other words, the charge accumulation layer 121 is provided so as not to extend beyond the semiconductor layer 108 (so that the charge accumulation layer 121 always overlaps with the semiconductor layer 108) (see FIG. 39).

Subsequently, a second insulating layer 128 is formed so as to cover semiconductor layers 104, 106, and 110, and a first insulating layer 116 and the charge accumulation layer 121 formed over the semiconductor layer 108 (see FIG. 28B).

Next, a resist 130 is selectively formed so as to cover the second insulating layer 128 formed over the semiconductor layers 108 and 110, and the second insulating layer 128 formed over the semiconductor layers 104 and 106 is selectively removed (see FIG. 28C).

Next, third insulating layers 132 and 134 are formed to cover the semiconductor layers 104 and 106, respectively (See FIG. 29A).

A conductive film is formed so as to cover the third insulating layers 132 and 134 formed over the semiconductor layers 104 and 106, and the second insulating layer 128 formed over the semiconductor layers 108 and 110 (see FIG. 29B). In this embodiment, as the conductive film, an example is shown, in which conductive films 136 and 138 are sequentially stacked. Of course, the conductive film may have a single layer structure or a stacked structure including three or more layers.

Subsequently, the stacked conductive films 136 and 138 are selectively removed by etching, and the conductive films 136 and 138 are partially left over the semiconductor layers 104, 106, 108, and 110, whereby conductive films 140, 142, 144, and 146 each functioning as a gate electrode are formed (see FIG. 29C and FIG. 40).

It is to be noted, in this embodiment, the width (the width in a direction almost parallel to a direction in which carriers flow in a channel) of the conductive film 144 formed over the semiconductor layer 108 is made larger than that of the charge accumulation layer 121.

Next, a resist 148 is selectively formed so as to cover the semiconductor layer 104, and an impurity element is introduced to the semiconductor layers 106, 108, and 110 using the resist 148 and the conductive films 142, 144, and 146 as masks, whereby an impurity region is formed (see FIG. 30A). As the impurity element, an impurity element imparting n-type or an impurity element imparting p-type is used. As the impurity element imparting n-type, phosphorus (P), arsenic (As), or the like can be used. As the impurity element imparting p-type, boron (B), aluminum (Al), gallium (Ga), or the like can be used. In this embodiment, as the impurity element, phosphorus (P) is used.

In FIG. 30A, by introducing the impurity element, a high-concentration impurity region 152 which forms a source or drain region and a channel forming region 150 are formed in the semiconductor layer 106. In addition, in the semiconductor layer 108, an impurity region 156 which forms a source or drain region, a low-concentration impurity region 158 which forms an LDD region, and a channel forming region 154 are formed. Further, in the semiconductor layer 110, a high-concentration impurity region 162 which forms a source or drain region and a channel forming region 160 are formed.

Subsequently, a resist 166 is selectively formed so as to cover the semiconductor layers 106, 108, and 110. An impurity element is introduced to the semiconductor layer 104 using the resist 166 and the conductive film 140 as masks, whereby an impurity region is formed (see FIG. 30B). As the impurity element, an impurity element imparting n-type or an impurity element imparting p-type is used. As the impurity element imparting n-type, phosphorus (P), arsenic (As), or the like can be used. As the impurity element imparting p-type, boron (B), aluminum (Al), gallium (Ga), or the like can be used. In this embodiment, an impurity element having a different conductivity type from that of the impurity element introduced to the semiconductor layers 106, 108, and 110 in FIG. 30A (such as boron (B)) is used. As a result, in the semiconductor layer 104, a high-concentration impurity region 170 which forms a source or drain region and a channel forming region 168 are formed.

Next, an insulating layer 172 is formed so as to cover the second insulating layer 128, the third insulating layers 132 and 134, and the conductive films 140, 142, 144, and 146. Over the insulating layer 172, a conductive film 174 is formed so as to be electrically connected to the impurity regions 170, 152, 156, and 162 which are formed in the semiconductor layers 104, 106, 108, and 110, respectively (see FIGS. 30C and 41).

In this embodiment, the width of the charge accumulation layer 121 is made smaller than that of the semiconductor layer 108 (see FIG. 40). An edge of the charge accumulation layer 121 is formed over the semiconductor layer 108, and the conductive film 144 functioning as a control gate is formed so as to extend beyond the edge of the semiconductor layer 108. Therefore, characteristics of the nonvolatile memory element are concerned to be adversely affected when the edge of the charge accumulation layer 121 is formed into an uneven shape by etching or the like in the manufacturing process. In addition, in the edge of the semiconductor layer 108, characteristics of the nonvolatile memory element are concerned to be adversely affected due to a coverage defect of the insulating layer or charges accumulated in the manufacturing process. Thus, in the above described structure, an impurity region 194 may be selectively provided in a region of the semiconductor layer 108, which overlaps with the edge of the charge accumulation layer 121 (in this embodiment, the edge of the charge accumulation layer 121 in a direction almost perpendicular to a direction in which carriers flow in a channel forming region (a direction connecting a source region and a drain region)) and the neighborhood (see FIG. 42).

The impurity region 194 is provided so as to have a different conductivity type from that of the impurity region 156 functioning as a source or drain region in the semiconductor layer 108. For example, when the impurity region 156 is provided so as to have n-type conductivity, the impurity region 194 is provided so as to have p-type conductivity.

Figure 42:
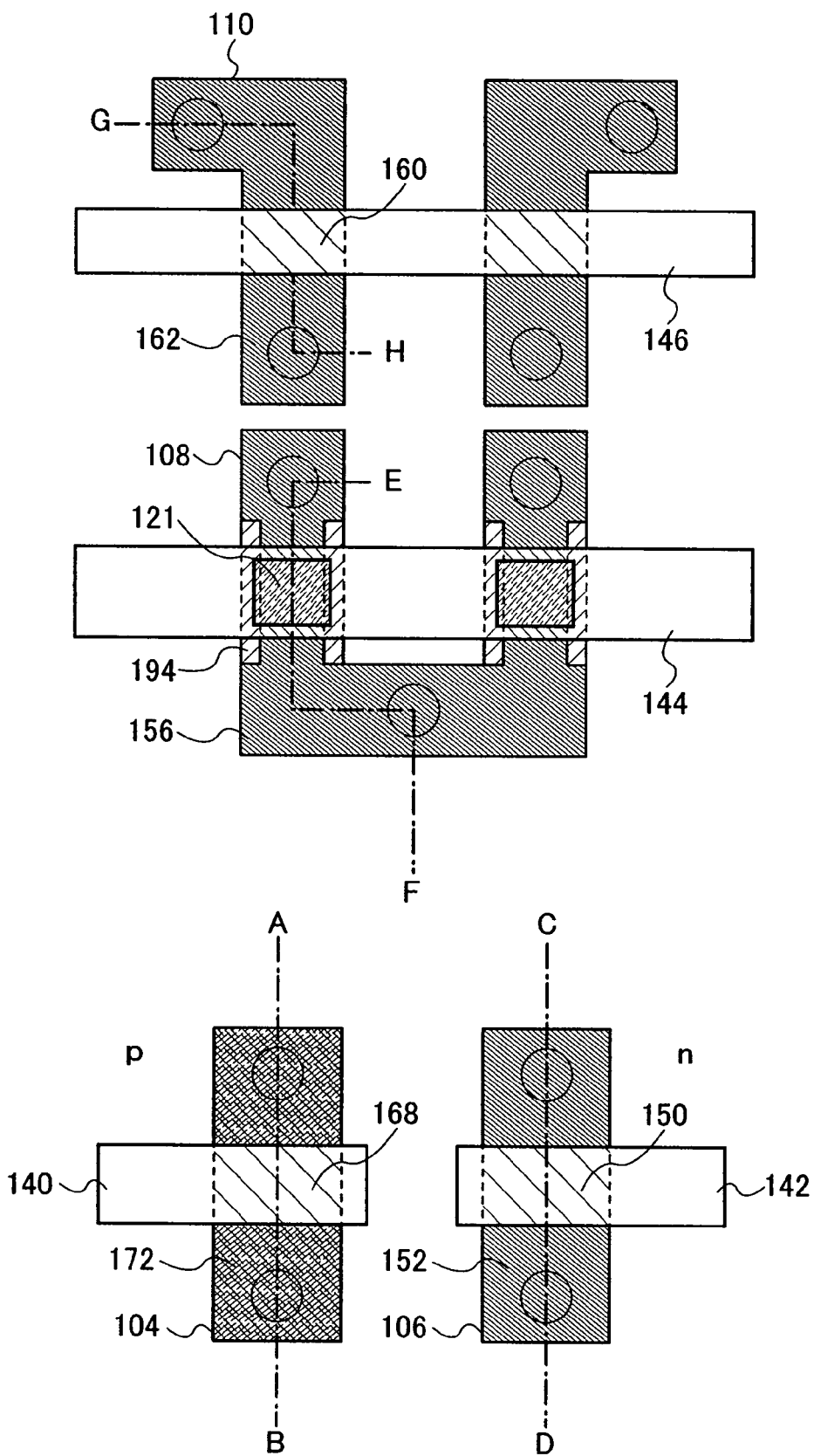
FIG. 42 illustrates an example of a top view of a nonvolatile semiconductor memory device of the present invention.

In FIG. 42, the impurity region 194 is formed so as to extend to a region which does not overlap with the conductive film 144; however, the impurity region 194 may also be formed only in a region which overlaps with the conductive film 144. In addition, the impurity region 194 may be provided in all the peripheral portions of the semiconductor layer 108.

In such a manner, by providing the impurity region 194, resistance is enhanced due to a p-n junction in a portion where the impurity regions 156 and 194 are adjacent. Accordingly, characteristics of the nonvolatile memory element are prevented from being adversely affected due to a shape or the like of the edge of the charge accumulation layer 121.

In this embodiment, the nonvolatile memory element in the portion along line E-F has been explained. However, the impurity region 194 may also be provided similarly in the transistors provided in the portions along lines A-B, C-D, and G-H as shown in FIGS. 35 to 42.

In the nonvolatile semiconductor memory device of this embodiment, low power consumption can be achieved by varying the thickness of an insulating layer of a transistor in accordance with a configuration of a circuit. In addition, a stable operation of the nonvolatile semiconductor memory device can be achieved. Specifically, by formation of a thin gate insulating layer for a transistor included in a logic section, variation in threshold voltage can be reduced, and the memory device can be driven at low voltage. By formation of a thick gate insulating layer for a selection transistor included in a memory section, stability of an operation can be enhanced even when higher voltage than that in the logic section is employed in writing and erasing operations in the nonvolatile memory element. In the nonvolatile memory element, charges can be easily injected from a semiconductor layer to the floating gate electrode, and the charges can be prevented from being discharged from the floating gate electrode. In other words, in the case of an operation as a memory, writing can be performed highly efficiently at low voltage, and charge retention characteristics can be improved. According to this embodiment, a nonvolatile semiconductor memory device which has excellent effect as described above can be manufactured in sequential steps.

This embodiment can be implemented in combination with any of the embodiment mode or the other embodiments shown in this specification.

Embodiment 5

Figure 43:
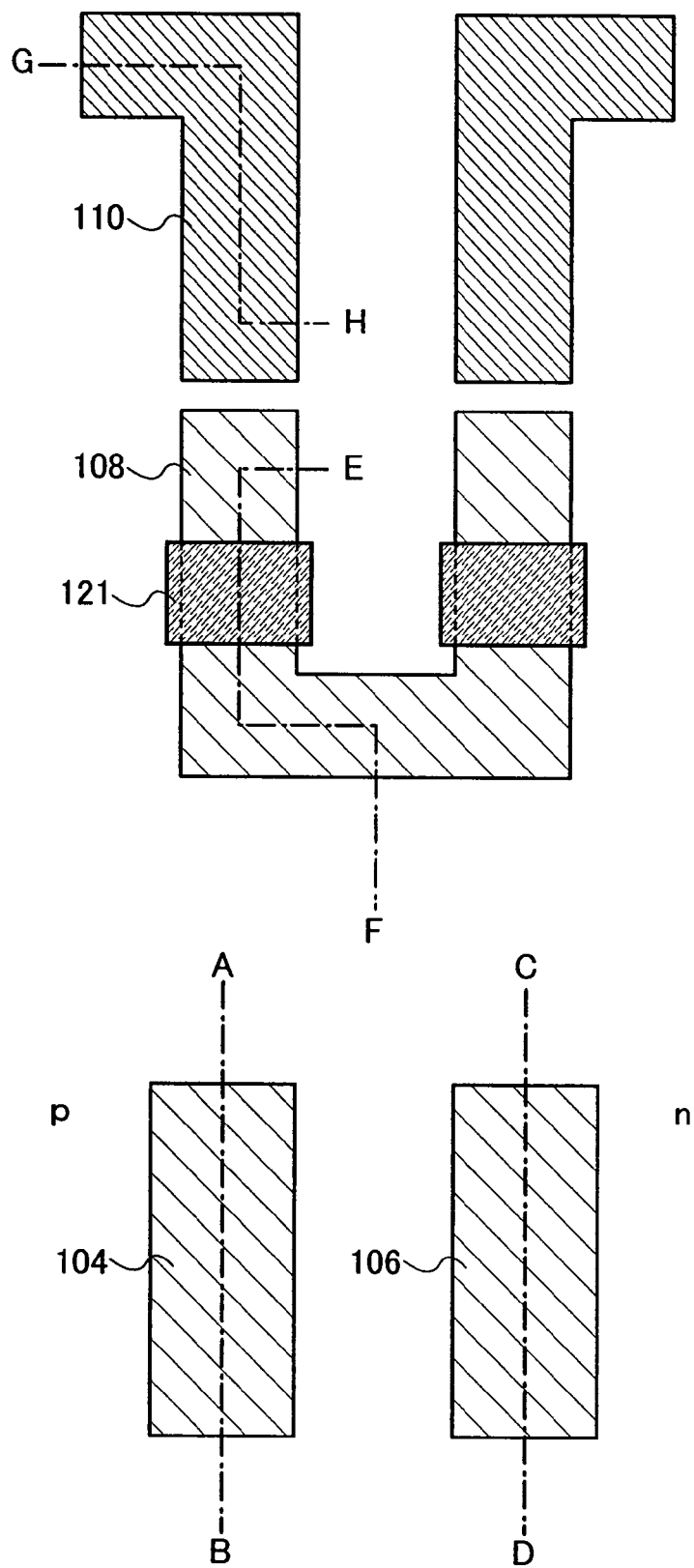
FIG. 43 illustrates an example of a top view of a nonvolatile semiconductor memory device of the present invention.
Figure 44:
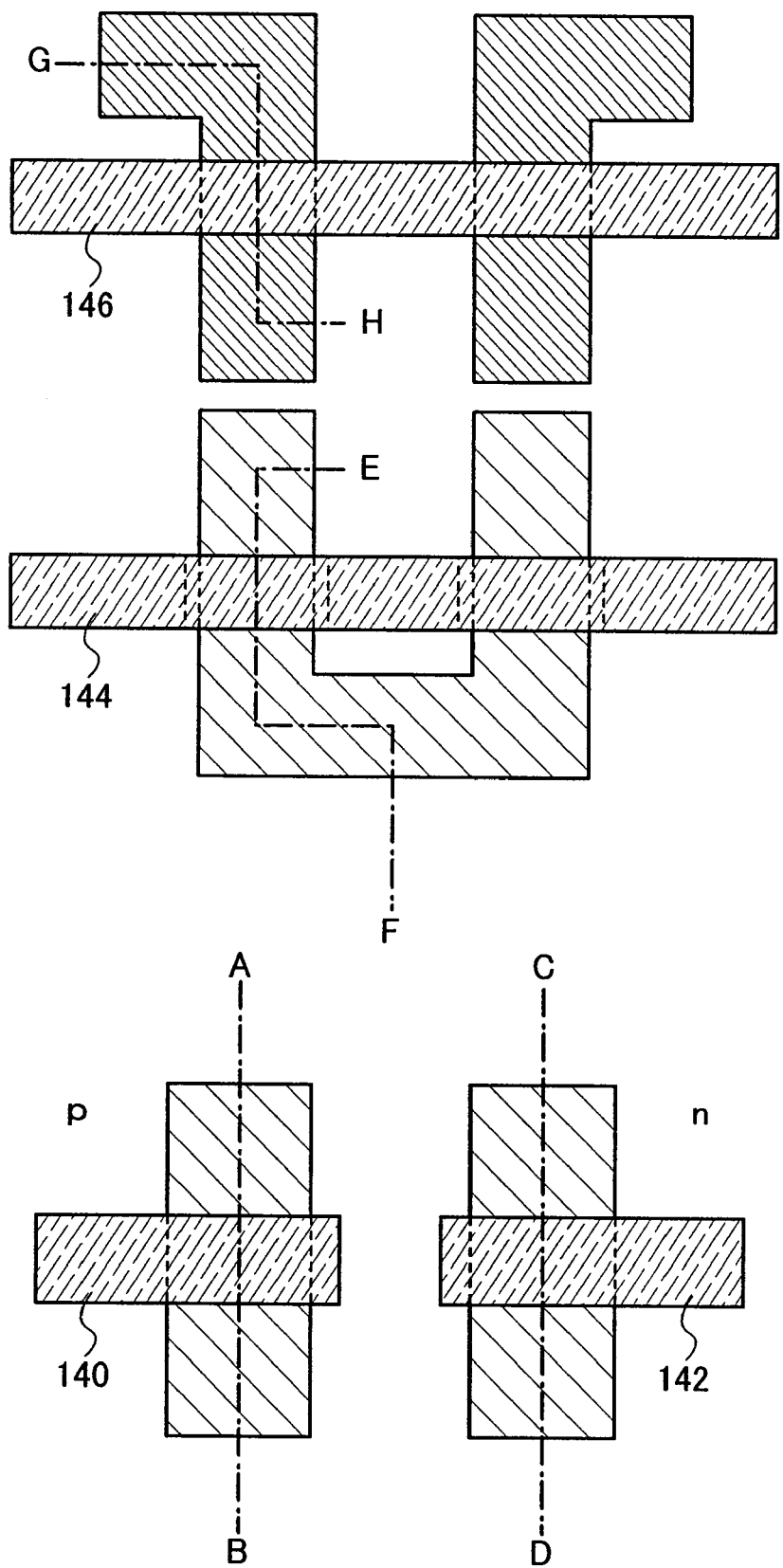
FIG. 44 illustrates an example of a top view of a nonvolatile semiconductor memory device of the present invention.

This embodiment will explain a manufacturing method of a semiconductor device which is different from ones in the above embodiments with reference to the drawings. It is to be noted that the same portions as those in the above embodiments are denoted by the same reference numerals, and explanation thereof will be omitted. FIGS. 43 to 45 show top views, and FIGS. 25A to 25C, 26A to 26C, and 27A to 27C show cross-sectional views taken along lines A-B, C-D, E-F, and G-H in FIGS. 43 to 45. In the drawings, portions along lines A-B and C-D each includes a thin film transistor provided in a logic section, a portion along line E-F includes a nonvolatile memory element provided in a memory section, and a portion along line G-H includes a thin film transistor provided in the memory section.

First, the structure shown in FIG. 18B is prepared in the like manner. Thereafter, as shown in FIG. 19A, a resist is formed so as to selectively cover semiconductor layers 104, 106, and 108, and part of a semiconductor layer 110, and an impurity element is introduced to the semiconductor layer 110 which is not covered with the resist, whereby an impurity region 126 is formed. Then, the resist is removed, and a second insulating layer 128 is formed so as to cover the semiconductor layers 104, 106, and 110, and a first insulating layer 116 and a charge accumulation layer 120 formed over the semiconductor layer 108 (see FIG. 25A and FIG. 43).

Next, a resist 130 is selectively formed so as to cover the second insulating layer 128 formed over the semiconductor layers 108 and 110, whereby the second insulating layer 128 formed over the semiconductor layers 104 and 106 is selectively removed (see FIG. 25B).

Then, third insulating layers 132 and 134 are formed so as to cover the semiconductor layers 104 and 106, respectively (see FIG. 25C).

A conductive film is formed so as to cover the third insulating layers 132 and 134 formed over the semiconductor layers 104 and 106, and the second insulating layer 128 formed over the semiconductor layers 108 and 110 (see FIG. 26A). In this embodiment, as the conductive film, an example is shown, in which conductive films 136 and 138 are sequentially stacked. Of course, the conductive film may also have a single layer structure or a stacked structure including three or more layers.

Subsequently, the stacked conductive films 136 and 138 are selectively removed by etching, and the conductive films 136 and 138 are partially left over the semiconductor layers 104, 106, 108, and 110, whereby conductive films 140, 142, 144, and 146 each functioning as a gate electrode are formed (see FIG. 26B and FIG. 43). In addition, in this embodiment, the surfaces of parts of the semiconductor layers 104, 106, 108, and 110 which do not overlap with the conductive films 140, 142, 144, and 146 are exposed.

Specifically, in the semiconductor layer 104, a portion of the third insulating layer 132 formed below the conductive film 140, which does not overlap with the conductive film 140, is selectively removed so that the edges of the conductive film 140 and the third insulating layer 132 are almost in alignment. In addition, in the semiconductor layer 106, a portion of the third insulating layer 134 formed below the conductive film 142, which does not overlap with the conductive film 142, is selectively removed so that the edges of the conductive film 142 and the third insulating layer 134 are almost in alignment. In addition, in the semiconductor layer 108, portions of the second insulating layer 128, a charge accumulation layer 120, and the first insulating layer 116 formed below the conductive film 144, which do not overlap with the conductive film 144, are selectively removed so that the edges of the conductive film 144, the second insulating layer 128, a charge accumulation layer 121 functioning as a floating gate, and the first insulating layer 116 are almost in alignment. In addition, in the semiconductor layer 110, a portion of the second insulating layer 128 formed below the conductive film 146, which does not overlap with the conductive film 146, is selectively removed so that the edges of the conductive film 146 and the second insulating layer 128 are almost in alignment (see FIG. 44).

In this case, an insulating layer and the like in a portion which does not overlap with the conductive films 140, 142, 144, and 146 may be removed at the same time as formation of the conductive films 140, 142, 144, and 146. Alternatively, after the conductive films 140, 142, 144, and 146 are formed, an insulating layer and the like in a portion which does not overlap with the conductive films 140, 142, 144, and 146 may be removed using the left resist or the conductive films 140, 142, 144, and 146 as masks.

Then, a resist 148 is selectively formed so as to cover the semiconductor layer 104. An impurity element is introduced to the semiconductor layers 106, 108, and 110 using the resist 148, and the conductive films 142, 144, and 146 as masks, whereby an impurity region is formed (see FIG. 26C). As the impurity element, an impurity element imparting n-type or an impurity element imparting p-type is used. As the impurity element imparting n-type, phosphorus (P), arsenic (As), or the like can be used. As the impurity element imparting p-type, boron (B), aluminum (Al), gallium (Ga), or the like can be used. In this embodiment, as the impurity element, phosphorus (P) is used.

In FIG. 26C, by introducing the impurity element, an impurity region 152 which forms a source or drain region and a channel forming region 150 are formed in the semiconductor layer 106. In addition, in the semiconductor layer 108, an impurity region 156 which forms a source or drain region and a channel forming region 154 are formed. Further, in the semiconductor layer 110, a high-concentration impurity region 162 which forms a source or drain region, a low-concentration impurity region 164 which forms an LDD region, and a channel forming region 160 are formed.

Then, a resist 166 is selectively formed so as to cover the semiconductor layers 106, 108, and 110. An impurity element is introduced to the semiconductor layer 104 using the resist 166 and the conductive film 140 as masks, whereby an impurity region is formed (see FIG. 27A). As the impurity element, an impurity element imparting n-type or an impurity element imparting p-type is used. As the impurity element imparting n-type, phosphorus (P), arsenic (As), or the like can be used. As the impurity element imparting p-type, boron (B), aluminum (Al), gallium (Ga), or the like can be used. In this embodiment, an impurity element having a different conductivity type from that of the impurity element introduced to the semiconductor layers 106, 108, and 110 in FIG. 26C (such as boron (B)) is used. As a result, an impurity region 170 which forms a source or drain region and a channel forming region 168 are formed in the semiconductor layer 104.

Figure 27A:
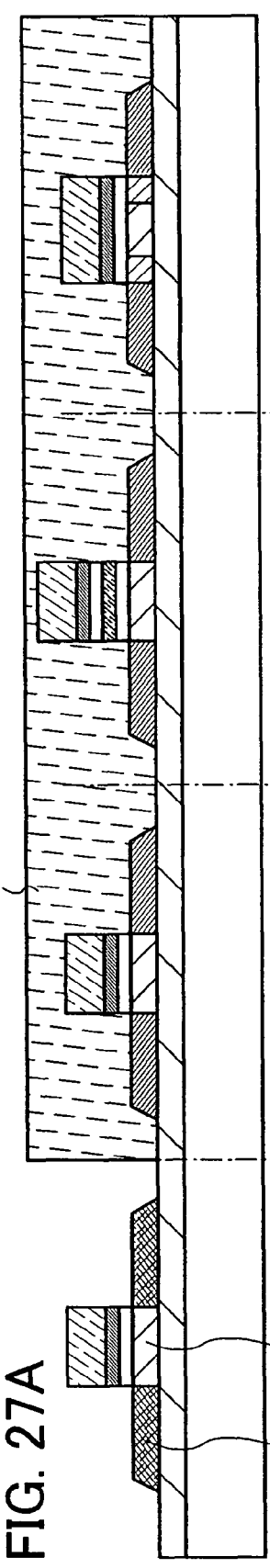
FIGS. 27A to 27C illustrate an example of a method for manufacturing a nonvolatile semiconductor memory device of the present invention.

It is to be noted that, in this embodiment, an impurity element is introduced in FIGS. 26C and 27A in a state where the parts of the semiconductor layers 104, 106, 108, and 110, which do not overlap with the conductive films 140, 142, 144, and 146, are exposed. Therefore, the channel forming regions 168, 150, 154, and 160 which are formed in the semiconductor layers 104, 106, 108, and 110, respectively, can be formed in a self-aligned manner with the conductive films 140, 142, 144, and 146.

Figure 27B:
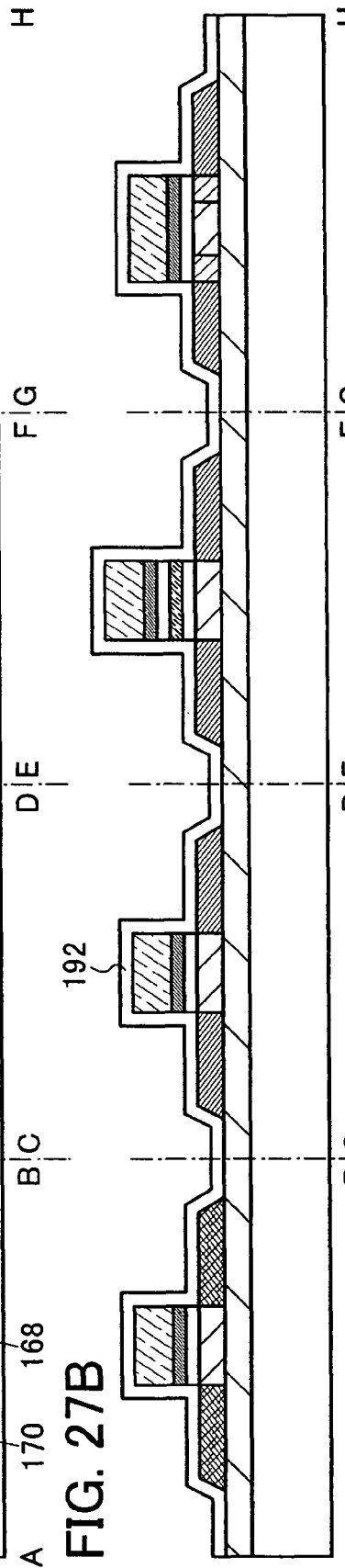
Figure 27C:
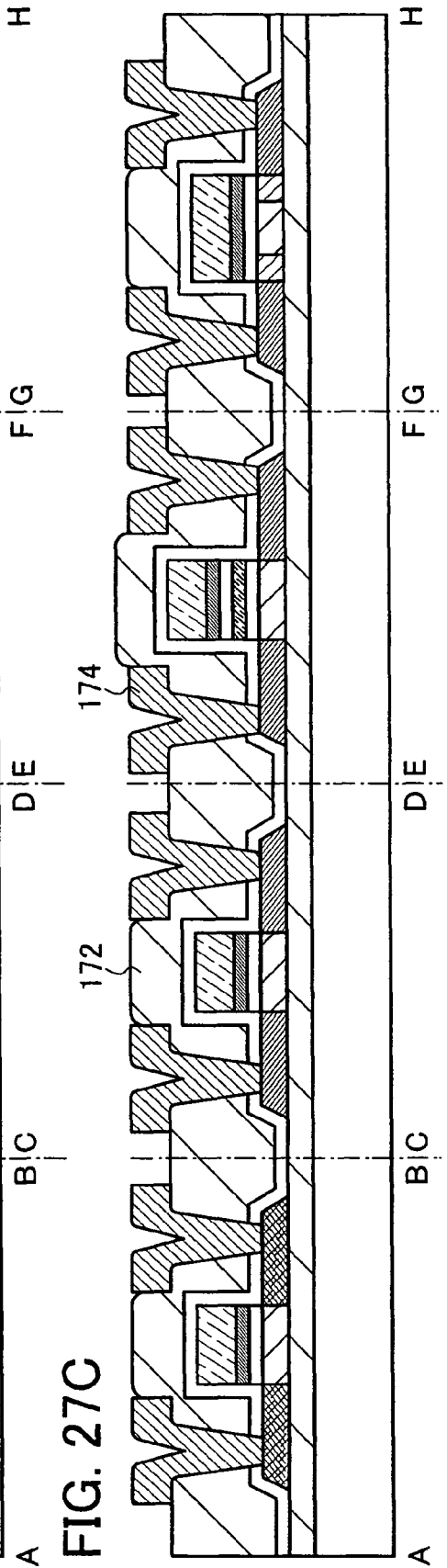

An insulating layer 192 is formed so as to cover the exposed semiconductor layers 104, 106, 108, and 110, and the conductive films 140, 142, 144, and 146 (see FIG. 27B).

The insulating layer 192 is formed by CVD, sputtering, or the like using an insulating layer containing oxygen or nitrogen such as silicon oxide ($SiO_x$), silicon nitride ($SiN_x$), silicon oxynitride ($SiO_xN_y$, (x>y)), or silicon nitride oxide ($SiN_xO_y$, (x>y)), DLC (diamond like carbon), or the like with a single layer structure or a stacked structure.

An insulating layer 172 is formed so as to cover the insulating layer 192, and the conductive films 140, 142, 144, and 146. Over the insulating layer 172, a conductive film 174 is formed so as to be electrically connected to the impurity regions 170, 152, 156, and 162 which are formed in the semiconductor layers 104, 106, 108, and 110, respectively (see FIG. 27C and FIG. 45).

As the insulating layer 172, any of the materials explained in Embodiment 1 can be used. For example, the insulating layer 192 can be formed using an insulating layer containing an inorganic material having oxygen or nitrogen such as silicon oxide ($SiO_x$), silicon nitride ($SiN_x$), silicon oxynitride ($SiO_xN_y$, (x>y)), or silicon nitride oxide ($SiN_xO_y$, (x>y)), and the insulating layer 172 can be formed using an organic material such as epoxy, polyimide, polyamide, polyvinyl phenol, benzocyclobutene, or acrylic. Of course, both the insulating layer 192 and the insulating layer 172 may be formed using an insulating layer containing an inorganic material.

It is to be noted that, in this embodiment, an LDD region can be formed using a sidewall in each of the semiconductor layers 104, 106, 108, and 110. For example, after components up to FIG. 26B are formed, an impurity element is introduced at a low concentration to the semiconductor layers 104, 106, 108, and 110 using the conductive films 140, 142, 144, and 146 as masks. Thereafter, an insulating layer (also referred to as a sidewall) 198 is formed so as to be in contact with each side surface of the conductive films 140, 142, 144, and 146 (see FIG. 31A).

An impurity element is introduced at a high concentration using the insulating layer 198, and the conductive films 140, 142, 144, and 146 as masks, whereby a high-concentration impurity region 170 which forms a source or drain region, a low-concentration impurity region 188 which forms an LDD region, and a channel forming region 168 are formed in the semiconductor layer 104. In addition, in the semiconductor layer 106, a high-concentration impurity region 152 which forms a source or drain region, a low-concentration impurity region 186 which forms an LDD region, and a channel forming region 150 are formed. In addition, in the semiconductor layer 108, a high-impurity region 156 which forms a source or drain region, a low-concentration impurity region 158 which forms an LDD region, and a channel forming region 154 are formed. In addition, in the semiconductor layer 110, a high-concentration impurity region 162 which forms a source or drain region, a low-concentration impurity region 164 which forms an LDD region, and a channel forming region 160 are formed (see FIG. 31A).

As for a method for forming the insulating layer 198, a film containing an inorganic material such as silicon, an oxide of silicon, or a nitride of silicon, or a film containing an organic material such as an organic resin is formed by CVD, sputtering, or the like with a single layer structure or a stacked structure. Then, the above insulating layer is selectively etched by anisotropic etching mainly in a perpendicular direction so as to be formed in contact with each side surface of the conductive films 140, 142, 144, and 146. It is to be noted that the insulating layer 198 is used as a mask for doping when an LDD (Lightly Doped Drain) region is formed. In this embodiment, the insulating layer 198 is formed so as to be also in contact with each side surface of the insulating layer and the charge accumulation layer formed below the conductive films 140, 142, 144, and 146.

Thereafter, as described above, the insulating layers 192 and 172, and the conductive film 174 are formed, whereby a nonvolatile semiconductor memory device can be obtained (see FIG. 31B).

In the structure shown in this embodiment, the width of the charge accumulation layer 121 functioning as a floating gate may be smaller than that of the semiconductor layer 108 as shown in Embodiment 3. In addition, in the structure shown in this embodiment, an impurity region 194 may be provided as shown in FIGS. 35 and 36.

In the nonvolatile semiconductor memory device of this embodiment, low power consumption can be achieved by varying the thickness of an insulating layer of a transistor in accordance with a configuration of a circuit. In addition, a stable operation of the nonvolatile semiconductor memory device can be achieved. Specifically, by formation of a thin gate insulating layer for a transistor included in a logic section, variation in threshold voltage can be reduced, and the memory device can be driven at low voltage. By formation of a thick gate insulating layer for a selection transistor included in a memory section, stability of an operation can be enhanced even when higher voltage than that in the logic section is employed in writing and erasing operations in the nonvolatile memory element. In the nonvolatile memory element, charges can be easily injected from a semiconductor layer to a floating gate electrode, and the charges can be prevented from being discharged from the floating gate electrode. In other words, in the case of an operation as a memory, writing can be performed highly efficiently at low voltage, and charge retention characteristics can be improved. According to this embodiment, a nonvolatile semiconductor memory device which has excellent effect as described above can be manufactured in sequential steps.

This embodiment can be implemented in combination with any of the embodiment mode or the other embodiments shown in this specification.

Embodiment 6

This embodiment will explain an application example of a semiconductor device which is provided with the nonvolatile semiconductor memory device of the present invention and in which data can be input/output without contact, with reference to the drawings. The semiconductor device in which data can be input/output without contact is also referred to as an RFID tag, an ID tag, an IC tag, an IC chip, an RF tag, a wireless tag, an electronic tag, or a wireless chip depending on the usage.

Figure 46A:
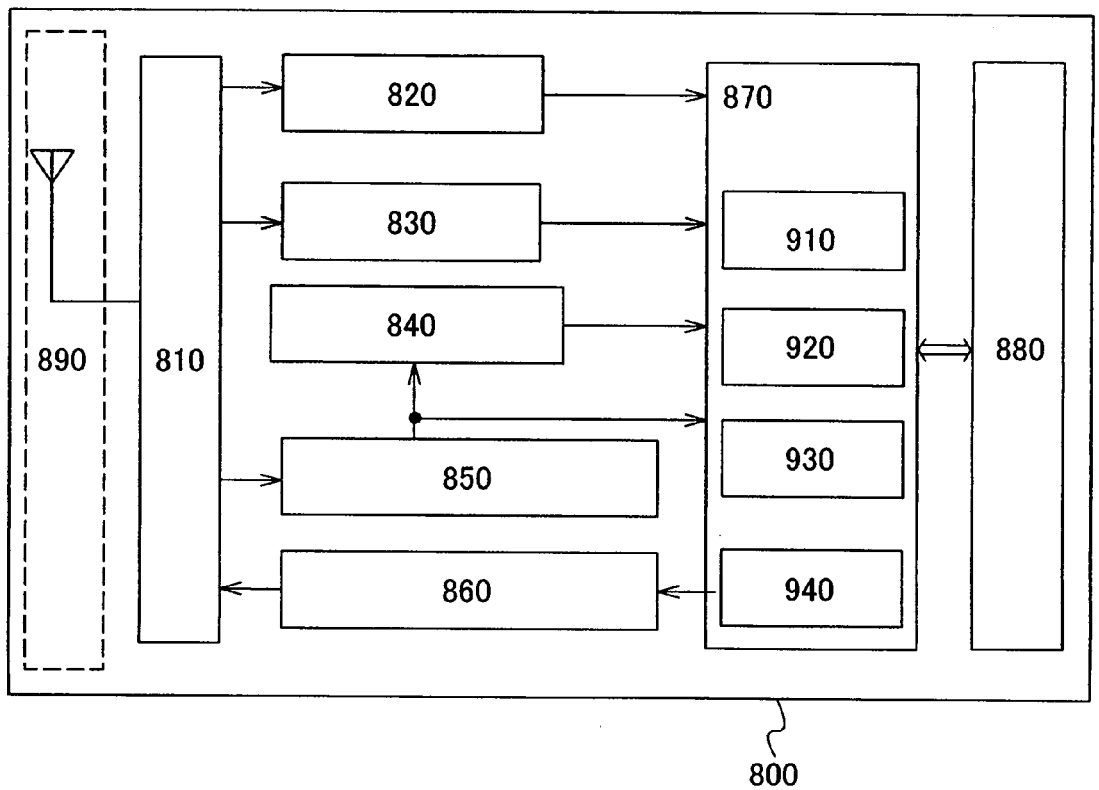
FIGS. 46A to 46C illustrate examples of usage patterns of nonvolatile semiconductor memory devices of the present invention.

A semiconductor device 800 has a function of exchanging data without contact, and includes a high-frequency circuit 810, a power source circuit 820, a reset circuit 830, a clock generating circuit 840, a data demodulating circuit 850, a data modulating circuit 860, a controlling circuit 870 for controlling other circuits, a memory circuit 880, and an antenna 890 (FIG. 46A). The high-frequency circuit 810 receives a signal from the antenna 890 and outputs a signal, which is received from the data modulating circuit 860, with the antenna 890. The power source circuit 820 generates power source potential from a received signal. The reset circuit 830 generates a reset signal. The clock generating circuit 840 generates various clock signals based on a received signal input from the antenna 890. The data demodulating circuit 850 demodulates a received signal and outputs the demodulated signal to the controlling circuit 870. The data modulating circuit 860 modulates a signal received from the controlling circuit 870. As the controlling circuit 870, for example, a code extracting circuit 910, a code judging circuit 920, a CRC judging circuit 930, and an output unit circuit 940 are provided. It is to be noted that the code extracting circuit 910 extracts each of a plurality of codes included in an instruction sent to the controlling circuit 870. The code judging circuit 920 judges the content of the instruction by comparing the extracted code with a code corresponding to a reference. The CRC judging circuit 930 detects whether or not there is a transmission error or the like based on the judged code.

Subsequently, an example of an operation of the aforementioned semiconductor device will be explained. First, a wireless signal is received by the antenna 890 and then sent to the power source circuit 820 through the high-frequency circuit 810, whereby high power source potential (hereinafter referred to as VDD) is generated. The VDD is supplied to each circuit in the semiconductor device 800. A signal sent to the data demodulating circuit 850 through the high-frequency circuit 810 is demodulated (hereinafter, this signal is referred to as a demodulated signal). Moreover, signals passed through the reset circuit 830 and the clock generating circuit 840 through the high-frequency circuit 810, and the demodulated signal are sent to the controlling circuit 870. The signals sent to the controlling circuit 870 are analyzed by the code extracting circuit 910, the code judging circuit 920, the CRC judging circuit 930, and the like. Then, based on the analyzed signals, information of the semiconductor device stored in the memory circuit 880 is output. The output information of the semiconductor device is encoded through the output unit circuit 940. Further, the encoded information of the semiconductor device 800 passes through the data modulating circuit 860 and then is sent by the antenna 890 as a wireless signal. It is to be noted that low power source potential (hereinafter referred to as VSS) is common in the plurality of circuits included in the semiconductor device 800 and VSS can be GND. In addition, the nonvolatile semiconductor memory device of the present invention can be applied to the memory circuit 880. In the nonvolatile semiconductor memory device of the present invention, drive voltage can be reduced, and a distance for exchanging data without contact can be lengthened.

In this manner, when a signal is sent from a reader/writer to the semiconductor device 800 and a signal sent from the semiconductor device 800 is received by the reader/writer, the data of the semiconductor device can be read.

Moreover, in the semiconductor device 800, power source voltage may be supplied to each circuit by electromagnetic waves without mounting a power source (battery), or a power source (battery) may be mounted so that power source voltage is supplied to each circuit by both electromagnetic waves and the power source (battery).

Figure 46B:
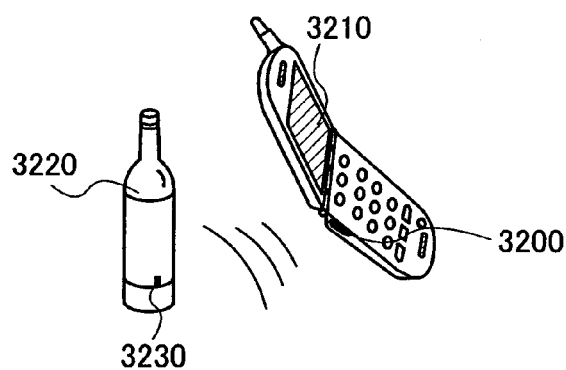
Figure 46C:
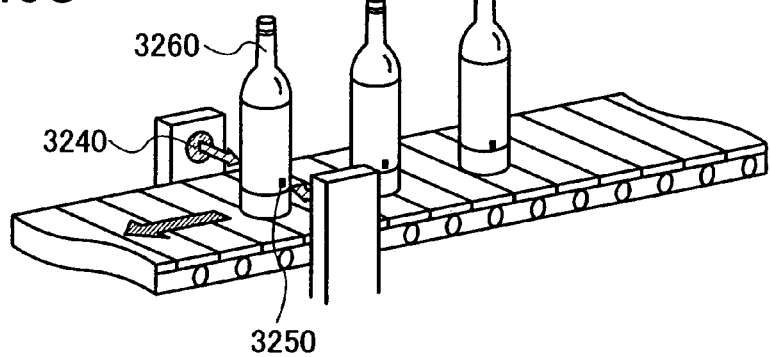

Next, an example of a usage pattern of a semiconductor device in which data can be input/output without contact will be explained. A side of a portable terminal including a display portion 3210 is provided with a reader/writer 3200. A side of a product 3220 is provided with a semiconductor device 3230 (FIG. 46B). When the reader/writer 3200 is held over the semiconductor device 3230 included in the product 3220, the display portion 3210 displays information on the product, such as a material, a production area, an inspection result for each production step, history of circulation process, and description of the product. In addition, when a product 3260 is transferred by a conveyer belt, the product 3260 can be inspected with the use of a semiconductor device 3250 provided on the product 3260 and a reader/writer 3240 (FIG. 46C). In this manner, through application of the semiconductor device to the system, information can be easily obtained and higher performance and higher added value are achieved.

Further, the nonvolatile semiconductor memory device of the present invention can be applied to electronic devices provided with a memory in various fields. For example, the nonvolatile semiconductor memory device of the present invention can be applied to electronic devices such as a camera such as a video camera or a digital camera, a goggle type display (a head-mounted display), a navigation system, an audio reproducing device (such as a car audio system or an audio component set), a computer, a game machine, a portable information terminal (such as a mobile computer, a mobile phone, a portable game machine, or an electronic book), and an image reproducing device provided with a recording medium (specifically, a device which reproduces a recording medium such as a DVD (Digital Versatile Disc) and has a display capable of displaying the reproduced image). FIGS. 17A to 17E specifically show examples of these electronic devices.

Figure 17A:
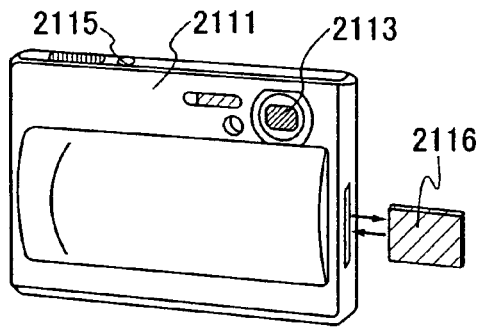
FIGS. 17A to 17E illustrate examples of usage patterns of nonvolatile semiconductor memory devices of the present invention.
Figure 17B:
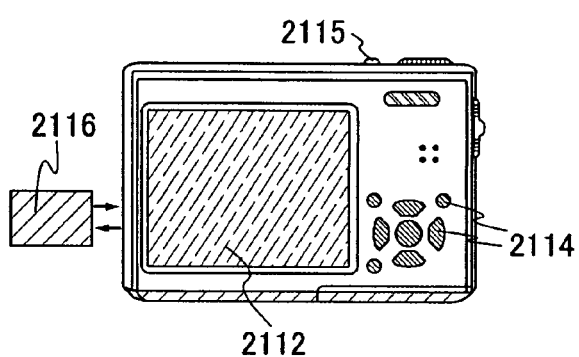

FIGS. 17A and 17B show a digital camera. FIG. 17B shows a rear side of FIG. 17A. This digital camera includes a chassis 2111, a display portion 2112, a lens 2113, operation keys 2114, a shutter button 2115, and the like. Further, a nonvolatile memory 2116 which can be detached is provided, and data shot by the digital camera is stored in the nonvolatile memory 2116. The nonvolatile semiconductor memory device formed using the present invention can be applied to the nonvolatile memory 2116.

Figure 17C:
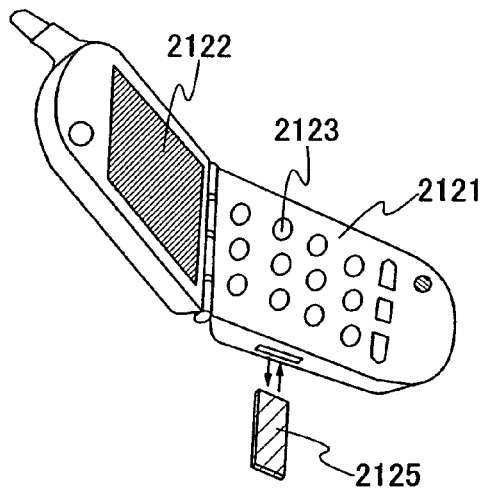

Further, FIG. 17C shows a mobile phone which is a typical example of the portable terminals. This mobile phone includes a chassis 2121, a display portion 2122, operation keys 2123, and the like. Further, a nonvolatile memory 2125 which can be detached is provided in the mobile phone, and data such as a phone number of the mobile phone, image data, sound data, and the like can be stored in the nonvolatile memory 2125 and reproduced. The nonvolatile semiconductor memory device formed using the present invention can be applied to the nonvolatile memory 2125.

Figure 17D:
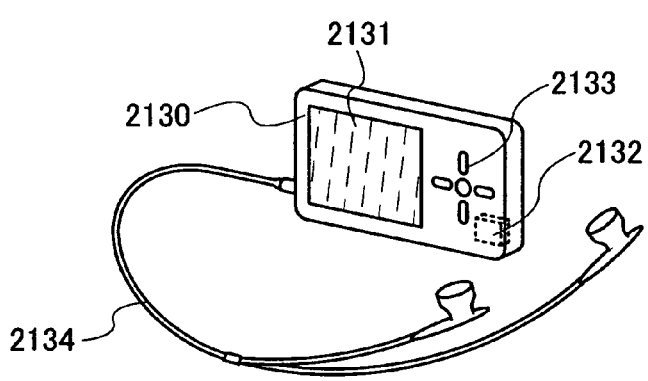

Further, FIG. 17D shows a digital player which is a typical example of the audio sets. The digital player shown in FIG. 17D includes a main body 2130, a display portion 2131, a nonvolatile memory section 2132, an operation portion 2133, an earphone 2134, and the like. A headphone or a wireless earphone can be used instead of the earphone 2134. The nonvolatile semiconductor memory device formed using the present invention can be applied to the nonvolatile memory section 2132. For example, the operation portion 2133 is operated with the use of a NAND type nonvolatile memory having a memory capacity of 20 to 200 gigabytes, and thus, image or sound (music) can be recorded and reproduced. It is to be noted that power consumption of the display portion 2131 can be suppressed through display of white characters on the black background. This is particularly effective in a portable audio set. The nonvolatile semiconductor memory device provided in the nonvolatile memory section 2132 may also be removable.

Figure 17E:
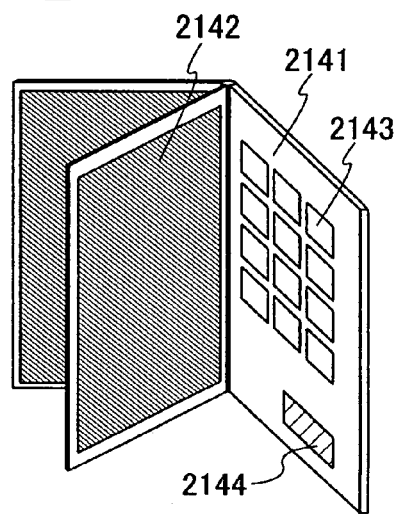
Figure 24A:
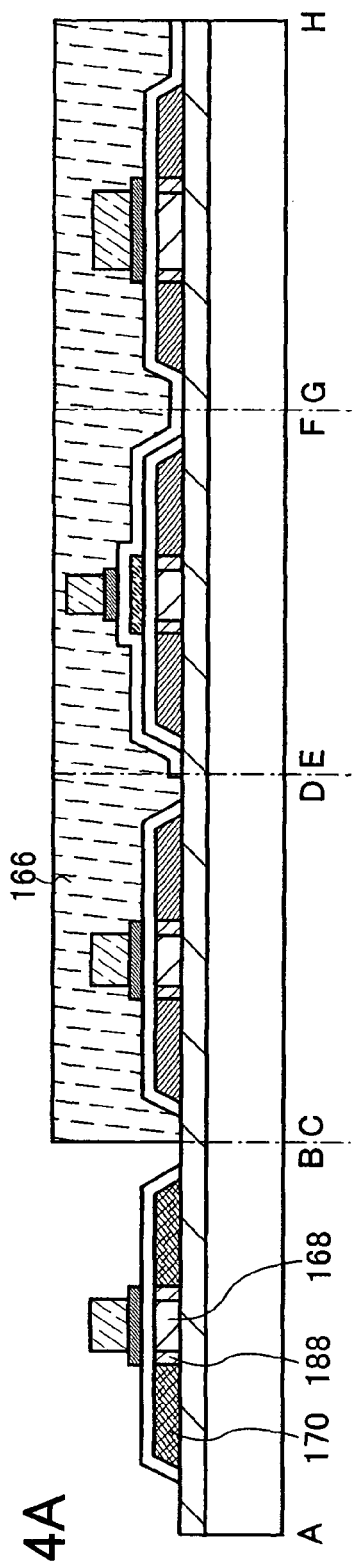
FIGS. 24A and 24B illustrate an example of a method for manufacturing a nonvolatile semiconductor memory device of the present invention.
Figure 24B:
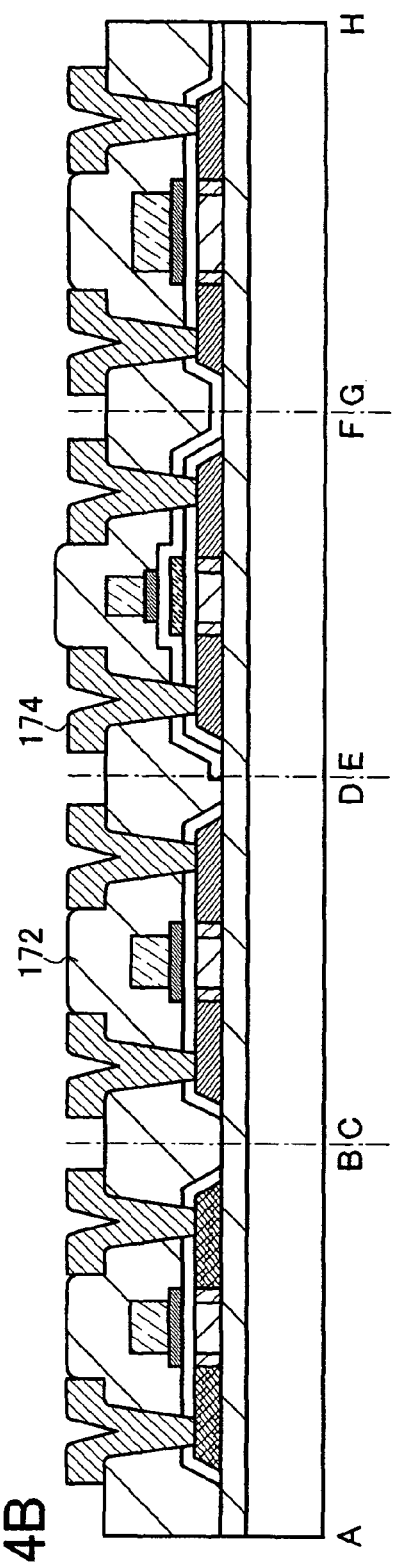

Further, FIG. 17E shows an electronic book (also referred to as electronic paper). This electronic book includes a main body 2141, a display portion 2142, operation keys 2143, and a nonvolatile memory section 2144. In addition, a modem may be incorporated in the main body 2141, or data can be transmitted and received wirelessly. The nonvolatile semiconductor memory device formed using the present invention can be applied to the nonvolatile memory section 2144. For example, the operation keys 2143 are operated with the use of a NAND type nonvolatile memory having a memory capacity of 20 to 200 gigabytes, and thus, image or sound (music) can be recorded and reproduced. The nonvolatile semiconductor memory device provided in the nonvolatile memory section 2144 may also be removable.

As described above, the applicable range of the nonvolatile semiconductor memory device of the present invention is extremely wide and can be used for electronic devices in various fields as long as they have a memory.

This application is based on Japanese Patent Application serial No. 2006-077893 filed in Japan Patent Office on Mar. 21, 2006, the entire contents of which are hereby incorporated by reference.

What is claimed is:

1. A semiconductor memory device comprising:
    a semiconductor layer over a substrate, the semiconductor layer having a channel formation region between a pair of impurity regions formed apart from each other;
    a first insulating layer over and in contact with an upper surface and a side surface of the semiconductor layer;
    a floating gate over the channel formation region with the first insulating layer interposed therebetween;
    a second insulating layer over the floating gate, the second insulating layer comprising a silicon nitride layer over the floating gate and a silicon oxide layer over the silicon nitride layer, wherein a thickness of the silicon nitride layer is smaller than a thickness of the silicon oxide layer; and
    a control gate over the floating gate with the second insulating layer interposed therebetween,
    wherein the semiconductor layer has a first region having a conductivity type which is different from a conductivity type of the pair of impurity regions,
    wherein the first region extends from one of the pair of impurity regions to the other of the pair of impurity regions and is in contact with the channel formation region,
    wherein the substrate is selected from the group of a glass substrate, a plastic substrate and a quartz substrate, and
    wherein the floating gate includes a semiconductor material, a band gap of the semiconductor material is smaller than a band gap of the semiconductor layer.

2. The nonvolatile semiconductor memory device according to claim 1,
    wherein the first insulating layer comprises a silicon oxide layer and a silicon nitride layer.

3. The nonvolatile semiconductor memory device according to claim 2,
    wherein the floating gate is in contact with the silicon nitride layer.

4. The nonvolatile semiconductor memory device according to claim 2,
    wherein the silicon oxide layer is formed by oxidizing the semiconductor layer by plasma treatment, and the silicon nitride layer is formed by nitriding the silicon oxide layer by plasma treatment.

5. The nonvolatile semiconductor memory device according to claim 1,
    wherein a plurality of floating gates and control gates are arranged over the semiconductor layer.

6. The nonvolatile semiconductor memory device according to claim 1,
    wherein difference between a band gap of the material forming the semiconductor layer and a band gap of a semiconductor material forming the floating gate is 0.1 eV or more.

7. The nonvolatile semiconductor memory device according to claim 1, wherein an edge of the floating gate in a channel length direction extends beyond an edge of the control gate in a channel length direction.

8. The nonvolatile semiconductor memory device according to claim 1,
wherein the semiconductor layer has a low concentration impurity region of the same conductivity type as the pair of impurity regions, which overlaps with the floating gate.

9. The nonvolatile semiconductor memory device according to claim 1,
wherein an edge of the control gate in a channel length direction extends beyond an edge of the floating gate in a channel length direction.

10. A nonvolatile semiconductor memory device comprising:
a semiconductor layer over a substrate, the semiconductor layer having a channel formation region between a pair of impurity regions formed apart from each other;
a first insulating layer over and in contact with an upper surface and a side surface of the semiconductor layer;
a floating gate over the channel formation region with the first insulating layer interposed therebetween;
a second insulating layer over the floating gate, the second insulating layer comprising a silicon nitride layer over the floating gate and a silicon oxide layer over the silicon nitride layer, wherein a thickness of the silicon nitride layer is smaller than a thickness of the silicon oxide layer; and
a control gate over the floating gate with the second insulating layer interposed therebetween,
wherein the semiconductor layer has a first region having a conductivity type which is different from a conductivity type of the pair of impurity regions,
wherein the first region extends from one of the pair of impurity regions to the other of the pair of impurity regions and is in contact with the channel formation region,
wherein the substrate is selected from the group of a glass substrate, a plastic substrate and a quartz substrate, and
wherein the floating gate is formed from a material having a higher electron affinity than a material forming the semiconductor layer.

11. The nonvolatile semiconductor memory device according to claim 10,
wherein the first insulating layer comprises a silicon oxide layer and a silicon nitride layer.

12. The nonvolatile semiconductor memory device according to claim 11,
wherein the floating gate is in contact with the silicon nitride layer.

13. The nonvolatile semiconductor memory device according to claim 11,
wherein the silicon oxide layer is formed by oxidizing the semiconductor layer by plasma treatment, and the silicon nitride layer is formed by nitriding the silicon oxide layer by plasma treatment.

14. The nonvolatile semiconductor memory device according to claim 10,
wherein a plurality of floating gates and control gates are arranged over the semiconductor layer.

15. The nonvolatile semiconductor memory device according to claim 10,
wherein an edge of the floating gate in a channel length direction extends beyond an edge of the control gate in a channel length direction.

16. The nonvolatile semiconductor memory device according to claim 10,
wherein the semiconductor layer has a low concentration impurity region of the same conductivity type as the pair of impurity regions, which overlaps with the floating gate.

17. The nonvolatile semiconductor memory device according to claim 10,
wherein an edge of the control gate in a channel length direction extends beyond an edge of the floating gate in a channel length direction.

18. A nonvolatile semiconductor memory device comprising:
a semiconductor layer over a substrate, the semiconductor layer having a channel formation region between a pair of impurity regions formed apart from each other;
a first insulating layer over and in contact with an upper surface and a side surface of the semiconductor layer;
a floating gate over the channel formation region with the first insulating layer interposed therebetween;
a second insulating layer over the floating gate, the second insulating layer comprising a silicon nitride layer over the floating gate and a silicon oxide layer over the silicon nitride layer, wherein a thickness of the silicon nitride layer is smaller than a thickness of the silicon oxide layer; and
a control gate over the floating gate with the second insulating layer interposed therebetween,
wherein the semiconductor layer has a first region having a conductivity type which is different from a conductivity type of the pair of impurity regions,
wherein the first region extends from one of the pair of impurity regions to the other of the pair of impurity regions and is in contact with the channel formation region,
wherein the substrate is selected from the group of a glass substrate, a plastic substrate and a quartz substrate, and
wherein barrier energy formed by the first insulating layer for electrons of the floating gate is higher than barrier energy formed by the first insulating layer for electrons of the semiconductor layer.

19. The nonvolatile semiconductor memory device according to claim 18,
wherein the first insulating layer comprises a silicon oxide layer and a silicon nitride layer.

20. The nonvolatile semiconductor memory device according to claim 19,
wherein the floating gate is in contact with the silicon nitride layer.

21. The nonvolatile semiconductor memory device according to claim 19,
wherein the silicon oxide layer is formed by oxidizing the semiconductor layer by plasma treatment, and the silicon nitride layer is formed by nitriding the silicon oxide layer by plasma treatment.

22. The nonvolatile semiconductor memory device according to claim 18,
wherein a plurality of floating gates and control gates are arranged over the semiconductor layer.

23. The nonvolatile semiconductor memory device according to claim 18,
wherein an edge of the floating gate in a channel length direction extends beyond an edge of the control gate in a channel length direction.

24. The nonvolatile semiconductor memory device according to claim 18, wherein the semiconductor layer has a low concentration impurity region of the same conductivity type as the pair of impurity regions, which overlaps with the floating gate.

25. The nonvolatile semiconductor memory device according to claim 18,
wherein an edge of the control gate in a channel length direction extends beyond an edge of the floating gate in a channel length direction.

26. A nonvolatile semiconductor memory device comprising:
a semiconductor layer over a substrate, the semiconductor layer having a channel formation region between a pair of impurity regions formed apart from each other;
a first insulating layer over and in contact with an upper surface and a side surface of the semiconductor layer;
a floating gate over the channel formation region with the first insulating layer interposed therebetween;
a second insulating layer over the floating gate, the second insulating layer comprising a silicon nitride layer over the floating gate and a silicon oxide layer over the silicon nitride layer, wherein a thickness of the silicon nitride layer is smaller than a thickness of the silicon oxide layer; and
a control gate over the floating gate with the second insulating layer interposed therebetween,
wherein the semiconductor layer has a first region having a conductivity type which is different from a conductivity type of the pair of impurity regions,
wherein the first region extends from one of the pair of impurity regions to the other of the pair of impurity regions and is in contact with the channel formation region,
wherein the substrate is selected from the group of a glass substrate, a plastic substrate and a quartz substrate, and
wherein the floating gate includes germanium or a germanium compound.

27. The nonvolatile semiconductor memory device according to claim 26,
wherein the first insulating layer comprises a silicon oxide layer and a silicon nitride layer.

28. The nonvolatile semiconductor memory device according to claim 27,
wherein the floating gate is in contact with the silicon nitride layer.

29. The nonvolatile semiconductor memory device according to claim 27,
wherein the silicon oxide layer is formed by oxidizing the semiconductor layer by plasma treatment, and the silicon nitride layer is formed by nitriding the silicon oxide layer by plasma treatment.

30. The nonvolatile semiconductor memory device according to claim 26,
wherein a plurality of floating gates and control gates are arranged over the semiconductor layer.

31. The nonvolatile semiconductor memory device according to claim 26,
wherein the germanium compound is a germanium oxide or a germanium nitride.

32. The nonvolatile semiconductor memory device according to claim 26,
wherein an edge of the floating gate in a channel length direction extends beyond an edge of the control gate in a channel length direction.

33. The nonvolatile semiconductor memory device according to claim 26,
wherein the semiconductor layer has a low concentration impurity region of the same conductivity type as the pair of impurity regions, which overlaps with the floating gate.

34. The nonvolatile semiconductor memory device according to claim 26,
wherein an edge of the control gate in a channel length direction extends beyond an edge of the floating gate in a channel length direction.

35. A nonvolatile semiconductor memory device comprising:
a semiconductor layer over a substrate, the semiconductor layer having a channel formation region between a pair of impurity regions formed apart from each other;
a first insulating layer over and in contact with an upper surface and a side surface of the semiconductor layer;
a floating gate over the channel formation region with the first insulating layer interposed therebetween;
a second insulating layer over the floating gate, the second insulating layer comprising a silicon nitride layer over the floating gate and a silicon oxide layer over the silicon nitride layer, wherein a thickness of the silicon nitride layer is smaller than a thickness of the silicon oxide layer; and
a control gate over the floating gate with the second insulating layer interposed therebetween,
wherein the semiconductor layer has a first region having a conductivity type which is different from a conductivity type of the pair of impurity regions,
wherein the first region extends from one of the pair of impurity regions to the other of the pair of impurity regions and is in contact with the channel formation region,
wherein the substrate is selected from the group of a glass substrate, a plastic substrate and a quartz substrate, and
wherein the floating gate is formed of germanium or a germanium compound to a thickness of from 1 nm to 10 nm, inclusive.

36. The nonvolatile semiconductor memory device according to claim 35,
wherein the first insulating layer comprises a silicon oxide layer and a silicon nitride layer.

37. The nonvolatile semiconductor memory device according to claim 36,
wherein the floating gate is in contact with the silicon nitride layer.

38. The nonvolatile semiconductor memory device according to claim 36,
wherein the silicon oxide layer is formed by oxidizing the semiconductor layer by plasma treatment, and the silicon nitride layer is formed by nitriding the silicon oxide layer by plasma treatment.

39. The nonvolatile semiconductor memory device according to claim 35,
wherein a plurality of floating gates and control gates are arranged over the semiconductor layer.

40. The nonvolatile semiconductor memory device according to claim 35,
wherein the germanium compound is a germanium oxide or a germanium nitride.

41. The nonvolatile semiconductor memory device according to claim 35,
wherein an edge of the floating gate in a channel length direction extends beyond an edge of the control gate in a channel length direction.

42. The nonvolatile semiconductor memory device according to claim 35, wherein the semiconductor layer has a low concentration impurity region of the same conductivity type as the pair of impurity regions, which overlaps with the floating gate.

43. The nonvolatile semiconductor memory device according to claim 35, wherein an edge of the control gate in a channel length direction extends beyond an edge of the floating gate in a channel length direction.

* * * * *